United States Patent [19]
Agrawal et al.

[11] Patent Number: 5,469,368
[45] Date of Patent: Nov. 21, 1995

[54] ARRAY OF CONFIGURABLE LOGIC BLOCKS EACH INCLUDING A FIRST LOOKUP TABLE OUTPUT COUPLED TO SELECTIVELY REPLACE AN OUTPUT OF SECOND LOOKUP WITH AN ALTERNATE FUNCTION OUTPUT

[75] Inventors: Om P. Agrawal, San Jose; Michael J. Wright, Menlo Park; Ju Shen, San Jose, all of Calif.

[73] Assignee: Advanced Micro Devices, Inc., Sunnyvale, Calif.

[21] Appl. No.: 462,934

[22] Filed: Jun. 5, 1995

Related U.S. Application Data

[62] Division of Ser. No. 271,872, Jul. 7, 1994, Pat. No. 5,422,823, which is a division of Ser. No. 12,573, Feb. 1, 1993, Pat. No. 5,329,460, which is a division of Ser. No. 394,221, Aug. 15, 1989, Pat. No. 5,212,652.

[51] Int. Cl.$^6$ ............................................. H03K 17/693
[52] U.S. Cl. ..................... 364/489; 340/825.83; 326/39
[58] Field of Search ................................. 364/490, 489, 364/488, 716; 340/825.83; 326/39

[56] References Cited

U.S. PATENT DOCUMENTS

| | | | |
|---|---|---|---|
| 5,212,652 | 5/1993 | Agrawal et al. | 364/489 |
| 5,329,460 | 7/1994 | Agrawal et al. | 364/489 |
| 5,422,823 | 6/1995 | Agrawal et al. | 364/489 |

*Primary Examiner*—Vincent N. Trans
*Attorney, Agent, or Firm*—Fliesler, Dubb, Meyer & Lovejoy

[57] ABSTRACT

A programmable integrated circuit includes configurable logic blocks (CLB's), configurable input/output blocks (IOB's) and a configurable interconnect network for providing program-defined routing of signals between the CLB's and IOB's. Each CLB includes a plurality of function lookup tables (LUT's) each defined by a bit storage area and a select means responsive to input signals for selecting a stored bit. The design includes first and second LUT's where the first LUT output determines whether the output of the second LUT will be forwarded or replaced by another function output.

4 Claims, 52 Drawing Sheets

CLB CONFIGURATION

1ST LEVEL MUX   2ND LEVEL MUX   3RD LEVEL MUX   4TH LEVEL MUX
(3 VARIABLES)   (4 VARIABLES)   (5 VARIABLES)   (6 VARIABLES)

VERTICAL BUSES 2 TO 8 TO HORIZONTAL BUSES 2 TO 8 INTERCONNECT

SEGMENT BOX PLACEMENT ON
BUSES 1 & 9

CORNER INTERCONNECTS

HBUS1 TO VBUS1 INTERCONNECT

HBUS1 TO VBUS9 INTERCONNECT

HBUS9 TO VBUS1 INTERCONNECT

HBUS9 TO VBUS9 INTERCONNECT

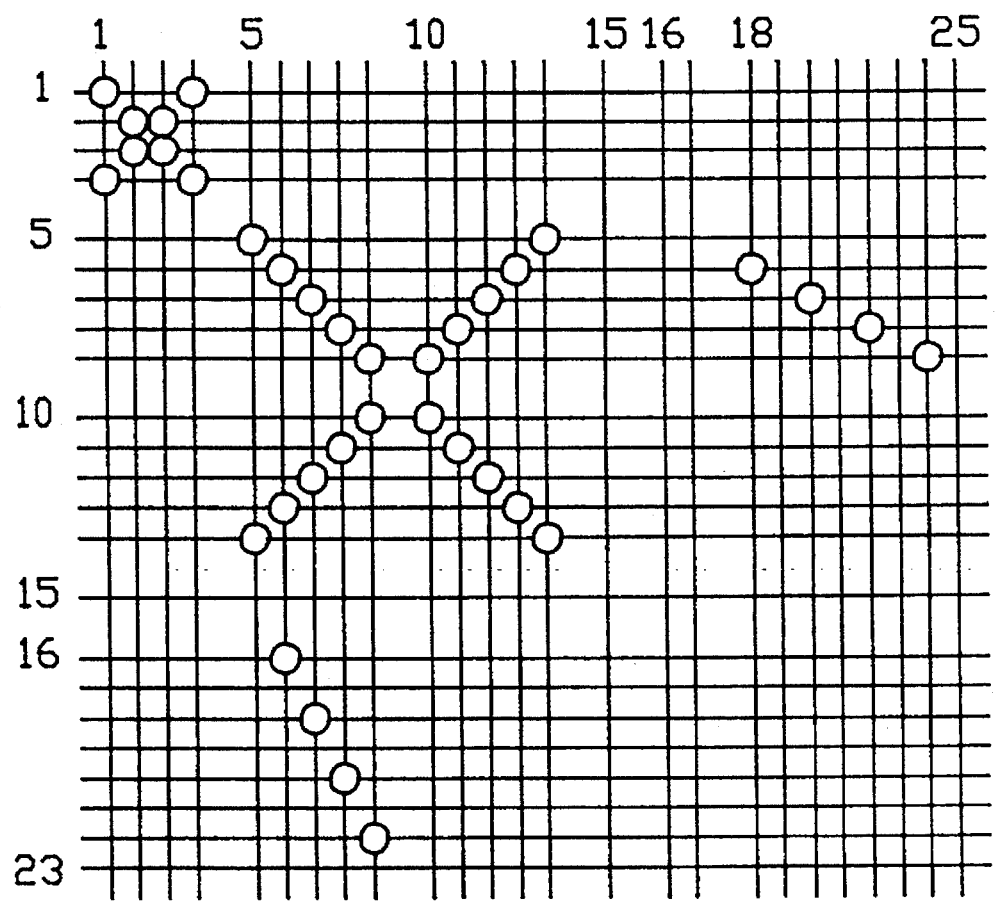
FIG.—14A

GLOBAL CLOCK AND GLOBAL RESET
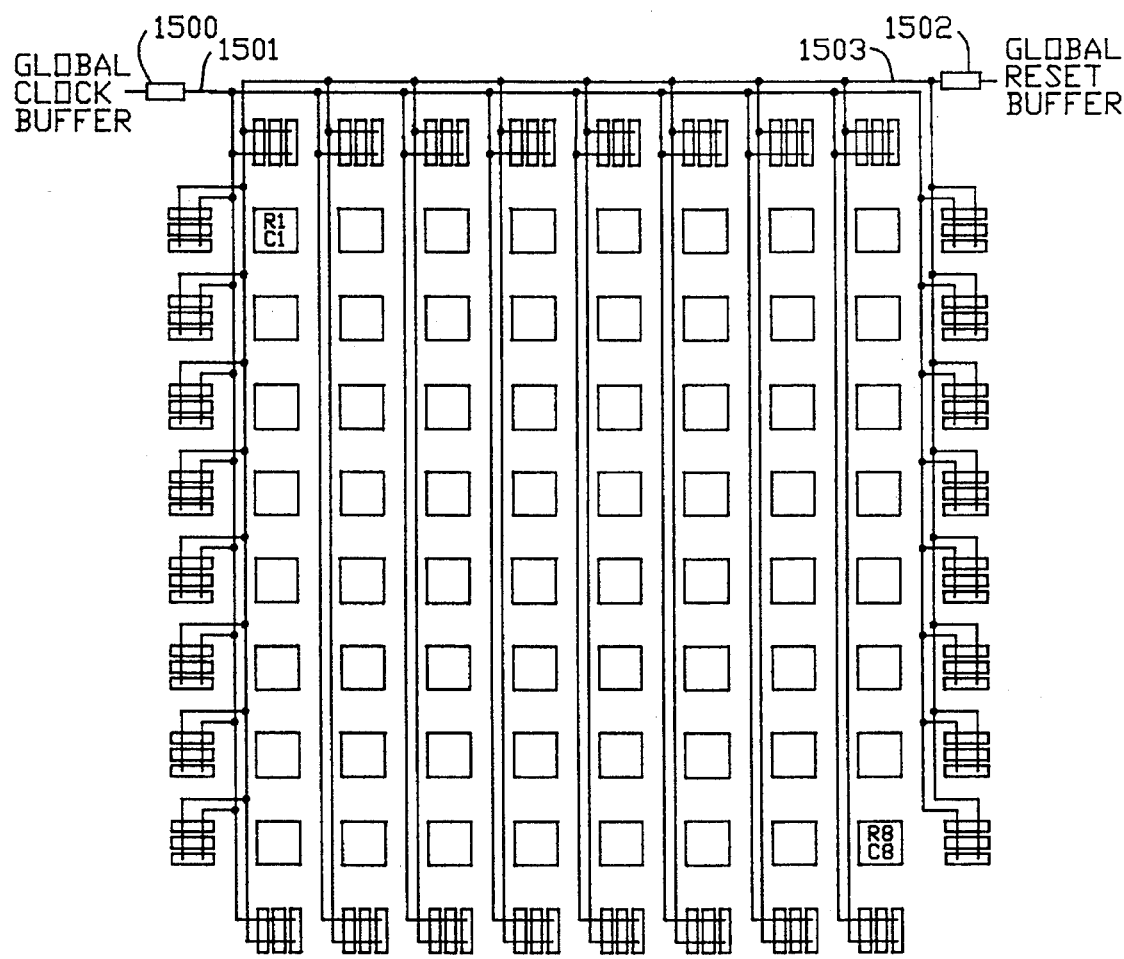
FIG.—15
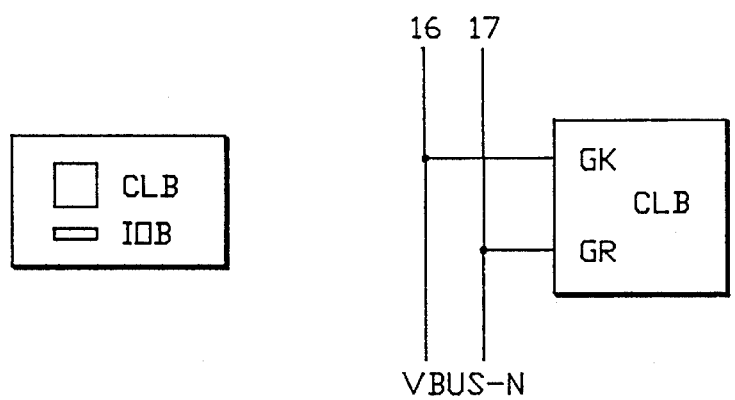
FIG.—15A

SPECIAL INPUT TO GLOBAL BUFFERS
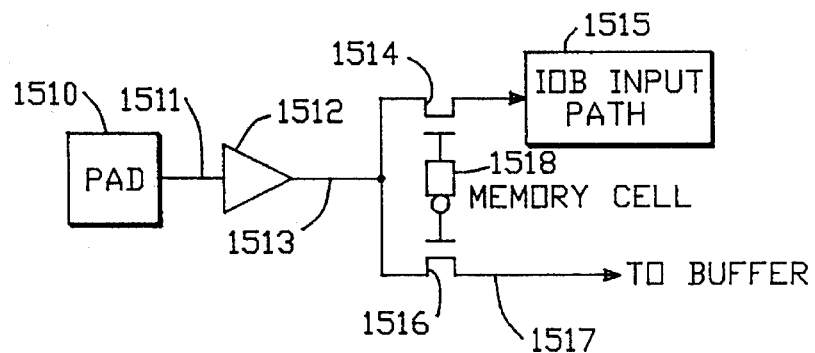
FIG.—15B
INPUTS TO THE GLOBAL CLOCK BUFFER
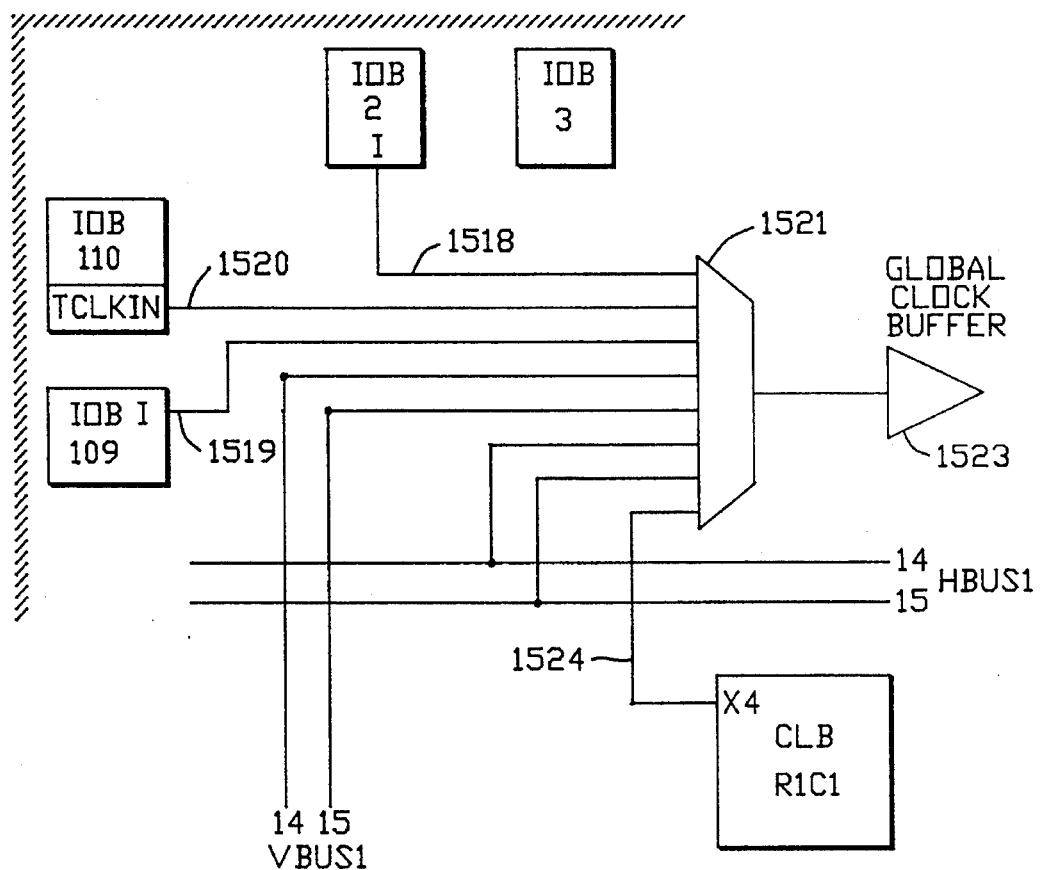
FIG.—15C ALTERNATE GLOBAL BUFFERS
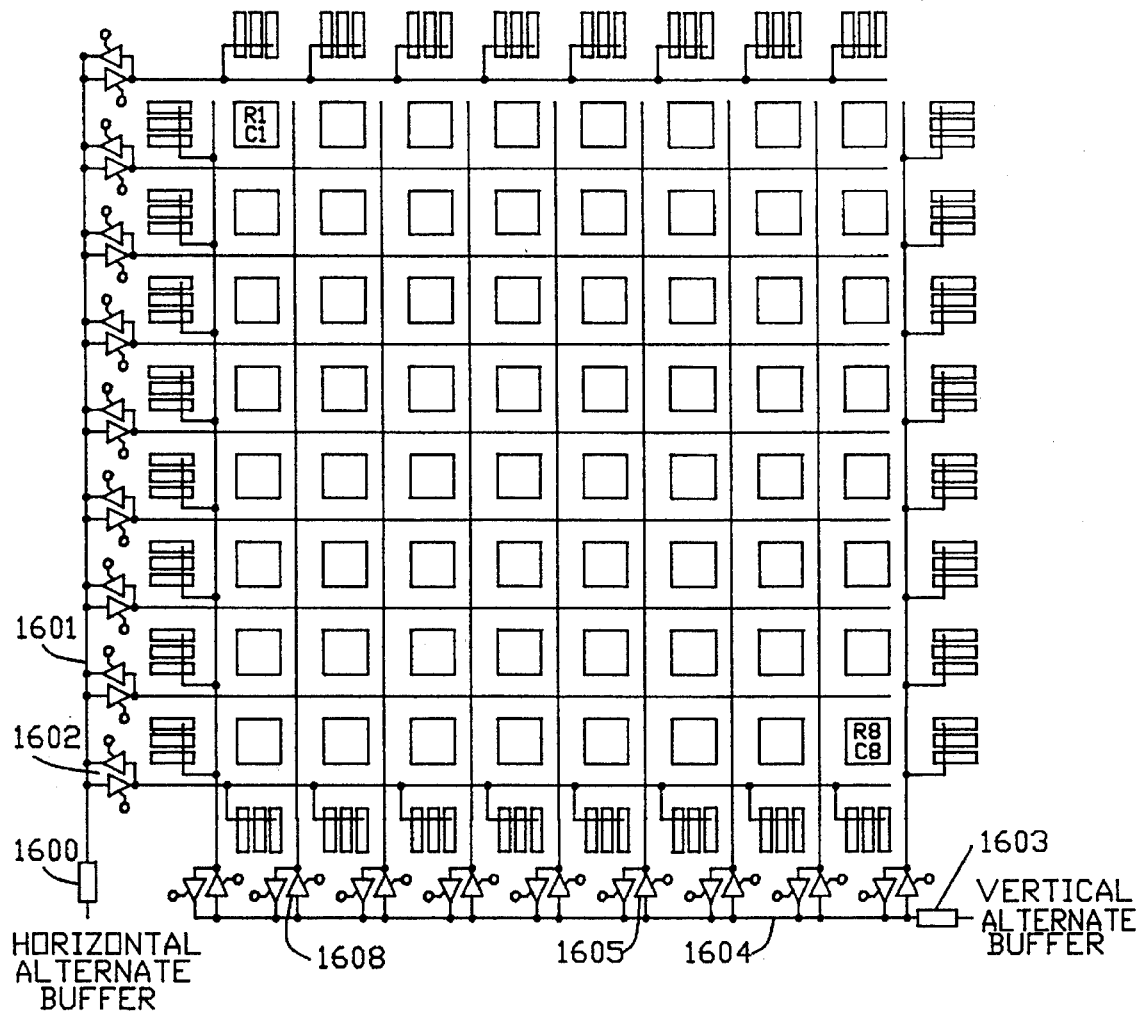
FIG.—16
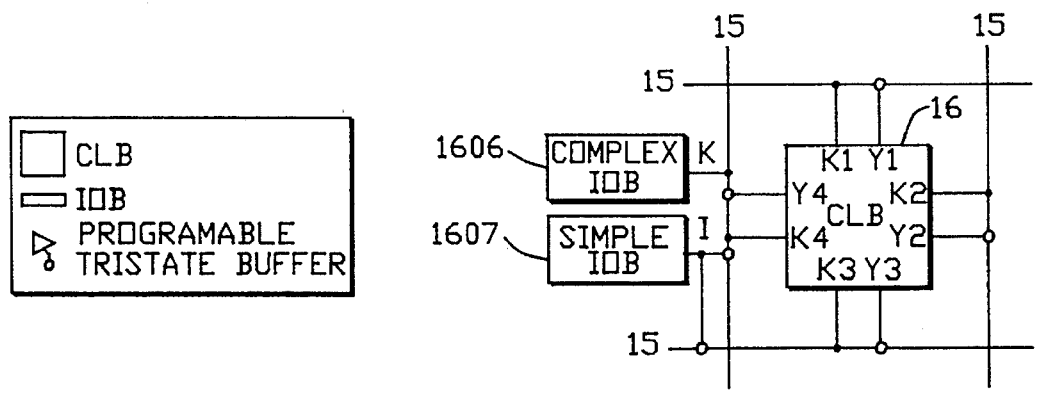
FIG.—16A

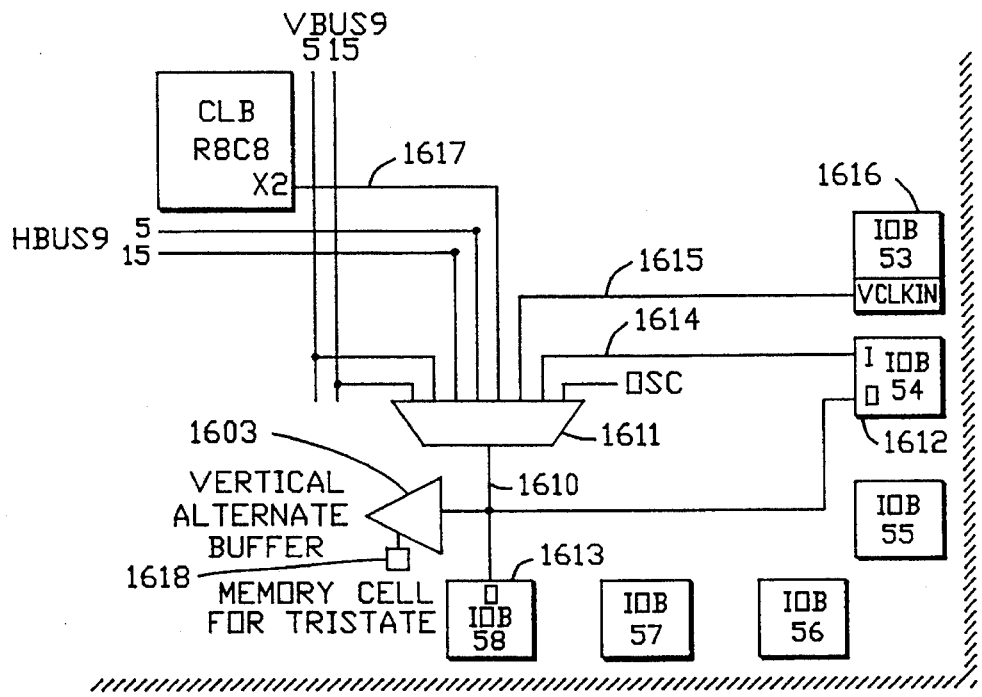
FIG.—16B
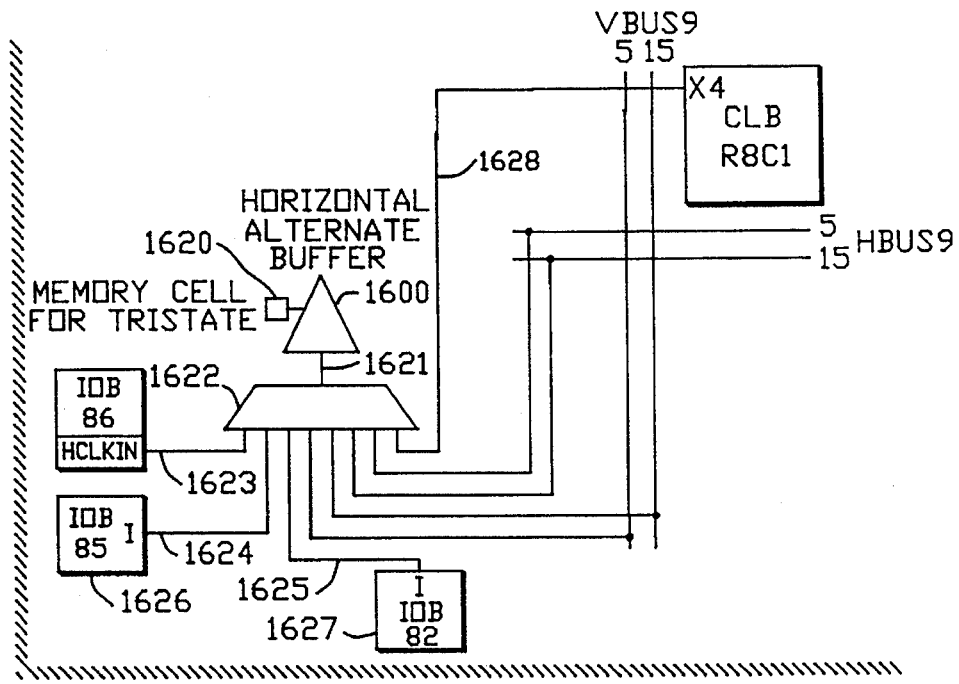
FIG.—16C

CRYSTAL OSCILLATOR
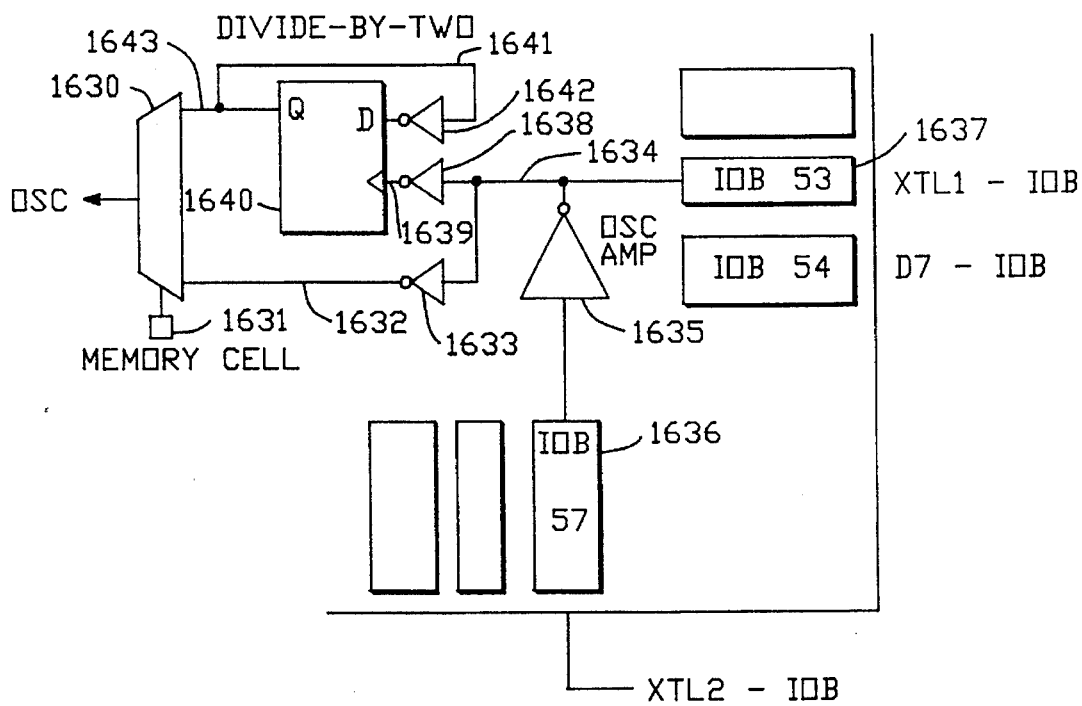
FIG.—16D
CRYSTAL COMPONENTS
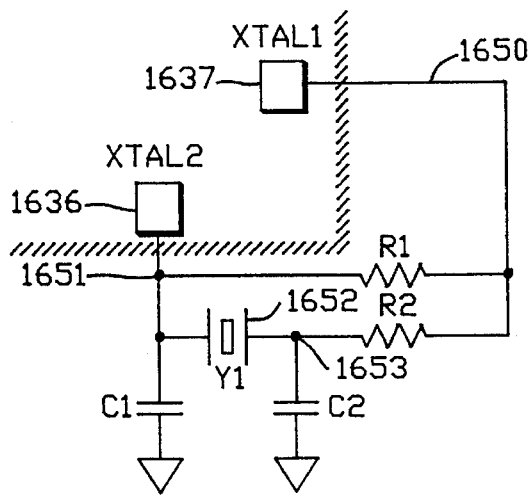
FIG.—16E

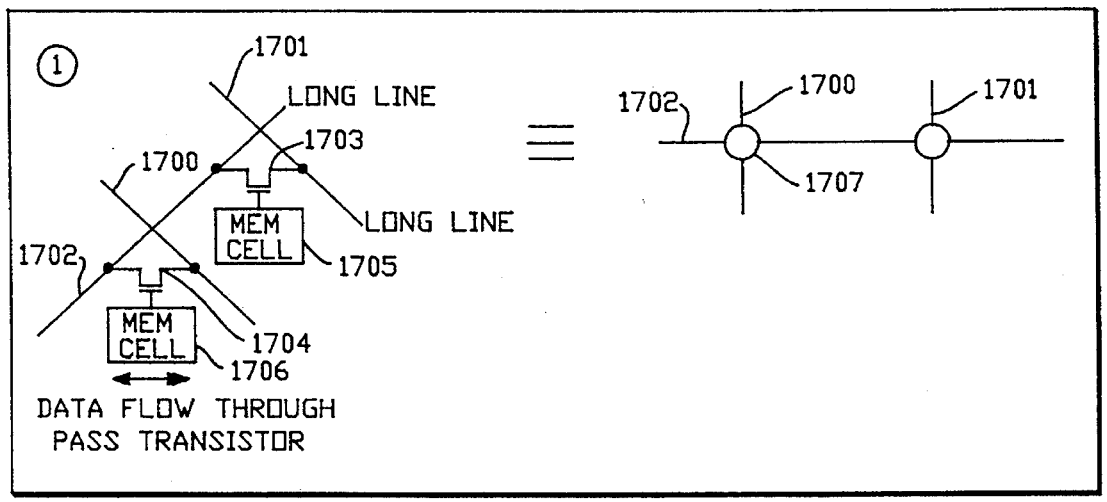
FIG.—17
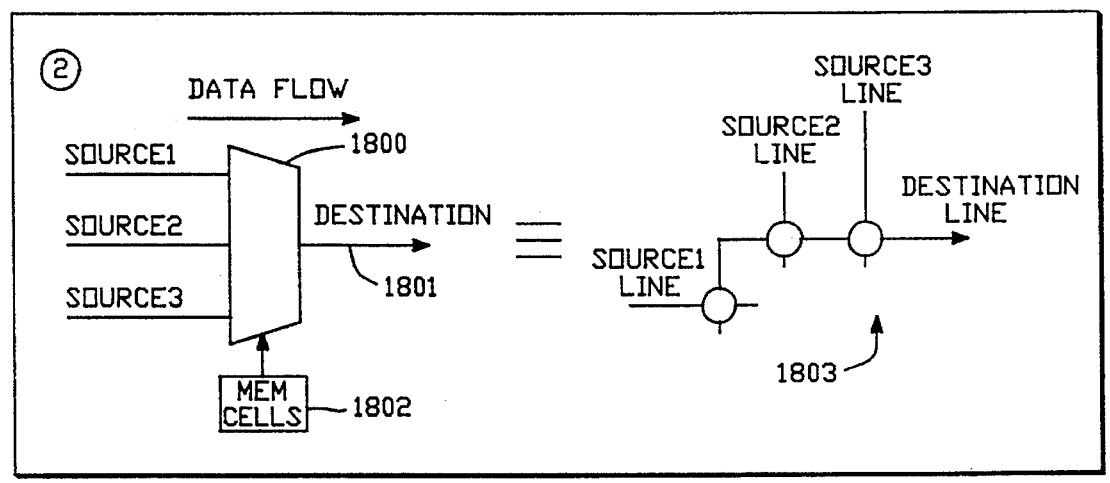
FIG.—18

OUTER BUS SEGMENT BOXES

CONFIGURABLE LOGIC BLOCK NOTATION

| A1 – A4 AND B1 – B4 | LONG LINE INPUTS |
| C1 – C4 AND D1 – D4 | GENERAL INPUTS (LOGIC) |
| EM1–EM4 AND FM1–FM4<br>EN1–EN4 AND FN1–FN4 | DIRECT CONNECT INPUTS |
| G1 – G4 AND H1 – H4 | GENERAL INPUTS (CONTROL) |
| K1 – K4 | LONG LINE INPUTS (BUS LINE 15) |
| X1 – X4 | OUTPUT FOR DIRECT CONNECT |
| Y1 – Y4 | OUTPUT TO GENERAL INTERCONNECT |

CLB MACROCELLS

MACROCELL 1

MACROCELL 2

CLB MACROCELLS

MACROCELL 3

MACROCELL 4

CLB INPUT MUX'ING

CLB MUX'ING

GENERAL PURPOSE CONTROL LINES IN CLBS
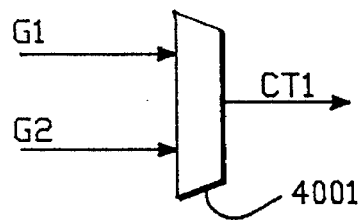
FIG.—40A
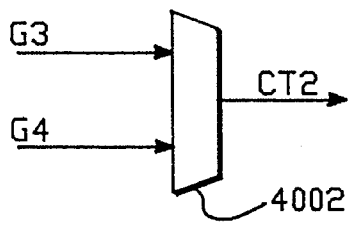
FIG.—40B
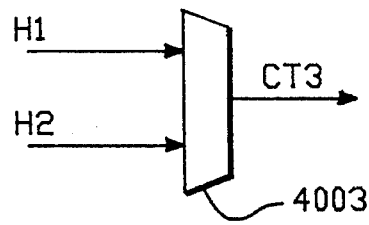
FIG.—40C
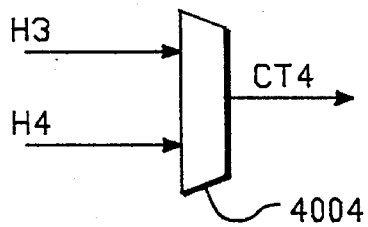
FIG.—40D
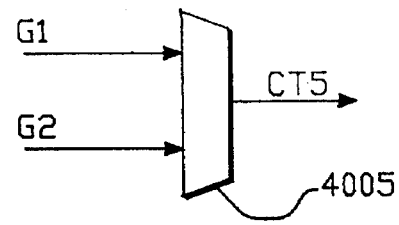
FIG.—40E
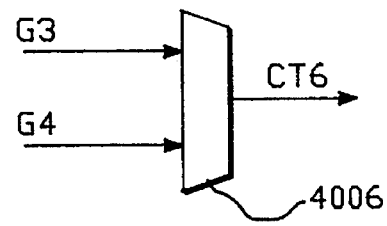
FIG.—40F
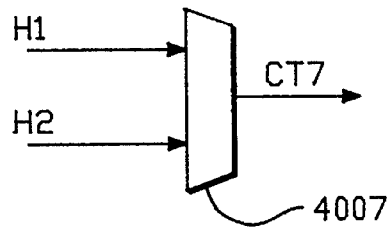
FIG.—40G
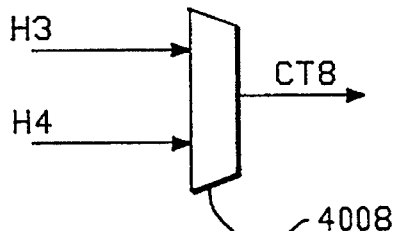
FIG.—40H

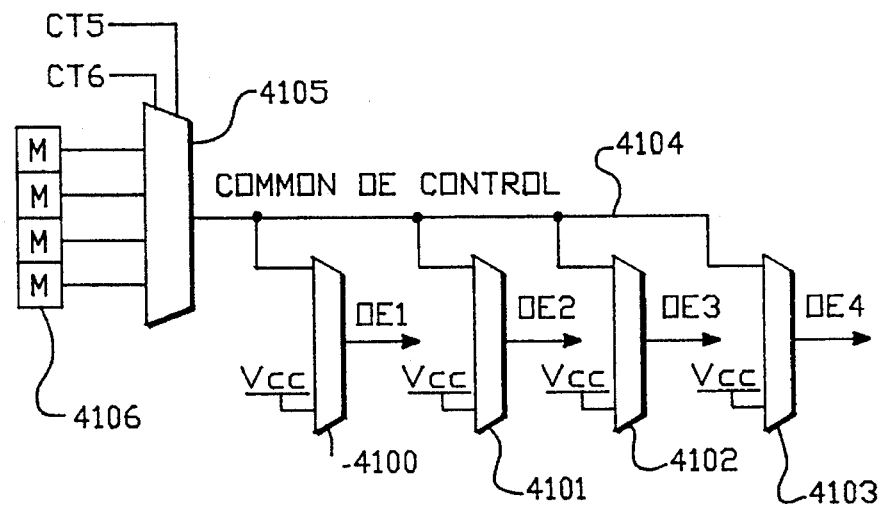
FIG.—41
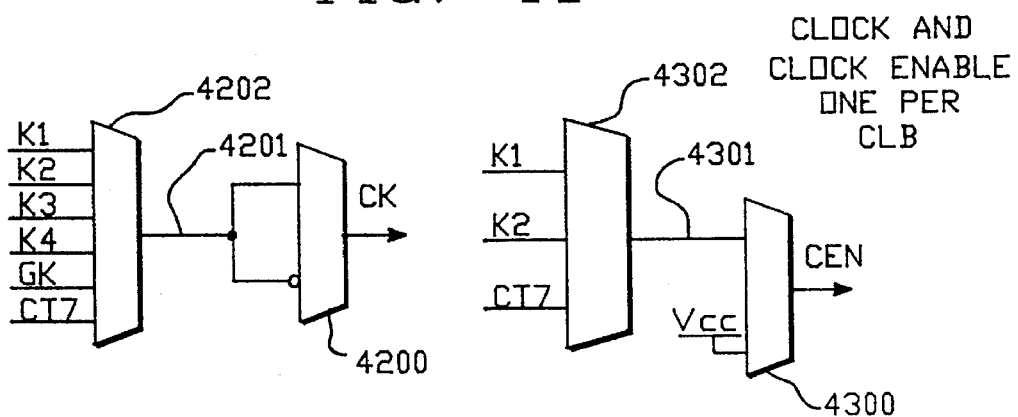
FIG.—42  FIG.—43
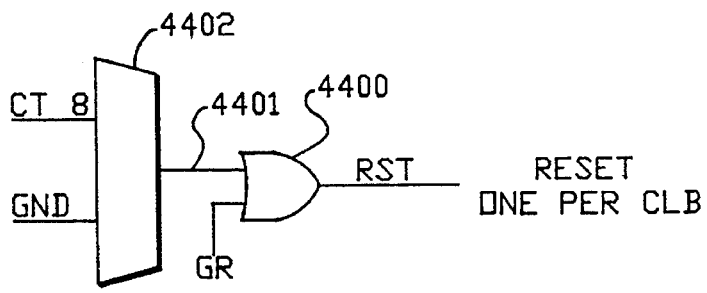
FIG.—44

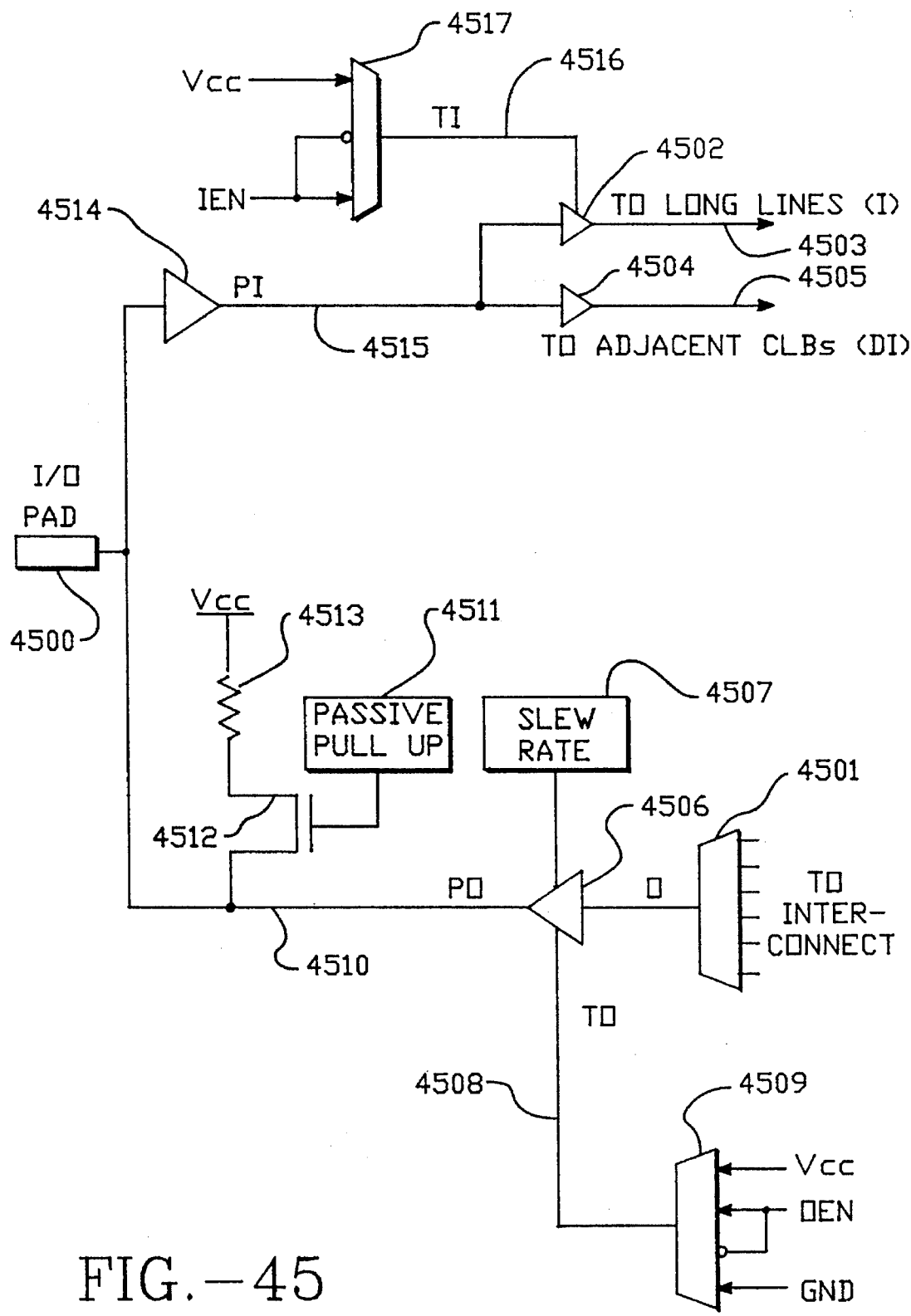
FIG.—45

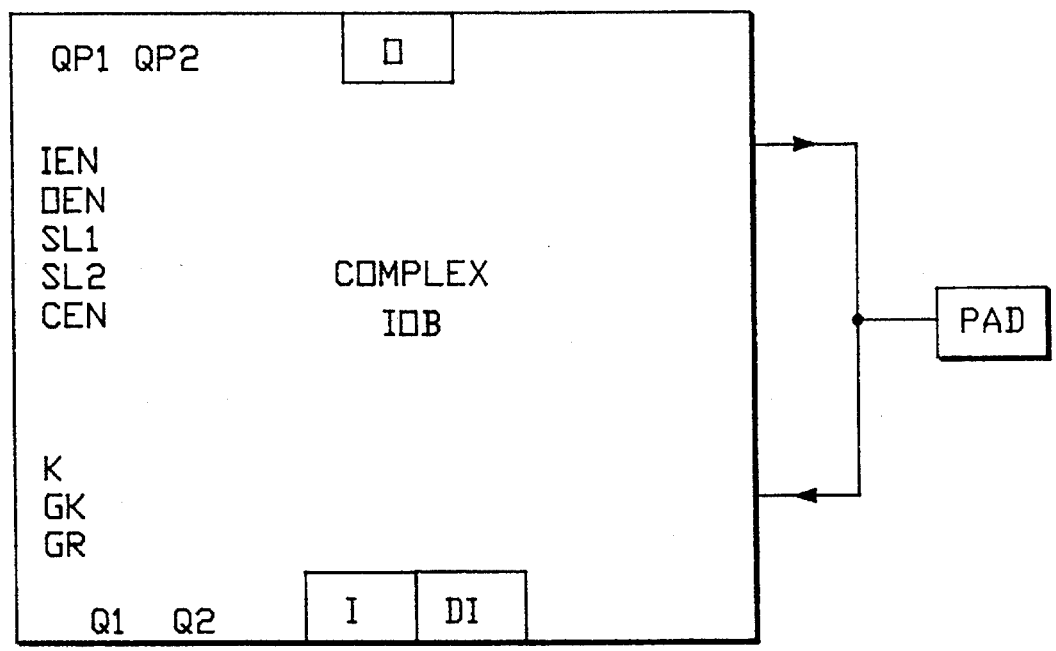
FIG.—47
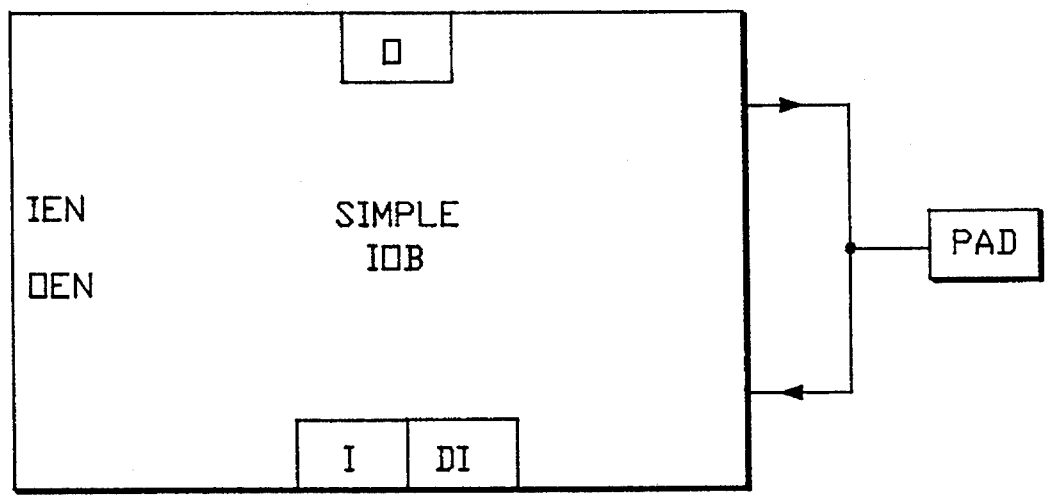
FIG.—48

DIRECT CONNECT FROM NEXT ADJACENT CLBS (INPUT TO CENTER CLB)

FIG.—50

DIRECT CONNECT FROM ADJACENT CLBS (INPUT TO CENTER CLB)

FIG.—51

DIRECT CONNECT (INPUT TO FM1 → FM4 AND FN1 → FN4 ON PERIPHERAL CLBS)

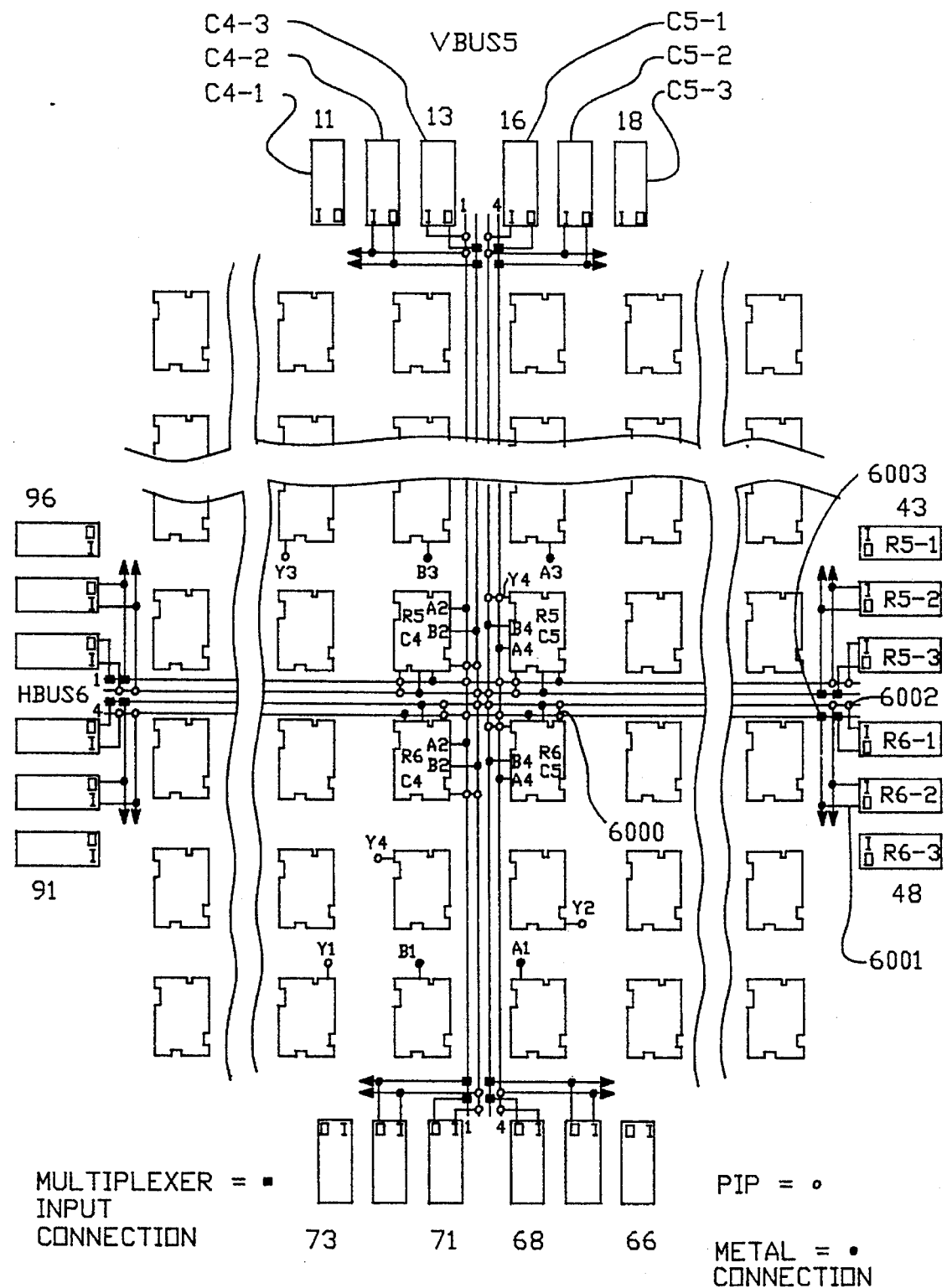
FIG.—60

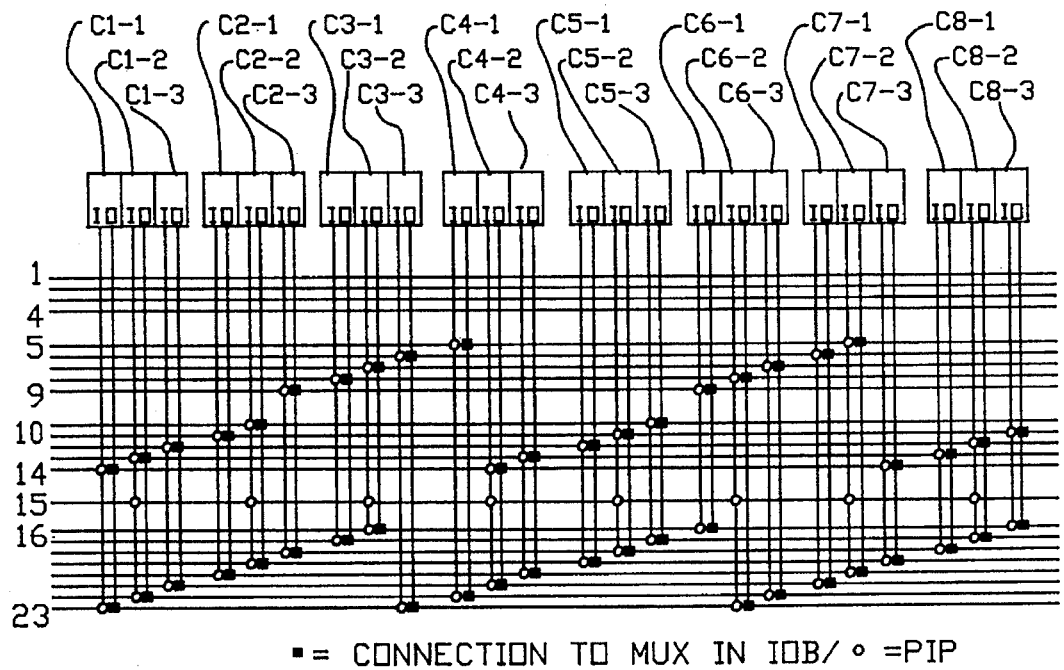
FIG.—61
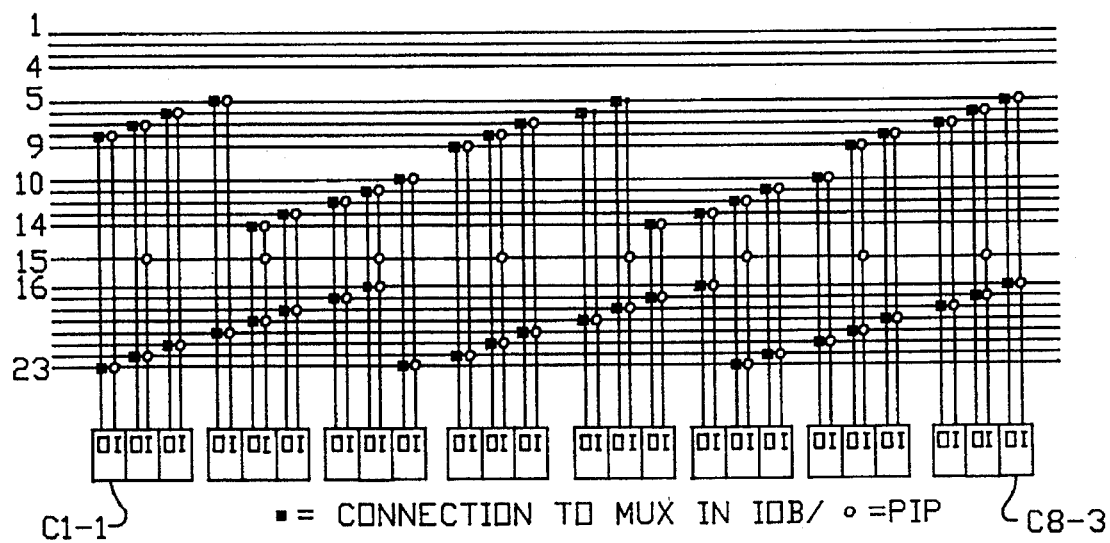
FIG.—62

IOB CONNECTIONS-LEFT SIDE
TO VERTICAL BUS1
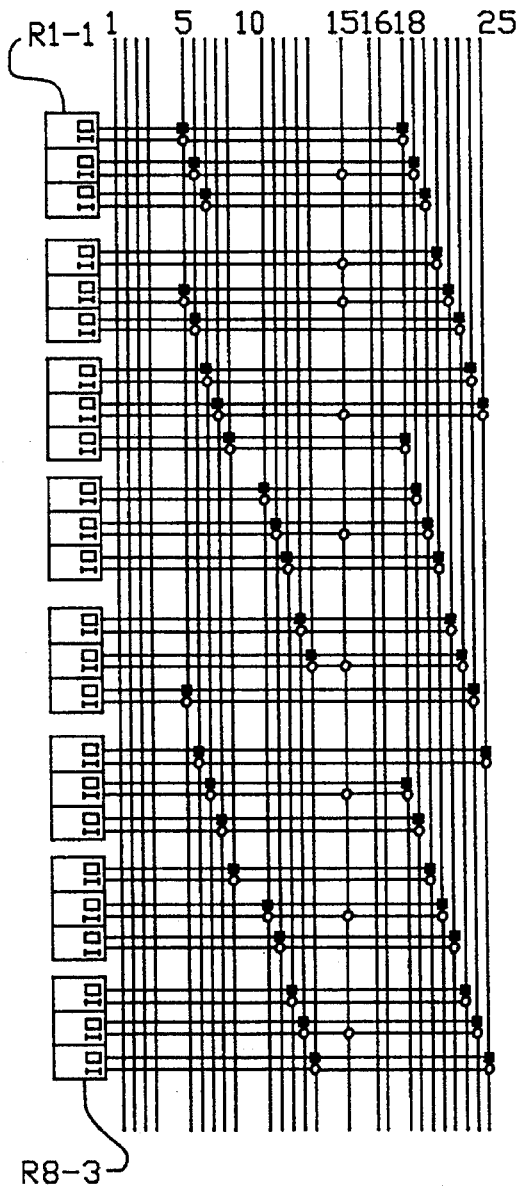
■ = CONNECTION TO MUX IN IOB
o = PIP
FIG.—63
IOB CONNECTIONS-RIGHT SIDE
TO VERTICAL BUS9
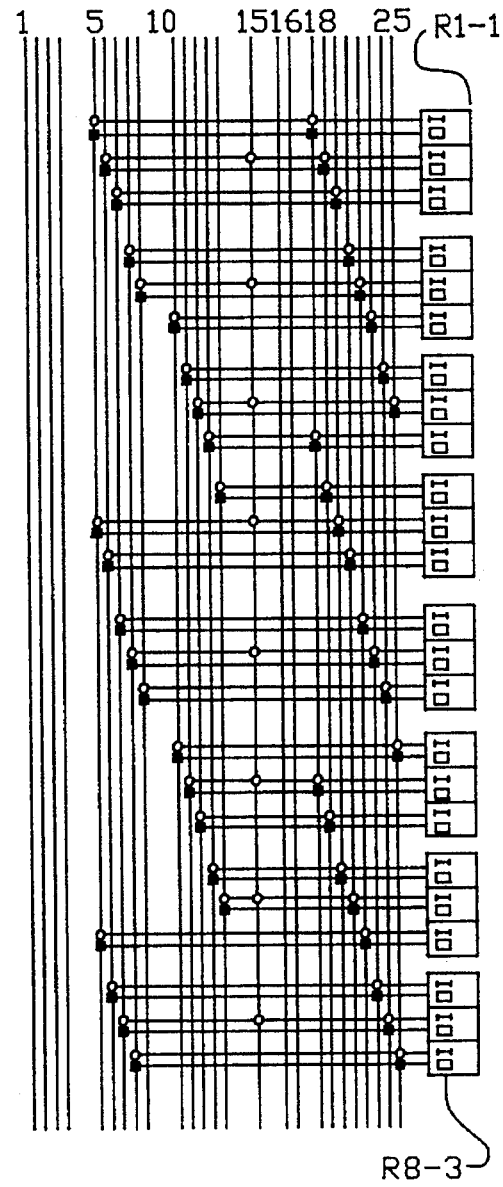
■ = CONNECTION TO MUX IN IOB
o = PIP
FIG.—64

IOB TO DIO LINES, CLOCK AND RESET: LEFT SIDE o = PIP/  • = FIXED METAL CONNECTION

FIG.—67

IOB CONTROL INPUTS

IOBS AT TOP AND LEFT

IOBS AT RIGHT AND BOTTOM

ARRAY OF CONFIGURABLE LOGIC BLOCKS EACH INCLUDING A FIRST LOOKUP TABLE OUTPUT COUPLED TO SELECTIVELY REPLACE AN OUTPUT OF SECOND LOOKUP WITH AN ALTERNATE FUNCTION OUTPUT

This application is a divisional of Ser. No. 08/271,872, filed Jul. 7, 1994, now U.S. Pat. No. 5,422,823 which is a divisional of Ser. No. 08/012,573, filed Feb. 1, 1993 now U.S. Pat. No. 5,329,460 which is a divisional of Ser. No. 07/379,221, filed Aug. 15, 1989 now U.S. Pat. No. 5,212,652.

FIELD OF THE INVENTION

The present invention relates generally to programmable logic devices and, more particularly, to programmable gate arrays consisting of an array of logic blocks and input/output blocks with an interconnection structure, each of which are configurable by a configuration program stored in on chip memory.

DESCRIPTION OF RELATED ART

The programmable gate array is a high performance, user programmable device containing three types of configurable elements that are customized to a user system design. The three elements are (1) an array of configurable logic blocks (CLBs), (2) with input/output blocks (IOBs) around a perimeter, all linked by (3) a flexible programmable interconnect network.

The system design desired by a user is implemented in the device by configuring programmable RAM cells. These RAM cells control the logic functionality performed by the CLBs, IOBs and the interconnect. The configuration is implemented using PGA design software tools.

It is generally accepted that the programmable gate array was first commercially introduced by Xilinx of San Jose, Calif. Xilinx originally introduced the XC2000 series of logic cell arrays and has more recently introduced a second generation XC3000 family of integrated circuit programmable gate arrays. A description of the 2000 series, as well as related programmable logic device art, can be found in *The Progammable Gate Array Design Handbook*, First Edition, published by Xilinx, pages 1-1 through 1-31. The architecture for the XC3000 family is provided in a technical data handbook published by Xilinx entitled XC3000 *Logic Cell Array Family*, pages 1-31. Each of these Xilinx publications is incorporated by reference in this application as providing a description of the prior art.

The prior art in programmable gate arrays is further exemplified by U.S. Pat. Nos. 4,642,487; 4,706,216; 4,713,557; and 4,758,985; each of which is assigned to Xilinx, Inc. These U.S. Patents are incorporated by reference as setting forth detailed descriptions of the programmable gate array architecture and implementations of the same.

As mentioned above, the programmable gate array consists of a configurable interconnect, a ring of configurable input/output blocks, and an array of configurable logic blocks. It is the combination of these three major features that provides flexibility and data processing power for programmable gate arrays. However, the programmable gate arrays of the prior art suffer certain limitations in each of the interconnect structure, the input/output block structures, and the configurable logic block structures.

The configurable interconnect structure must provide the ability to form networks on the programmable gate array which optimize utilization of the resources on the chip. The prior art interconnect systems have tended to force connection in the logical network to configurable blocks in a relatively small area. For instance, a prior system provides direct connections only between adjacent configurable logic blocks. The inputs and outputs on the configurable logic blocks are arranged in a left to right or otherwise asymmetrical layout that forces signal flow in a certain direction across the chip. This causes congestion on the interconnect structure for applications requiring a large number of inputs or outputs. Also, this forces the printed circuit board layout, which includes one of these asymmetrically designed logic cell arrays, to provide for inputs on one side of the logic cell array and outputs on the other.

In addition, the prior art interconnect structures are limited in the number of multi-source networks that can be implemented.

The input/output blocks in the prior art programmable gate arrays are relatively complex macro cells in order to provide flexibility needed for the wide variety of applications intended for the devices. However, these complex macro cells include resources that are unused in many configurations of the input/output blocks. Further, the blocks are relatively slow because of the complexity, requiring passage through a number of buffers, multiplexers and registers between the logic cells and the input/output pad o Furthermore, the input/output blocks cause congestion on the peripheral logic blocks in the device for applications involving a lot of input and output.

The configurable logic blocks themselves also suffer limitations which impact the flexibility of the device. The logic blocks of the prior art have operated upon a relatively small set of input variables. Thus, wide gating functions, such as decoding a 16 bit instruction or a wide multiplexing function, required cascading of many configurable blocks. Thus, a very simple function can utilize a large number of configurable logic blocks in the array. Further, when cascading blocks, due to the limitation of the number of direct interconnections between the logic blocks, many of the signals have to be transmitted across the programmable general connect. This causes delay because of the number of programmable interconnection points used. Further, for critical paths requiring fast operation, the cascading of blocks becomes impractical.

In the prior art configurable logic blocks, typically four input signals are used for the logic function. In order to obtain a five variable gating function, the configurable logic blocks used a sharing of inputs scheme. This sharing of inputs greatly limits the logic flexibility for these five variable functions in the prior art.

Prior art configurable logic blocks also suffered speed penalties because of the relatively complex structure required for the blocks to achieve user flexibility. For a block which is being used for a simple function, the logic would be propagated at a relatively slow rate because of the complex structures required.

It is desirable to provide a programmable gate array which provides for greater flexibility and logic power than provided by prior art devices.

SUMMARY OF THE INVENTION

The present invention provides an architecture for a configurable logic array with an interconnect structure which improves flexibility in creating networks to allow for greater utilization of the configurable logic blocks and input/output blocks on the device.

Accordingly, the present invention is an improved configurable logic array comprising a configuration memory storing program data specifying a user defined data processing function. In addition, a plurality of configurable logic blocks are arranged in an array consisting of C columns and R rows. Each configurable logic block is coupled to the configuration memory and has a plurality of inputs and outputs for generating output signals at the respective outputs in response to the input signals at the respective inputs and in response to program data in the configuration store. A plurality of configurable input/output blocks is included, each coupled to an input/output pad and to the configuration store, and having at least one input and at least one output. The configurable input/output blocks provide configurable interfaces between the respective pads and the respective inputs and outputs in response to the program data. A configurable interconnect is coupled to the configurable logic blocks, configurable input/output blocks and to the configuration store, for connecting the inputs and outputs of configurable logic blocks and configurable input/output blocks into logical networks in response to the program data in the configuration store.

According to one aspect of the invention, the configurable interconnect is symmetrically disposed relative to the inputs and outputs of the configurable logic blocks. Thus, Inputs of the CLBs can be derived from four sides and outputs can be driven to four sides of the respective CLB into a symmetrical interconnect structure.

The interconnect includes a plurality of horizontal buses along the rows of CLBs and a plurality of vertical buses along the columns of CLBs. The intersections of the horizontal and vertical buses are configurable to route networks across the device.

Another aspect of the interconnect includes a plurality of switching matrices at the intersections of horizontal and vertical buses, each having a set of horizontal connections and a set of vertical connections, for interconnecting respective ones of the horizontal or vertical connections in response to program data in the configuration store. A plurality of horizontal conductive segments in the horizontal bus are connected between the horizontal connections of the switching matrices. A plurality of programmable interconnect points coupled to respective inputs and outputs of the configurable logic blocks and input/output blocks provide connectability to respective horizontal segments in response to program data. Likewise, a plurality of vertical conductive segments in the vertical bus are connected between the vertical connections of the adjacent switching matrices. Programmable interconnect points interconnect the respective inputs and outputs of configurable logic blocks and input/output blocks with respective vertical segments in response to the program data. The vertical and horizontal segments, according to one aspect of the invention, are characterized by extending from a switching matrix in a vertical or horizontal bus "i" to switch matrix in bus "i+2", so that each segment spans two columns or rows of logic blocks.

The buses in the interconnect are further characterized by a plurality of horizontal and vertical long conductive lines which extend across the entire chip. Each long line is connected to a plurality of programmable interconnect points for interconnecting the respective inputs or outputs of configurable logic cells with the respective long line in response to program data in the configuration memory. The long lines are characterized by having programmable interconnect points coupling an output of a configurable logic block which is supplied by a tristate buffer to the respective long lines.

In another aspect, the buses in the interconnect structure are characterized by uncommitted horizontal and vertical long lines. Each uncommitted long line is connected to a first plurality of programmable interconnect points for interconnecting the respective outputs of configurable logic blocks or input/output blocks with the respective long line in response to program data, and a second plurality of programmable interconnect points for interconnecting respective uncommitted long line with the horizontal or vertical segments that are coupled to the switching matrices.

The interconnect structure further includes a plurality of direct connections interconnecting an output of a configurable logic block or input/output block to an input of another configurable logic block or input/output block. The direct connections are characterized by including at least a first subset which are connected between adjacent input/output blocks or configurable logic blocks, and a second subset which are connected between the output of a configurable logic block or input/output block and a next adjacent configurable logic block or input/output block. In one aspect of the invention, each CLB is directly connected to 8 neighbor CLBs.

The plurality of configurable input/output blocks is characterized by groups of input/output blocks associated with each row or column of configurable logic blocks. Within each group, at least one complex input/output block is included and at least one simple input/output block. The complex input/output blocks provide the flexible functionality required for many applications, while the simple input/output block provides a fast access path into or out of the configurable array.

Further, all of the input/output logic blocks are characterized by tristatable output buffers to pads and to the internal interconnect which are controlled in response to the program data and/or a control signal generated in the configurable logic array.

Also, the outputs of the configurable logic blocks include a plurality of tristate buffers which receive respective ones of the output signals of the combinational logic and tristate control signals. The tristate output buffers supply a respective output signals or present a high impedance state as output from the logic block in response to the tristate control signal. The tristate control signal is generated in response to the program data in the configuration store and an input to the configurable logic block.

Another aspect of the invention is configurable repowering buffers with a bypass path coupled to the horizontal and vertical segments that go through switching matrices. Also, provision is made through the interconnect to supply control signals to all CLBs in the array from a single source.

The configurable logic blocks, according to the present invention, are characterized by a number of improvements over the prior art. In particular, the configurable logic blocks provide for a mixture of narrow gating and wide gating functions, which suffer a speed penalty only for the wide gating functions. Also, the configurable logic blocks are symmetrical, accepting inputs on four sides of each block and providing outputs on four sides. The output structures themselves provide the ability for tristating outputs connected to the configurable interconnect, and for directly driving signals to other configurable logic blocks.

The input structures on all four sides of the configurable logic blocks are independently configurable in response to the configuration program. Likewise, the four output macro cells in each configurable logic block are independently configurable.

As a feature that allows greater utilization of resources on the array, the registers in each of the output macro cells are accessible independently of the combinational logic in the configurable logic block. This allows these registers to be used in networks that are independent of the combinational logic.

According to one aspect, the configurable logic block can be characterized as having an input multiplexing tree which receives J input signals and selects a subset K signals, where K is less than or equal to J, in response to the program data. Combinational logic is coupled to the configuration memory and the input multiplexing tree, for generating a plurality of L logic signals in response to the K signals and the program data. Four independent output macro cells are included, each of which select output signals from the plurality of L logic signals.

Each of the output macro cells includes a tristatable output buffer for driving a selected output signal to the configurable interconnect. Also, each output macro cell includes a second output buffer, for driving a signal that is selected independently of the tristatable output buffer, for driving signals onto direct connections to other configurable logic blocks.

The input multiplexing tree is characterized by providing that any one of the K signals can be supplied from any of the four sides of the configurable logic block.

The combinational logic is implemented with a first lookup table in the program data consisting of 64 bits which are grouped into eight 8 bit arrays. The 8 bit arrays are paired so that three independently supplied signals from the subset of K signals supplied by the input multiplexing tree are used to address each of the four pairs of 8 bit arrays. The two outputs of each pair are coupled to a cross-multiplexer which is configurable in response to the program data to directly pass through the two outputs supplied by the two 8 bit arrays in the pair, or to select one of the two outputs as a primary output in response to a fourth independently supplied signal from the subset K signals. The output of the cross-multiplexer is supplied through a third multiplexing level consisting of two multiplexers, each independently controllable by respective ones of the subset of K signals. The output of the third level of multiplexing is then supplied to a fourth level of multiplexing which is controlled by one of the subset of K signals, providing output which is a full lookup function of the 64 bit array in response to six inputs.

The combinational logic further includes a special 16 bit array in the program data which is coupled to a sixteen to one multiplexer. Control inputs to the sixteen to one multiplexer are the pass through outputs of the four cross-multiplexers referred to above. Each of these inputs is a function of four independent variables. The output of the sixteen to one multiplexer provides a special output, which provides a limited lookup function of the 16 independent variables. The special output is combined with the output of the fourth level multiplexer in a fifth level multiplexer, which is controlled in response to an input signal of the subset of K signals, or by the program data.

According to another aspect, the configurable logic block is characterized by a preload capability. During programming of the configurable logic array, each of the storage elements in the output macro cells of the configurable logic blocks is enabled to receive data as if it were a location in the configuration memory.

The configurable input/output architecture, according to the present invention, is characterized by a number of improvements over the prior art. In particular, the architecture provides for groups of input/output blocks associated with each row and column of configurable logic blocks in the array. Each of the groups is further characterized by having a plurality of complex input/output blocks, which provide flexible structures for implementing interfaces between the configurable logic array and outside devices, and at least one simple input/output block which provides a fast path from outside the device to the configurable logic array if required by a particular application.

Further, both the simple and complex input/output blocks are characterized by having at least one tristatable output buffer for driving signals onto the configurable interconnect structure, and a second buffer for driving direct connections to configurable logic blocks in the device.

The complex input/output blocks include an input storage element and an output storage element. A direct connection is provided from the input storage element of one complex input/output cell to a next adjacent complex input/output around the perimeter of the device. The output storage elements of the complex input/output cells are similarly connected. Thus, the storage elements in the complex input/output blocks can be linked into a configurable data path where they can be operated as a shift register or other similar circuit.

The storage elements in the complex input/output blocks are further configured to provide for synchronization functions, local readback functions, and burled register functions.

The input/output blocks according to the present invention, are further characterized by control signal generation from the long lines in the programmable interconnect structure. This allows utilization of networks in the configurable logic array to control the operation and configuration of the configurable input/output blocks in a dynamic fashion. Also, the long lines are configured to propagate signals completely around the perimeter of the array, so that a common signal can be used to control all of the input/output blocks.

The configurable logic array provided, according to the present invention, greatly improves the flexibility and performance of programmable gate arrays over those available an the prior art. This is accomplished in part by an interconnect structure which supports networks with long reach across the device, multi-source networks, and symmetrical connections to the configurable logic blocks.

Further, a unique configurable logic block architecture supports efficient utilization of the resources in the array, wide gating functions, narrow gating functions without speed penalty and implementation of symmetrical networks in the array.

Finally, a unique input/output architecture supports efficient utilization of the resources in the input/output structures, allows for both fast signal propagation through the simple input/output blocks and high function signal propagation through the complex input,output blocks into the array, and has improved flexibility in the source of control signals for the input/output structure.

Further aspects and advantages of the present invention will be found upon review of the drawings, the detailed description and the claims which follow.

BRIEF DESCRIPTION OF THE FIGURES

FIG. 14A illustrates an alternative corner connection scheme that can be used at all four corner intersections, replacing the schemes of FIGS. 11–14.

FIG. 15 illustrates the connection of lines 16 and 17 of the vertical buses with the global reset and global clock buffers.

FIG. 15A illustrates the connection of the vertical lines 16 and 17 with the configurable logic blocks.

FIG. 15B illustrates the signal path from an input/output pad bypassing internal IOB logic for connection to the global clock buffer, horizontal alternate buffer or vertical alternate buffer.

FIG. 15C illustrates the inputs to the global clock buffer.

FIG. 16 illustrates the connection of the horizontal alternate buffers with line 15 on the horizontal buses and the vertical alternate buffers with line 15 on the vertical buses FIG. 16A illustrates the connection of the input/output blocks and the configurable logic blocks with line 15.

FIG. 16B illustrates the input paths to the vertical alternate buffer.

FIG. 16C illustrates the input paths to the horizontal alternate buffer.

FIG. 16D illustrates the crystal oscillator circuit by which the oscillator signal OSC is generated on the chip.

FIG. 16E illustrates the external connections for the oscillator of FIG. 16D.

FIG. 17 illustrates one implementation of a programmable interconnect point using bidirectional pass transistors.

FIG. 18 illustrates an alternative configuration of a programmable interconnect point using a unidirectional multiplexer technique.

FIG, 39 is a schematic diagram of the input multiplexing structure for the control signal VG used in providing the special output.

FIGS. 40A–40H show respectively the input multiplexing for the general purpose control lines CT1–CT8.

FIG. 41 is a schematic diagram of the circuit generating output enable control signals OE1–OE4 in the configurable logic block.

FIG. 42 is a diagram illustrating selection of the clock signal in the configurable logic block.

FIG. 43 is the schematic diagram illustrating generation of the clock enable signal in the configurable logic block.

FIG. 44 is a schematic diagram illustrating selection of the reset signal in the configurable logic block.

FIG. 45 is a schematic diagram of a simple input/output cell according to the present invention.

Figure 46:
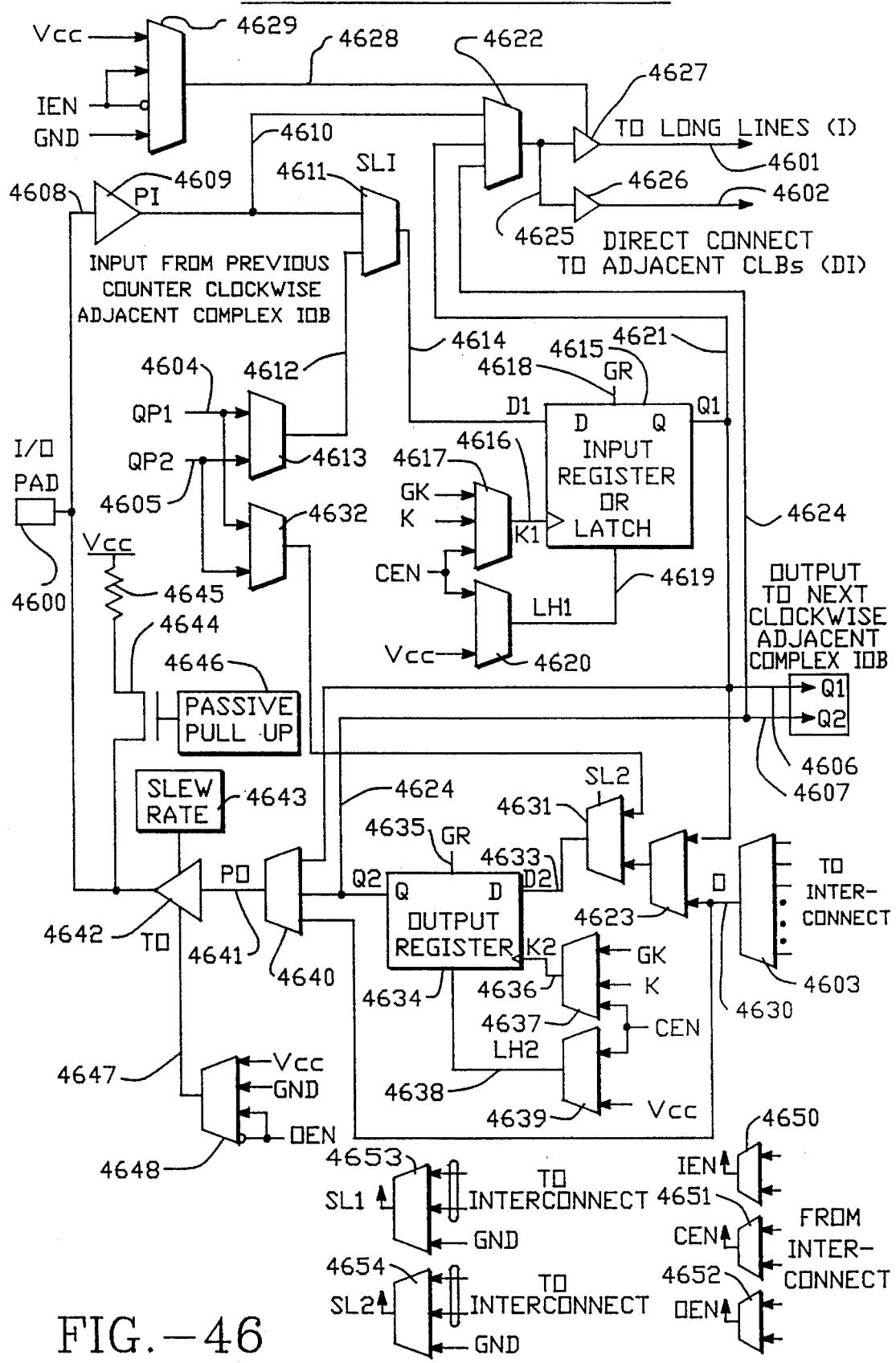

FIG. 46 is a schematic diagram of a complex input/output cell according to the present invention.

FIG. 47 illustrates the inputs and outputs of the complex input/output block.

FIG. 48 illustrates the inputs and outputs of the simple input/output block.

Figure 49:
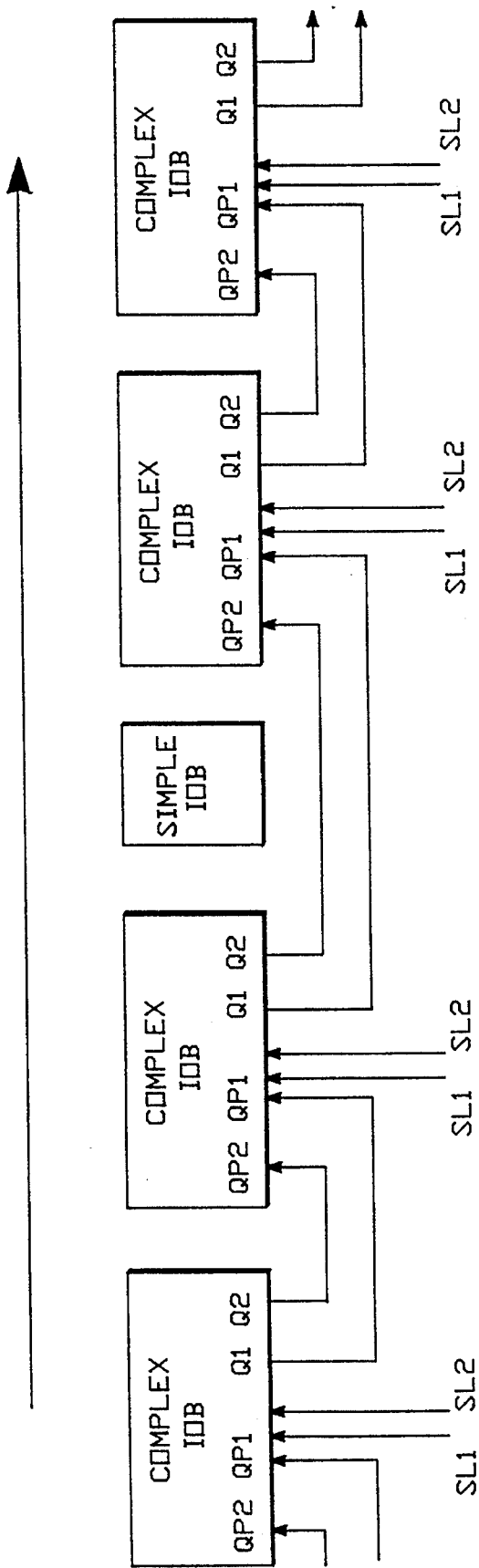

FIG. 49 schematically illustrates the connection of the complex input/output blocks in a shift register configuration.

Figure 50:
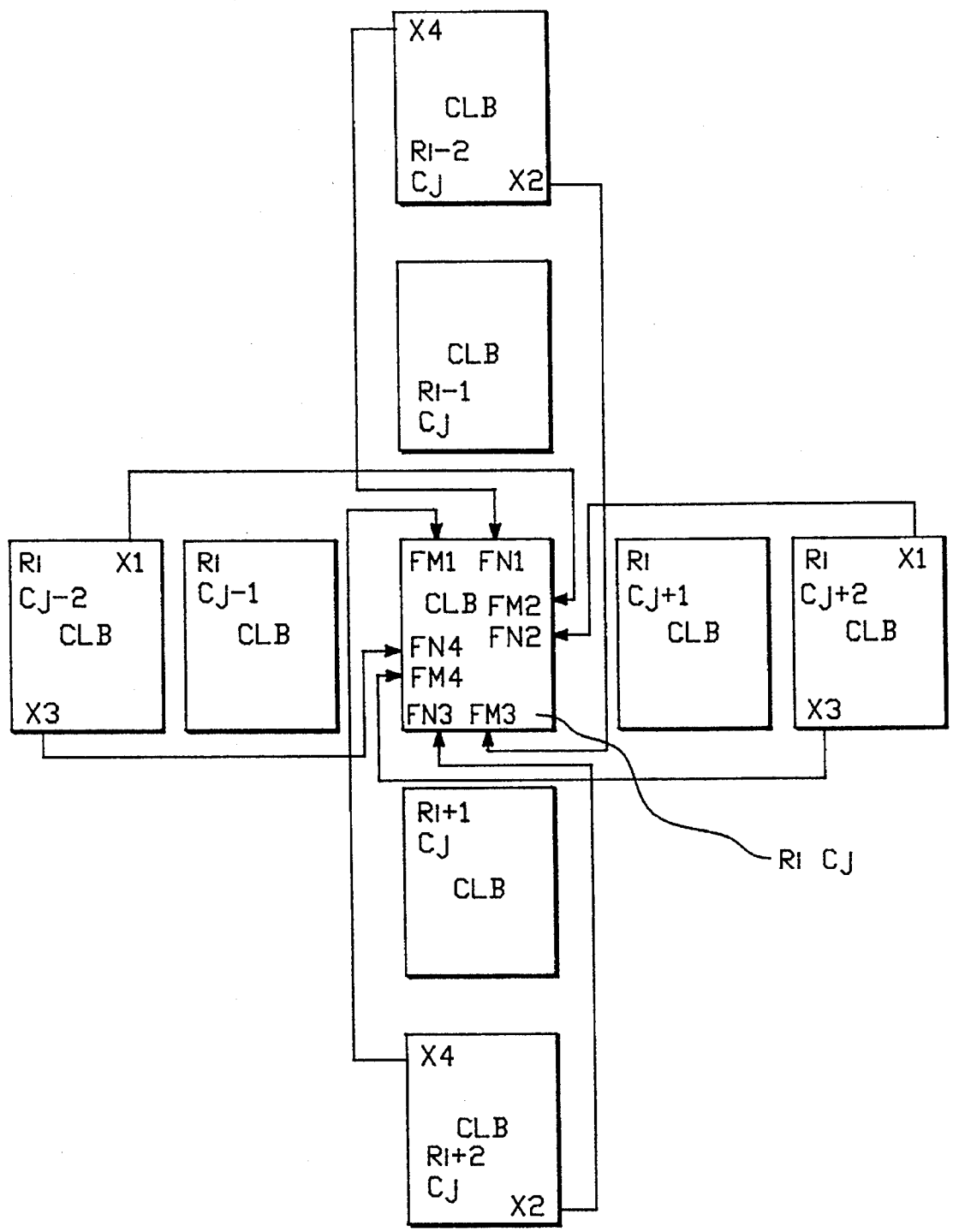

FIG. 50 illustrates the direct connections from outputs of next adjacent configurable logic blocks to the inputs of a given logic block.

Figure 51:
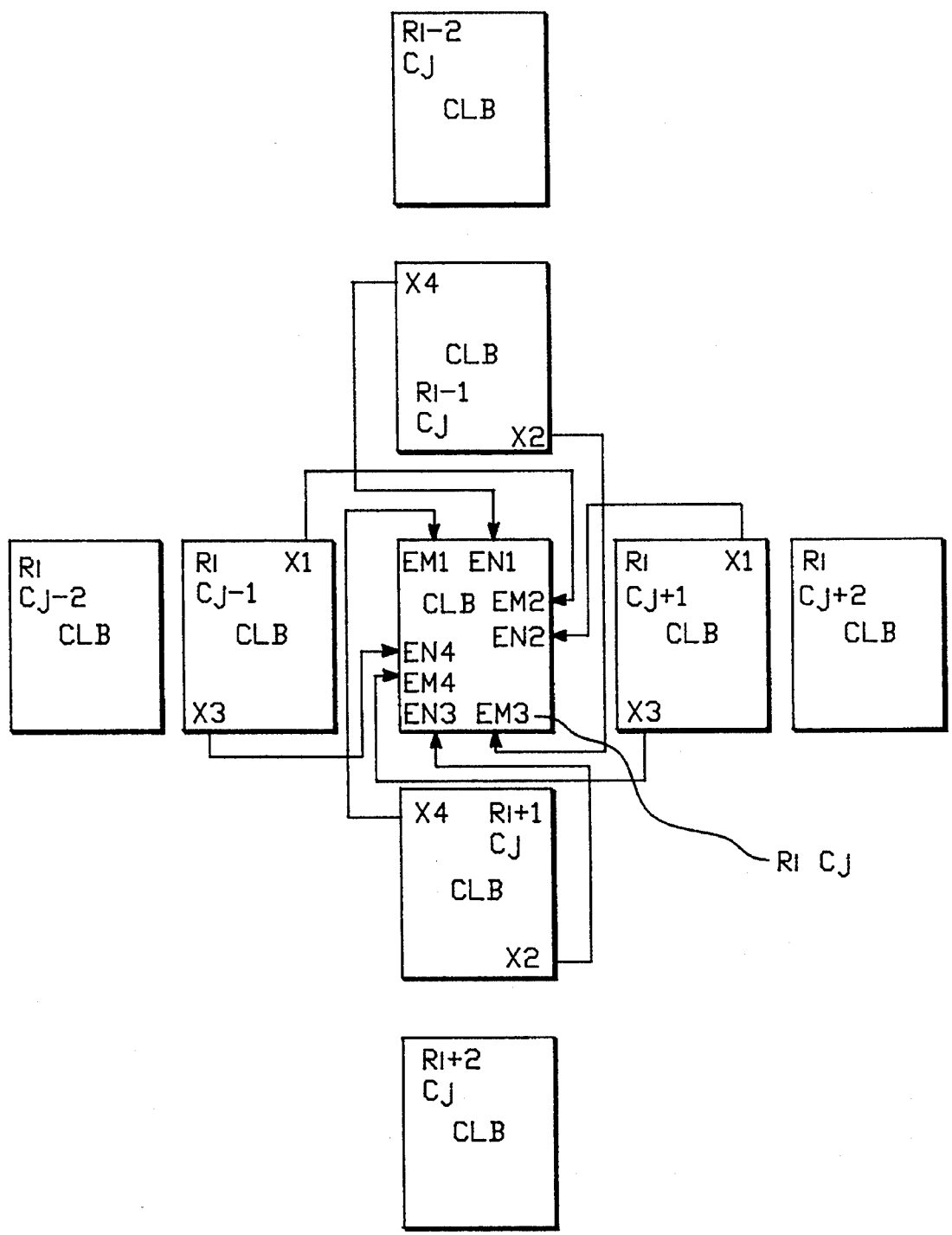

FIG. 51 illustrates direct connections from adjacent configurable logic blocks to the inputs of the center configurable logic block.

Figure 52:
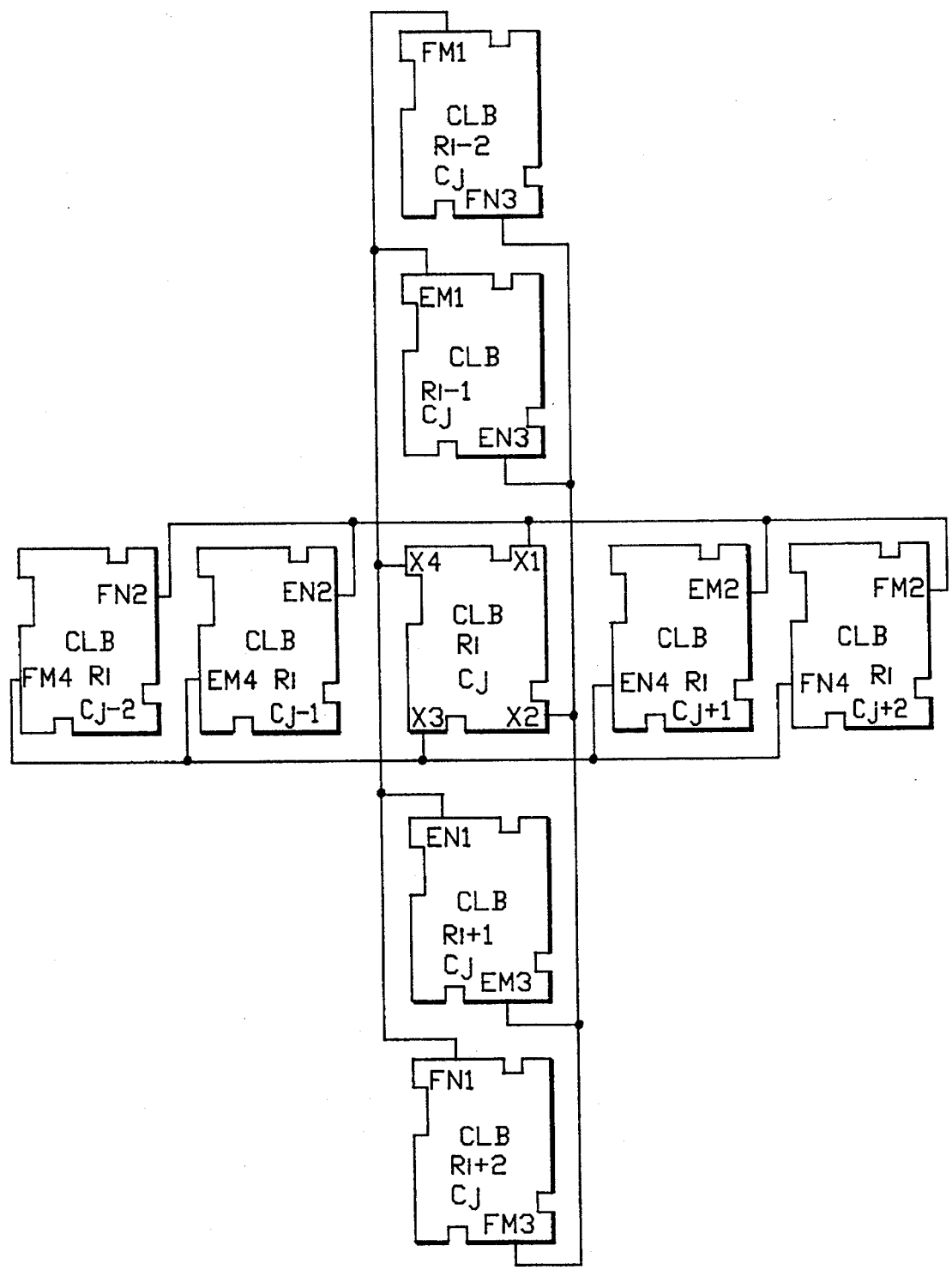

FIG. 52 illustrates direct connections from the output of the center configurable logic block to adjacent and next adjacent configurable logic blocks.

Figure 53:
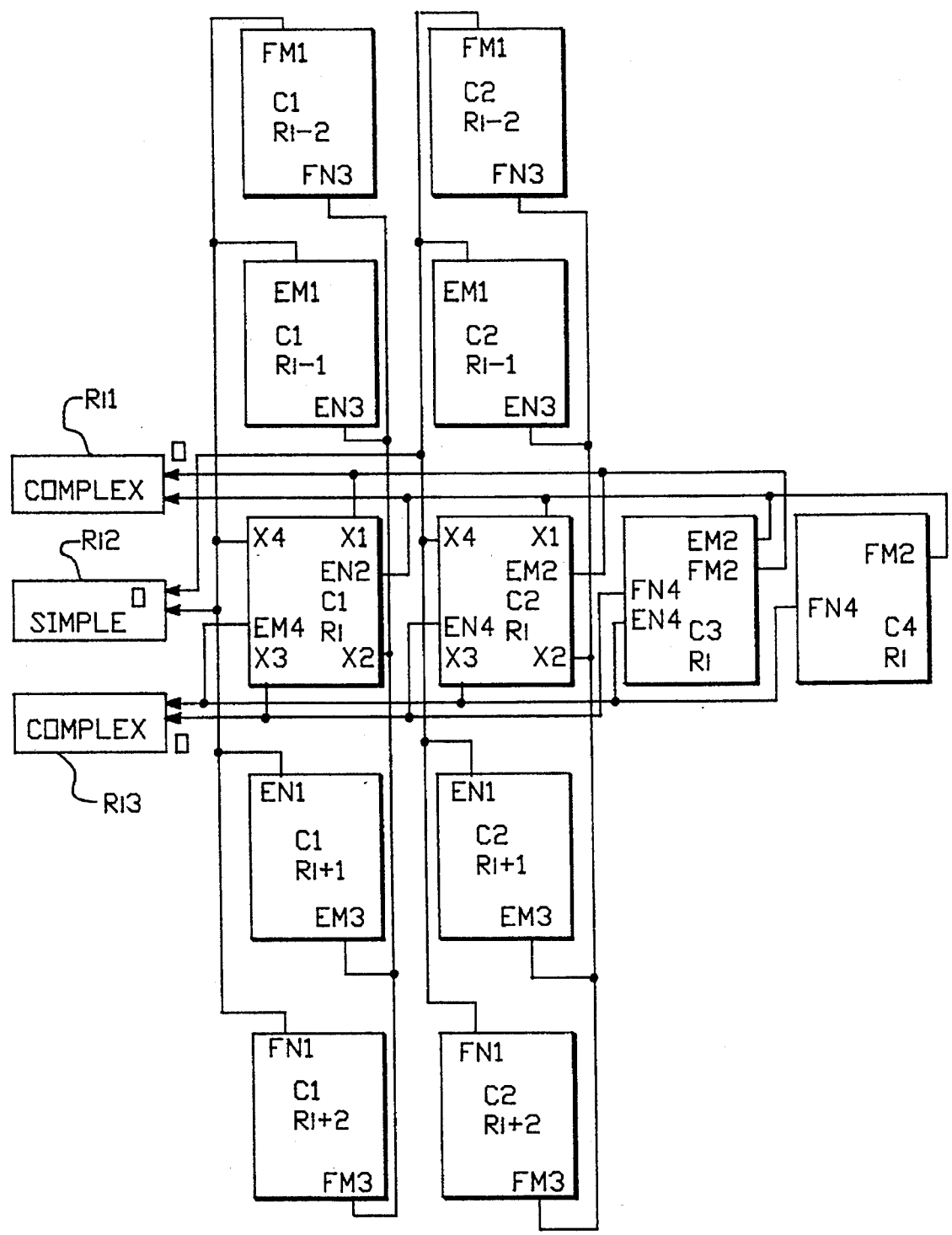

FIG. 53 illustrates direct connection of the outputs X1–X4 on peripheral configurable logic blocks.

Figure 54:
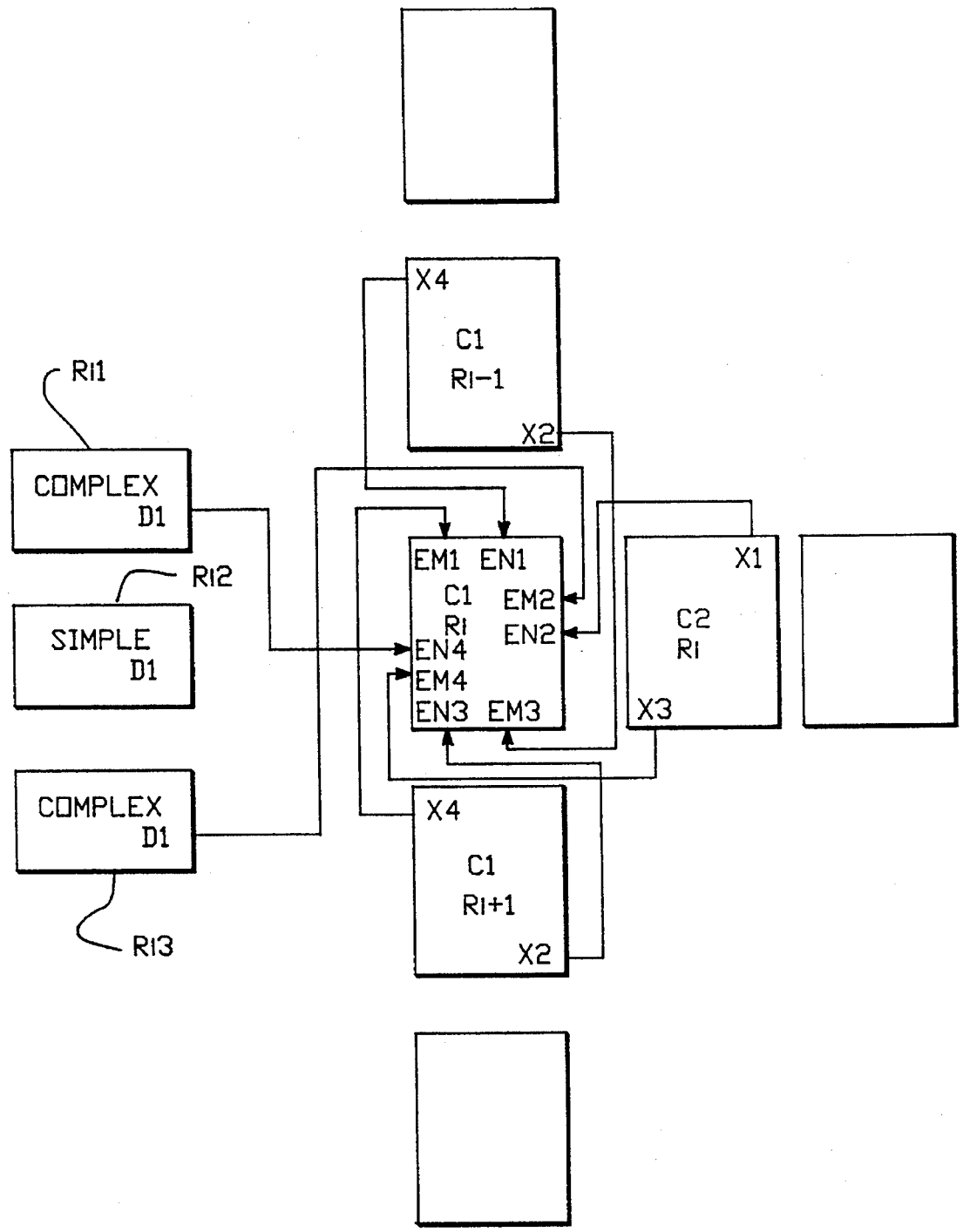

FIG. 54 illustrates direct connection to the inputs of a peripheral configurable logic block.

Figure 55:
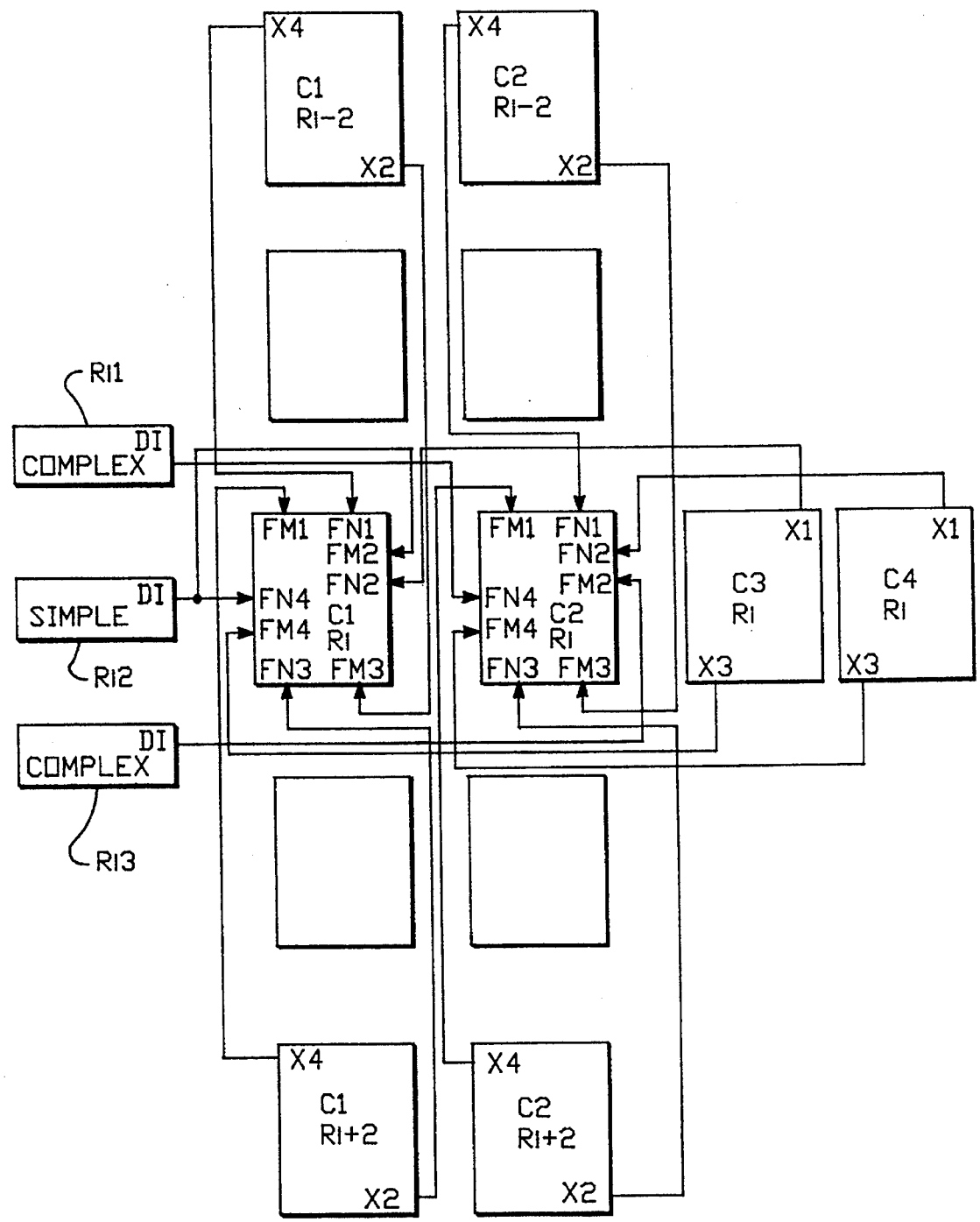

FIG. 55 illustrates direct connections to the inputs F1–F4 on a peripheral configurable logic block.

Figure 56:
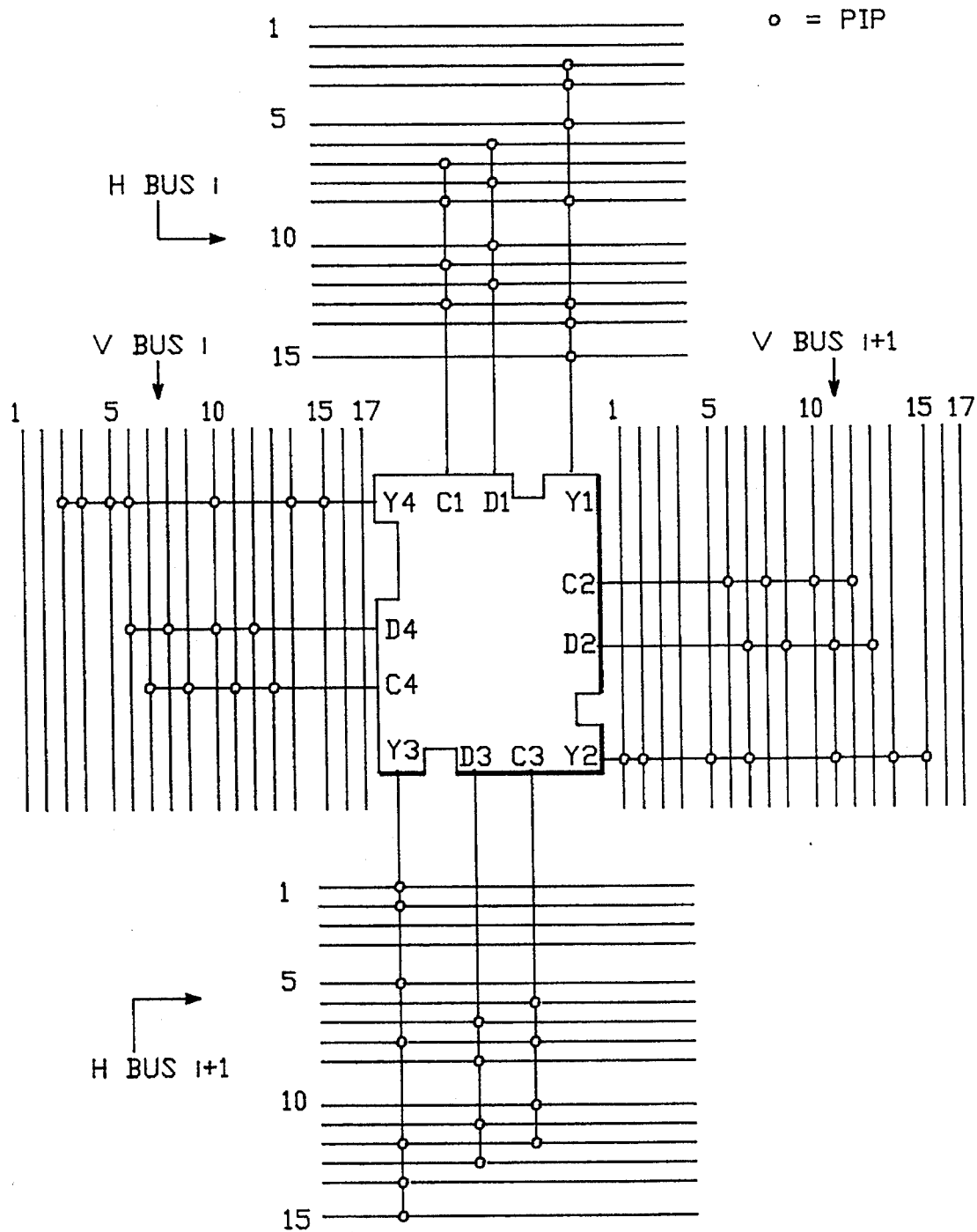

FIG. 56 illustrates the programmable connections between the interconnect structure and the configurable logic blocks.

Figure 57:
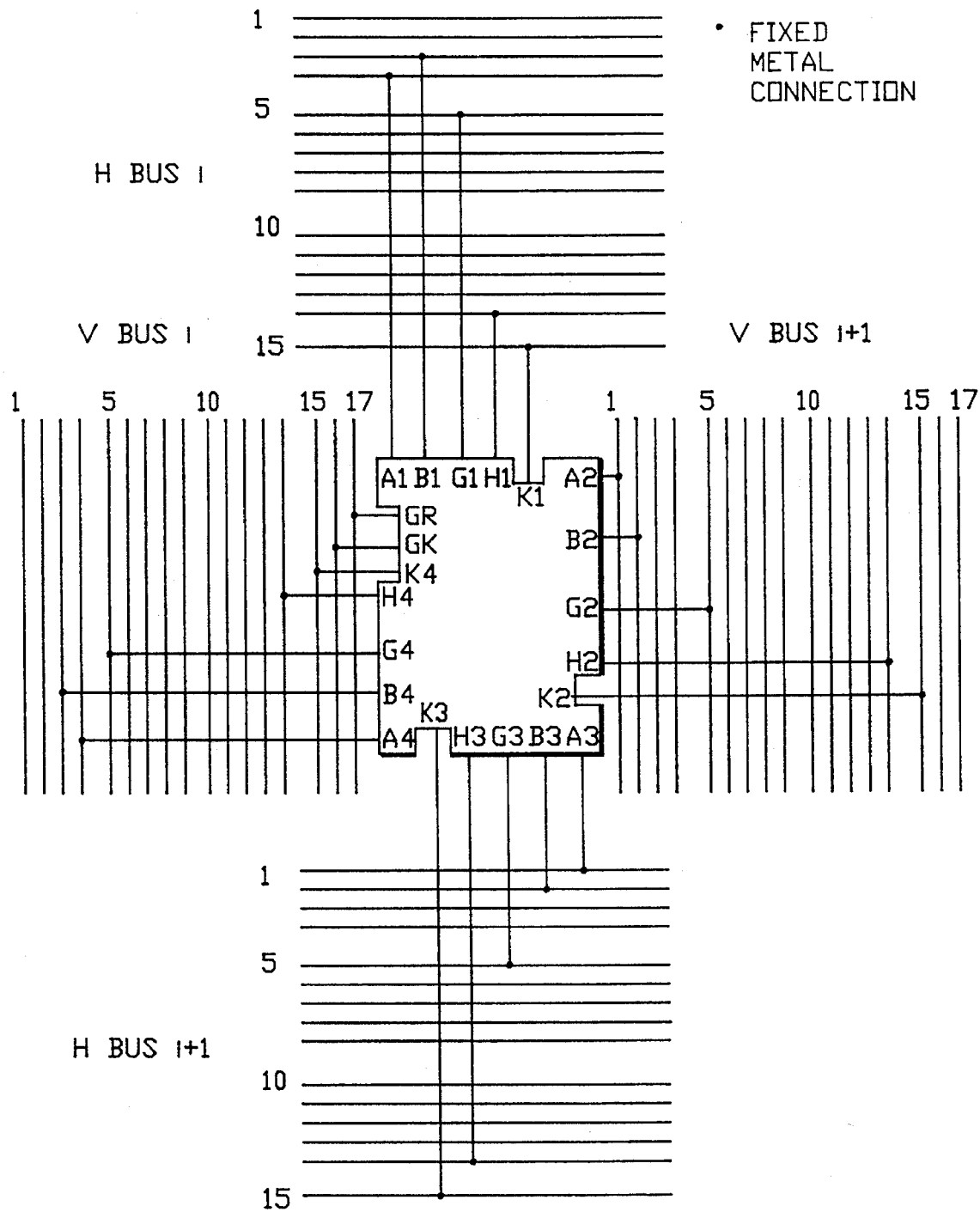

FIG. 57 illustrates the fixed connections between the interconnect structure and the configurable logic blocks.

Figure 58:
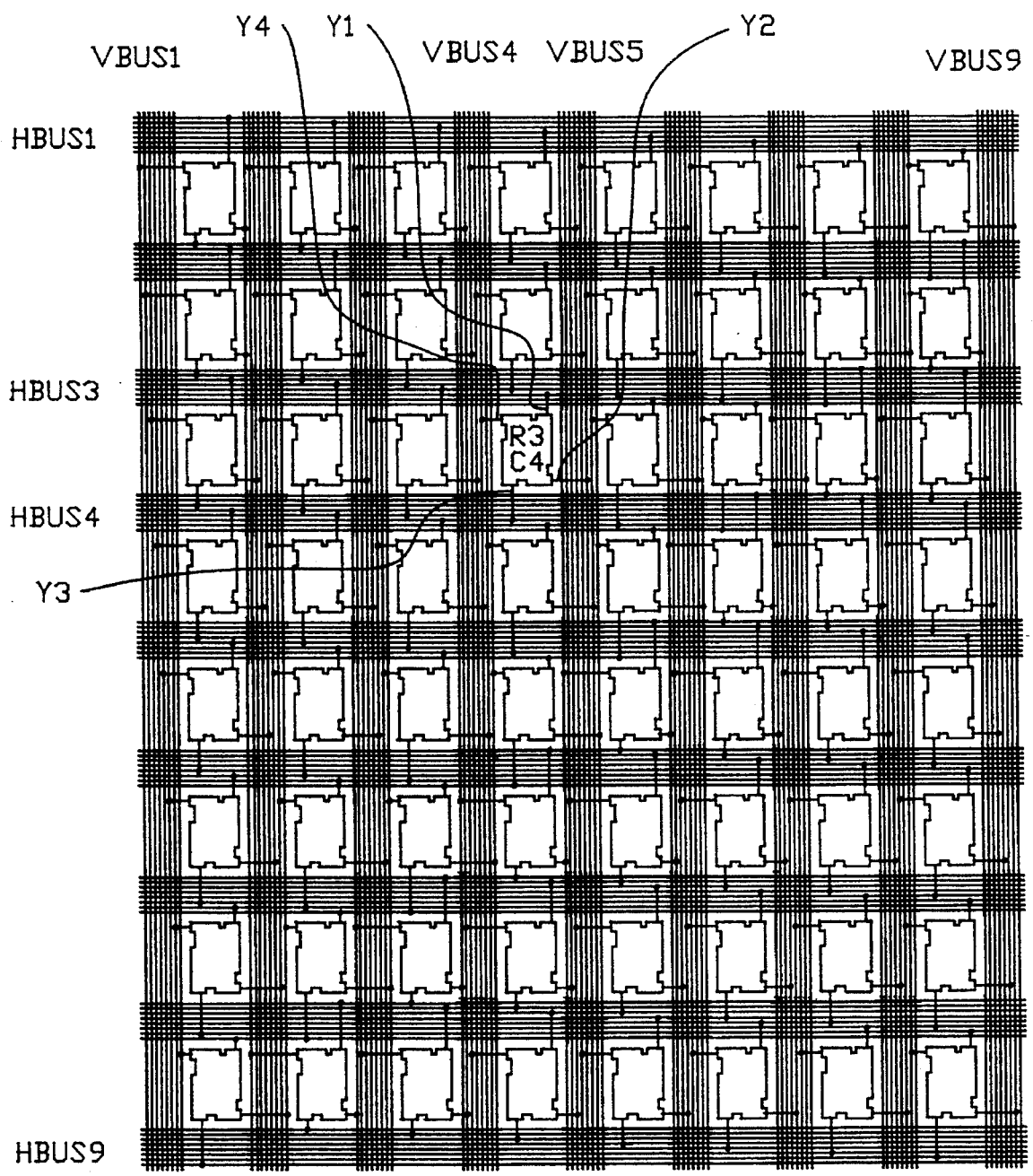

FIG. 58 illustrates the programmable connection of the configurable logic blocks in the array to uncommitted long lines.

Figure 59:
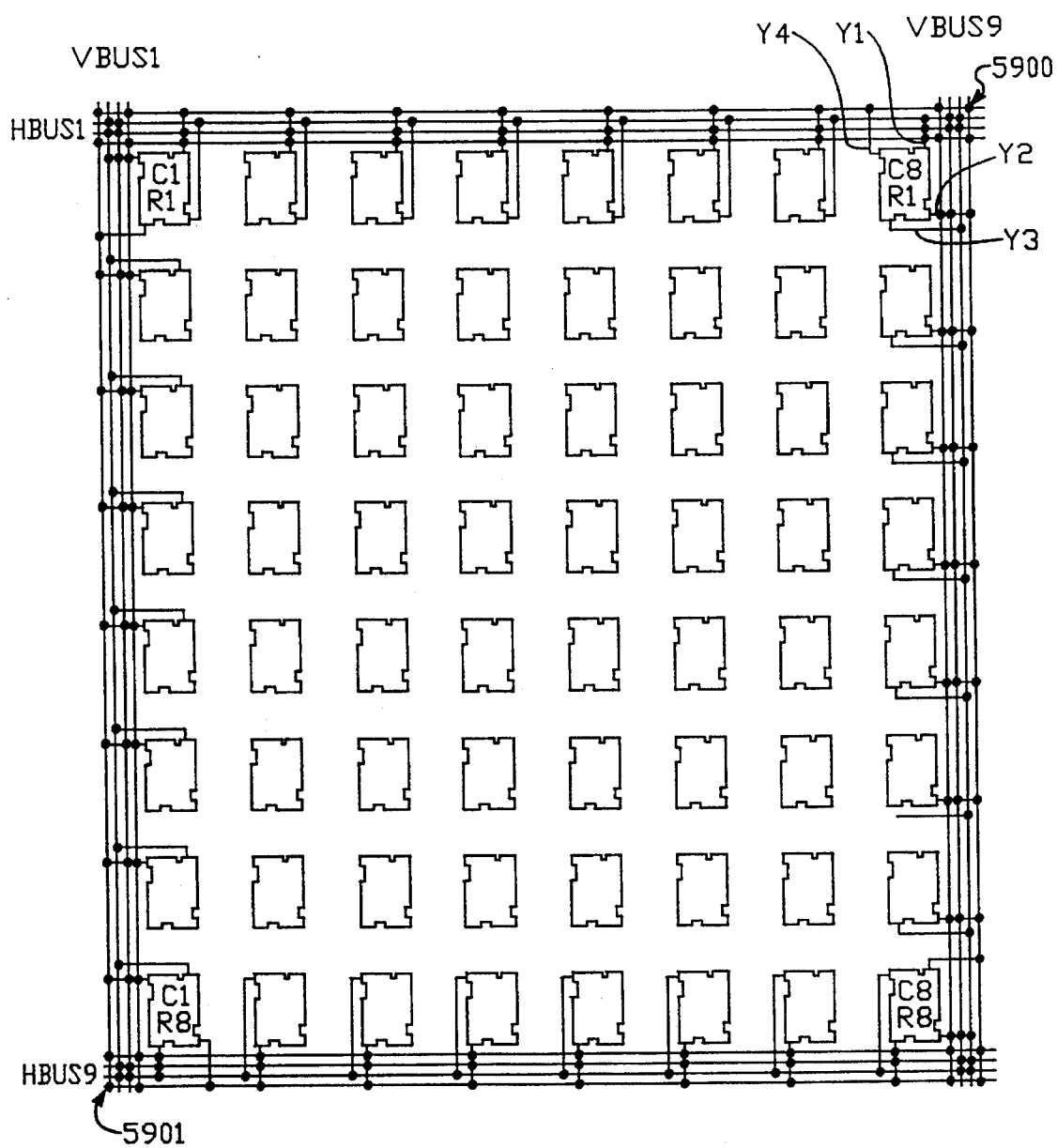

FIG. 59 illustrates the programmable connections to the outer long lines from the CLBs.

FIG. 60 illustrates the reach between input/output blocks and configurable logic blocks on long lines.

FIG. 61 illustrates the programmable connections between the input/output blocks on the top side of the configurable array and horizontal bus 1.

FIG. 62 illustrates the programmable connections between horizontal bus 9 and the input/output blocks on the bottom side of the configurable array.

FIG. 63 illustrates the programmable interconnects between the vertical bus 1 and the input/output blocks on the left side of the array.

FIG. 64 illustrates the programmable interconnects between vertical bus 9 and the input/output blocks on the right side of the array.

Figure 65:
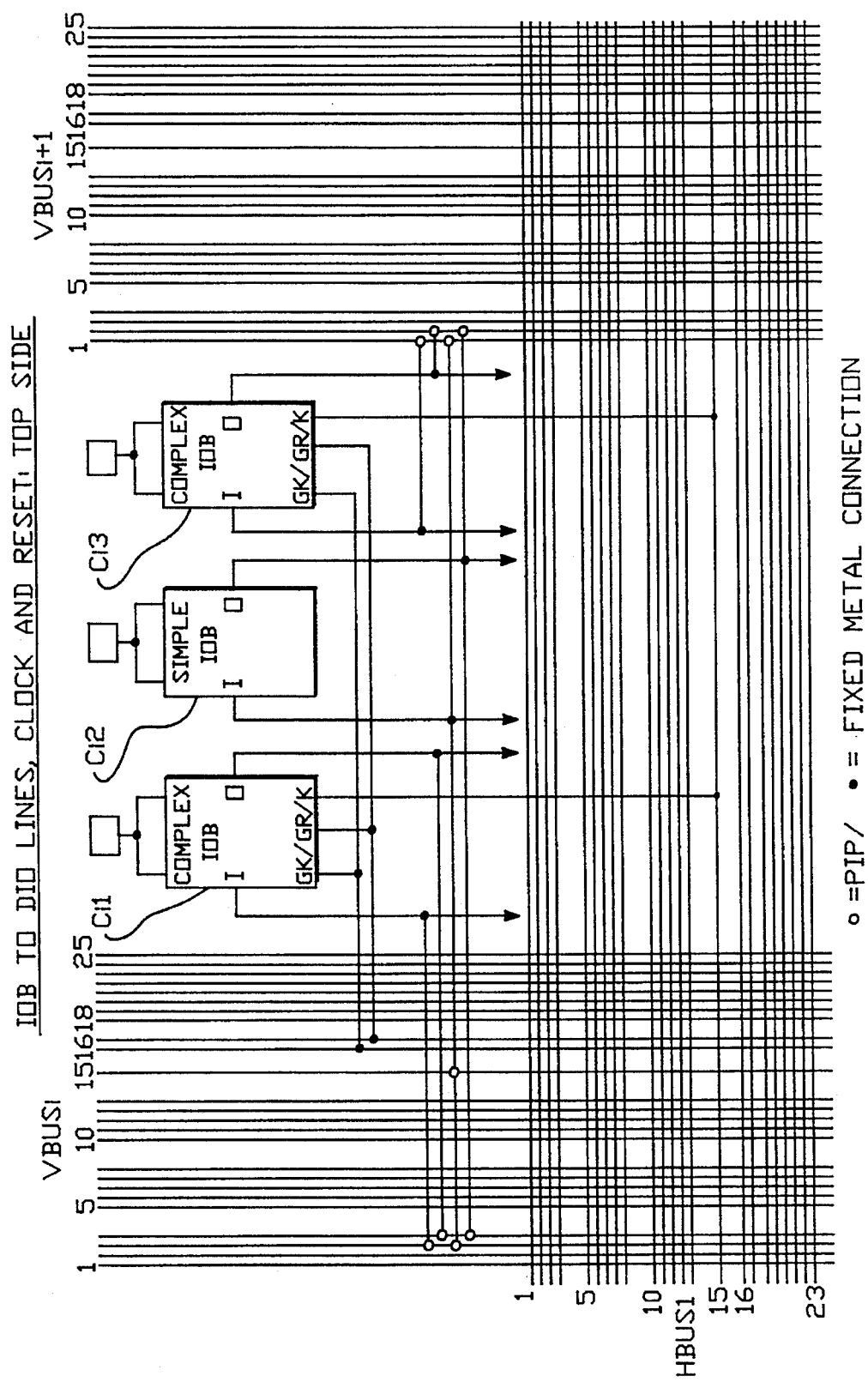

FIG. 65 illustrates the connection of the clock and reset signals to the complex logic blocks, as well as the programmable connections of the inputs and the outputs of the input/output blocks on the top side of the array to the vertical buses.

Figure 66:
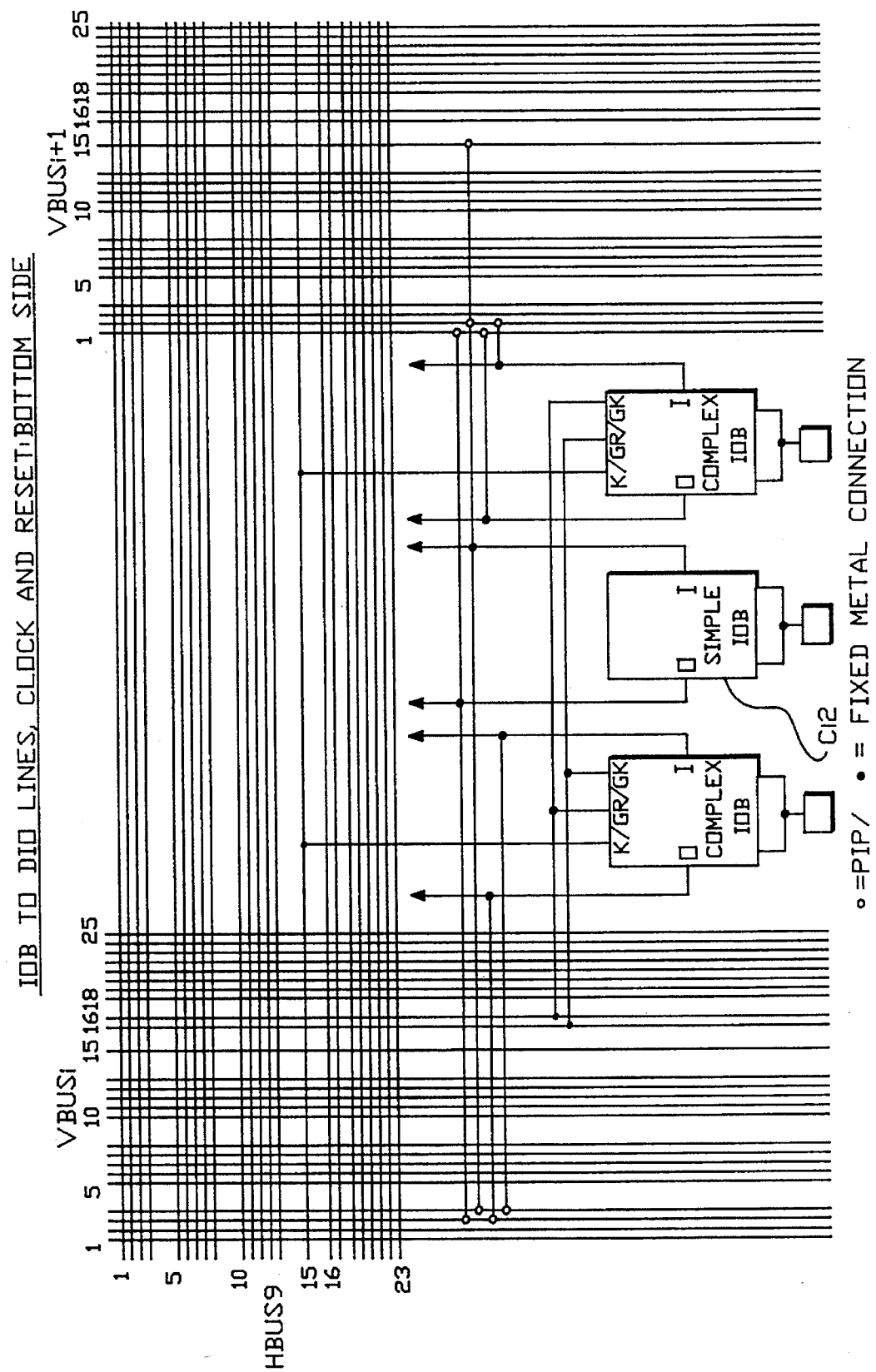

FIG. 66 illustrates the connection of the clock and reset signals to the input/output blocks on the bottom side of the array, and connection of these bottom side input/output blocks to the vertical buses.

Figure 67:
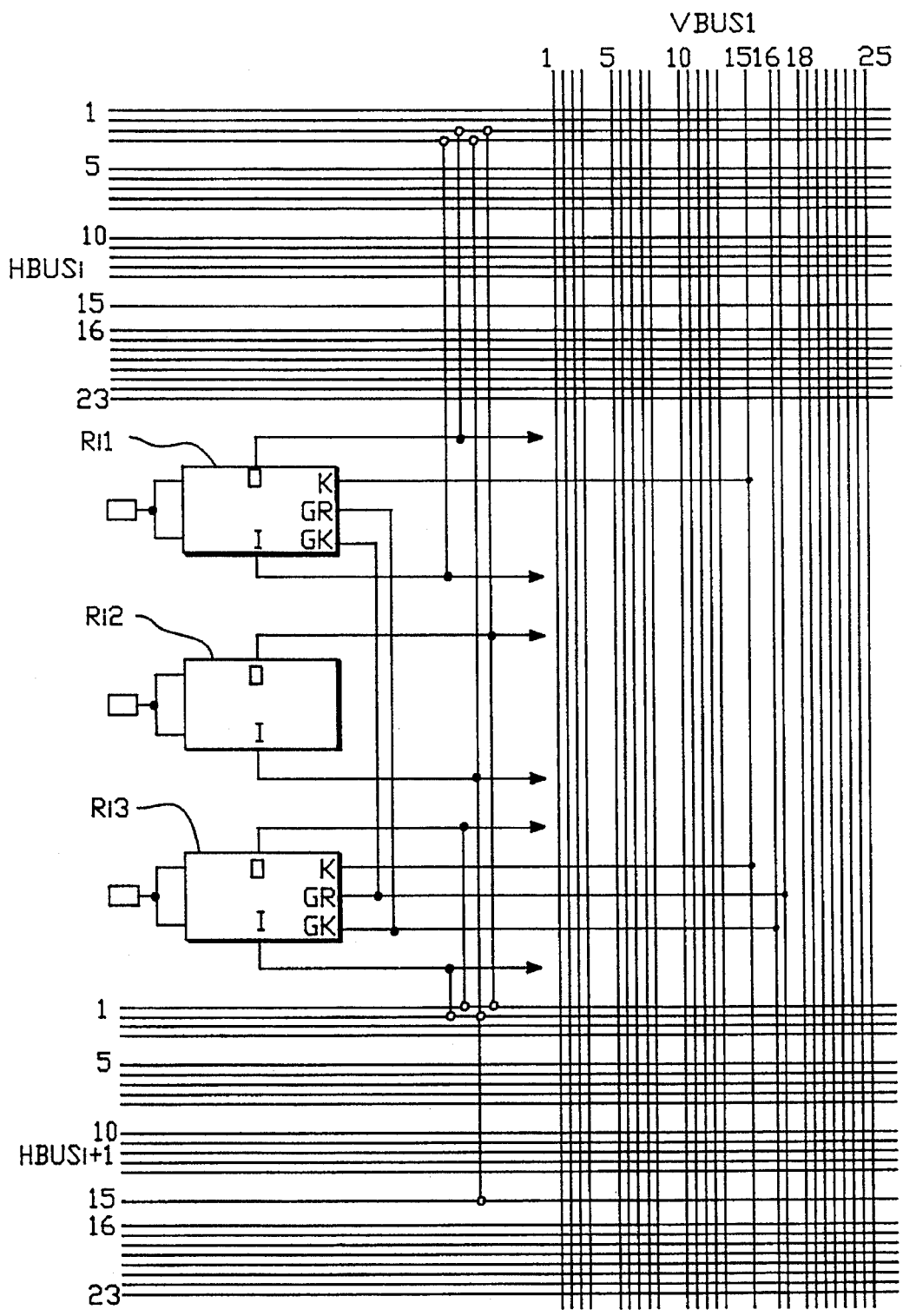

FIG. 67 illustrates the connection of the clock and reset signals to the input/output blocks on the left side, and connection of these left side input/output blocks to horizontal buses.

Figure 68:
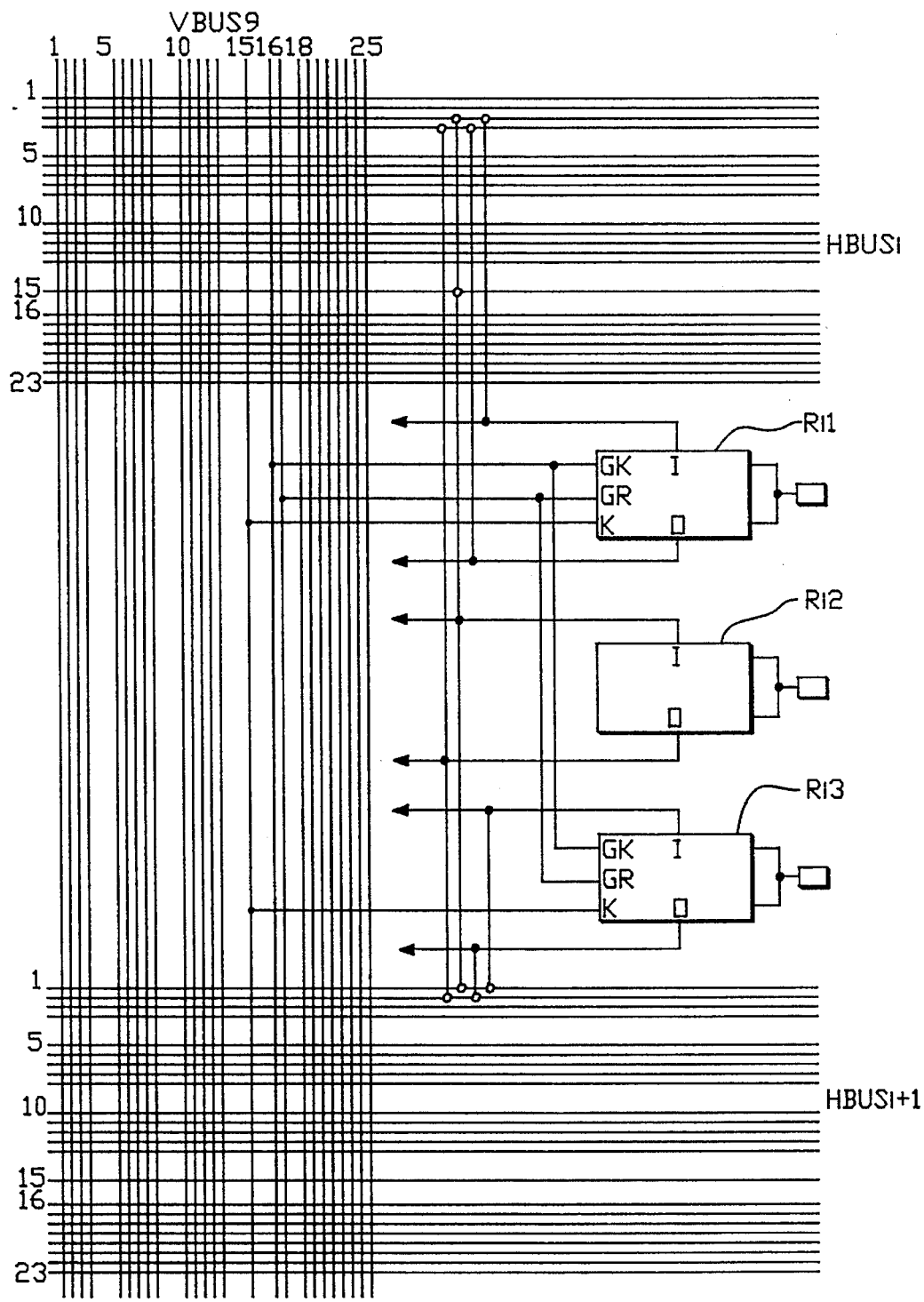

FIG. 68 illustrates the connection of the clock and the reset signals to the input/output blocks on the right side of the array, and connection of these right side input/output blocks to the horizontal buses.

Figure 69:
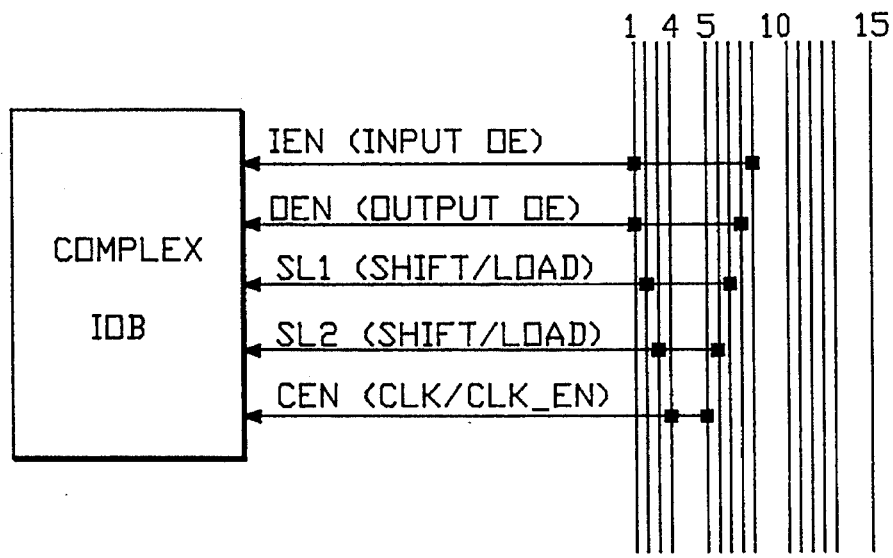

FIG. 69 illustrates the connection of the control signal inputs on the input/output blocks on the top and left side of the array to the adjacent interconnect buses.

Figure 70:
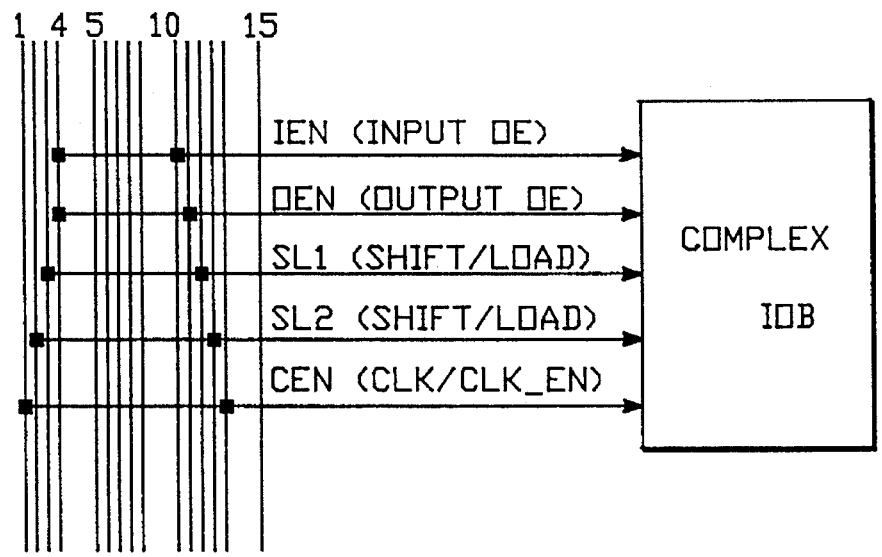

FIG. 70 illustrates the connection of the control signal inputs to the input/output blocks on the right and bottom side of the array to the adjacent interconnect buses.

DETAILED DESCRIPTION

With reference to the figures, a detailed description of a preferred embodiment of the present invention is provided.

Figure 1:
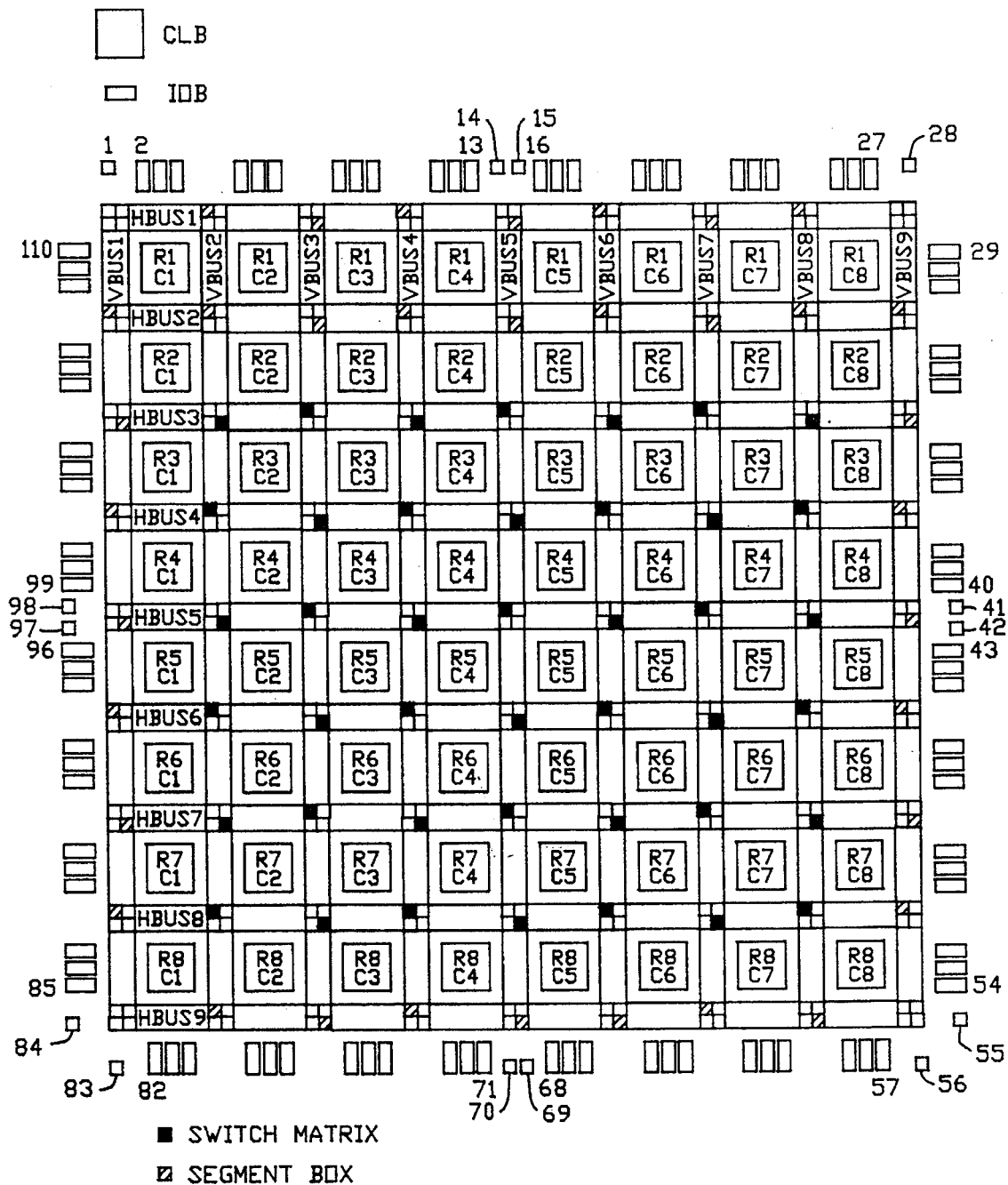
FIG. 1 is schematic diagram illustrating the layout of the programmable gate array according to the present invention.
Figure 2:
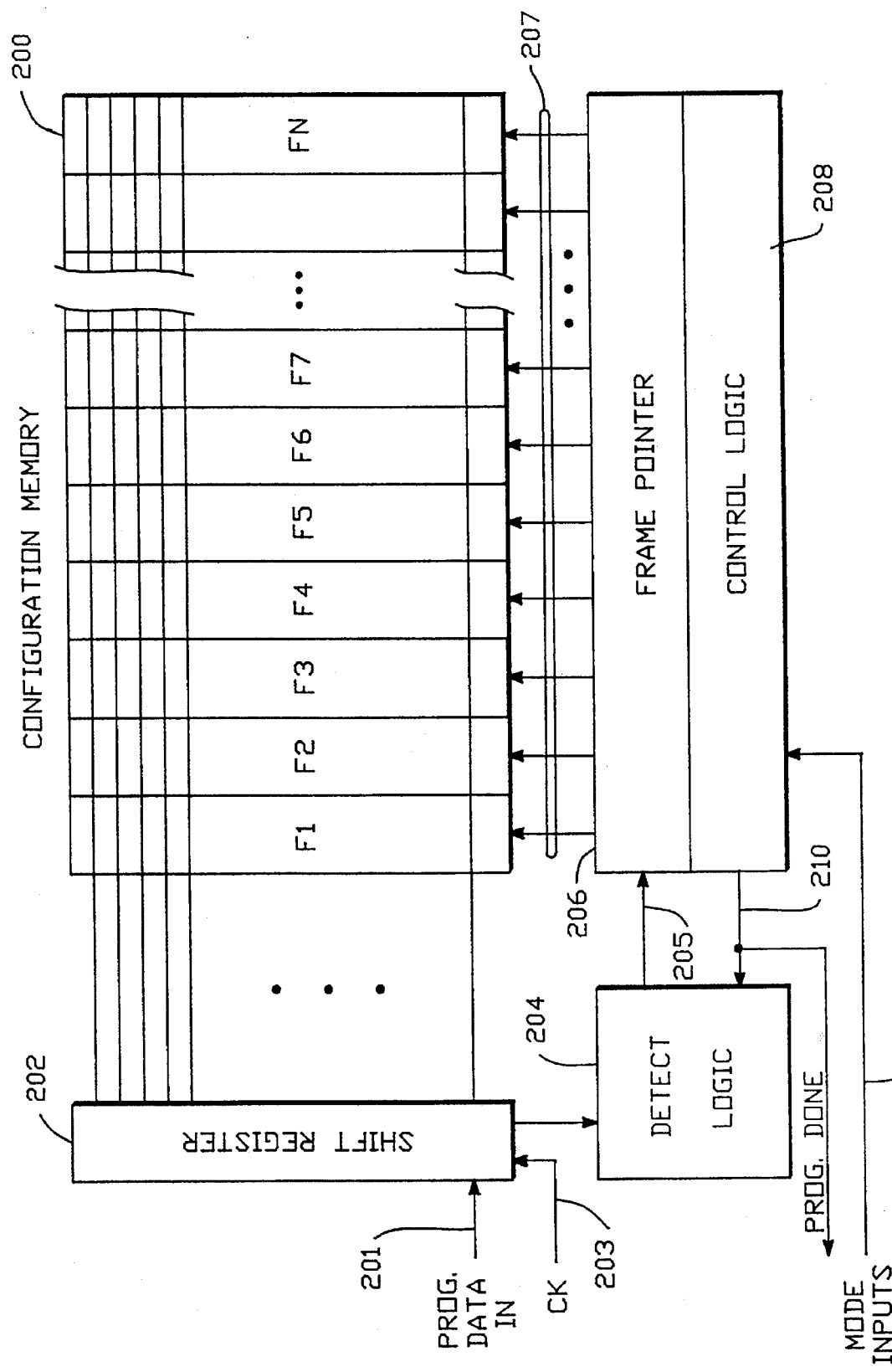
FIG. 2 is a schematic diagram of the configuration memory in the programmable gate array according to the present invention.
Figure 3:
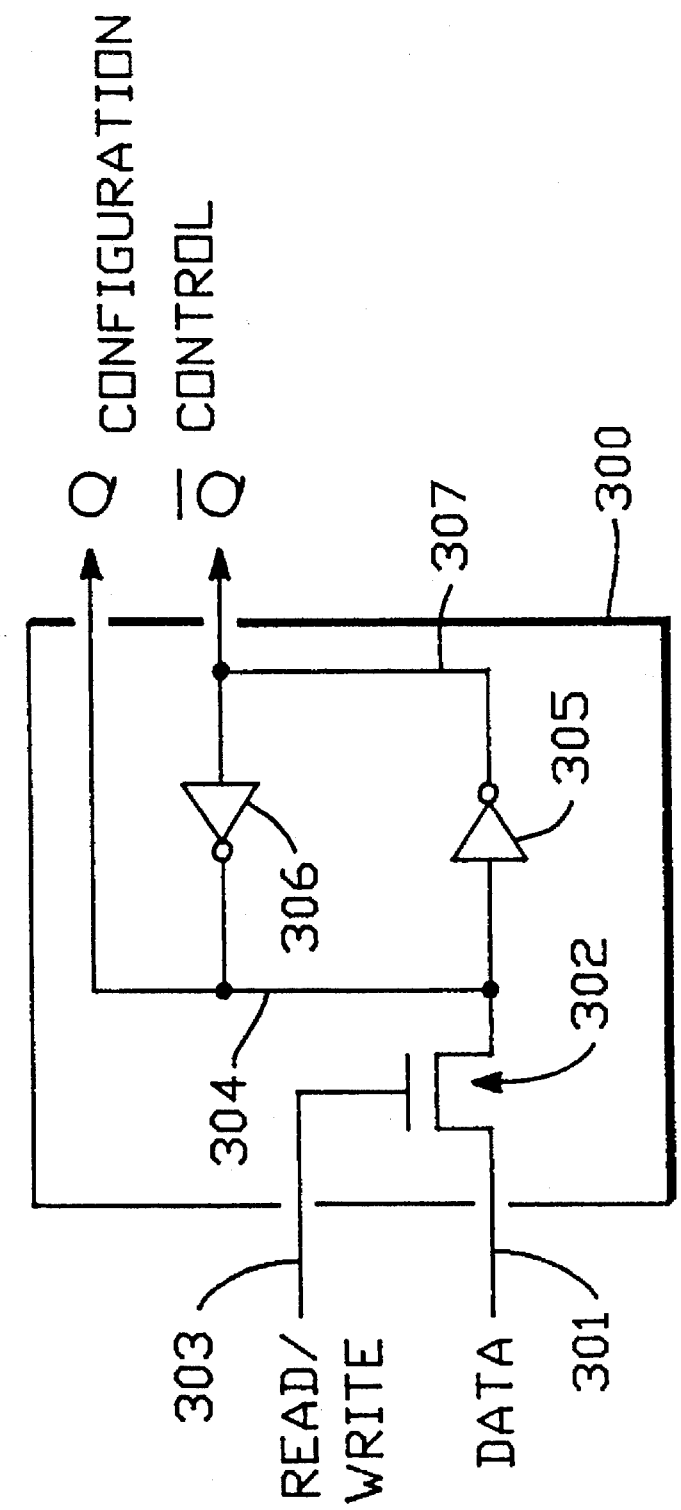
FIG. 3 is a diagram of the configuration memory storage cell.

First, with reference to FIGS. 1–3, the basic layout and programming structure of the programmable gate array is described. Next, a detailed description of the interconnect structure is set out with reference to FIGS. 4–24. Implementation of the configurable logic block utilized in the programmable gate array is described with reference to FIGS. 25–44. Implementation of the configurable logic blocks utilized in the programmable gate array are described with reference to FIGS. 45–49.

After description of the configurable logic blocks and the input/output cells, the direct connections among the input/output blocks and the configurable logic blocks are described with reference to FIGS. 50–55. This is followed by a description of the connections of the configurable logic blocks and input/output cells to the rest of the interconnect structure with reference to FIGS. 56–70.

I. Layout and Programming Structure

FIG. 1 illustrates the layout of the programmable gate array according to the present invention. Also provided in FIG. 1 is a notation which is utilized to describe the programmable gate array in this application. Accordingly, the programmable gate array shown in FIG. 1 consists of an array of configurable logic blocks illustrated by the square symbol with bold lines shown at the upper left hand corner of the figure. Each configurable logic block in the array is labeled with a row and column number, i.e. in the upper left hand corner of the array, the configurable logic blocks are labeled R1C1, R1C2, and so on until the lower right hand corner of the array where the configurable logic block is labeled R8C8.

Around the peripheral of the array are 110 pads for connection to external pins. Pads 2–13, 16–27, 29–40, 43–54, 57–68, 71–82, 85–96 and 99–110 are coupled to configurable input/output blocks represented by the symbol shown in the upper left hand corner of the figure. Pads 1, 14, 15, 28, 41, 42, 55, 56, 69, 70, 83, 84, 79 and 98 are utilized for functions other than configurable input/output blocks, such as power, ground, global clock and reset signal inputs, and programming mode control signals. The connection of these miscellaneous pads is similar to that done in prior art programmable gate array and is not further described here.

The interconnect structure consists of nine horizontal buses labeled HBUS1 through HBUS9 with nine intersecting vertical buses VBUS1 through VBUS9. The intersections of vertical bus 1 and vertical bus 9 with the horizontal buses 2—8 are characterized by having segment boxes which provide programmable interconnection between the respective horizontal bus and the vertical bus as described in detail below. Likewise, the intersections of horizontal bus 1 and horizontal bus 9 with vertical buses 2–8 are characterized by segment boxes providing the programmable interconnection between the horizontal and vertical buses.

The intersections of the vertical buses 2–8 with the horizontal buses 2–8 are characterized by switching matrices providing for interconnection between the respective horizontal and vertical buses. The placement of the segment boxes and switching matrices is schematically illustrated in FIG. 1 using the symbols illustrated in the lower left hand corner of the figure. The detailed structure of the switching matrices and segment boxes is described below.

The programmable gate array according to the present invention contains three types of configurable elements that are customized to a user system design which is specified in a configuration memory. The three configurable elements are the array of configurable logic blocks (CLBs), the configurable input/output blocks (IOBs) around the perimeter, and the programmable interconnect network.

The system design of a user is implemented in the programmable gate array by configuring programmable RAM cells known as a configuration memory. These RAM cells control the logic functionality performed by the CLBs, IOBs, and the interconnect. The loading of the configuration memory is implemented using a set of design software tools as well known in the art.

The perimeter of configurable IOBs provide a programmable interface between the internal logic array and device package pins. The array of CLBs perform user specified logic functions. The interconnection consists of direct connections between specific CLBs or IOBs, and a general connect that is programmed to form networks carrying logic signals among the blocks.

The logic functions performed by the CLBs are determined by programmed lookup tables in the configuration memory. Functional options are performed by program controlled multiplexers. Interconnecting networks between blocks are composed of metal segments joined by programmable interconnect points (PIPs).

The logic functions, functional options, and interconnect networks are activated by a program data which is loaded into an internal distributed array of configuration memory cells. The configuration bit stream is loaded in to the device at power up and can be reloaded on command.

FIG. 2 is a schematic diagram of the programmable gate array as seen by the program data. The programmable gate array includes a plurality of distributed memory cells referred to as the configuration memory 200. Program data on line 201 is loaded into shift register 202 in response to a clock signal on line 203. The detect logic 204 determines when the shift register is full by reading a preamble from data on 201. When the shift register is full, the detect logic 204 signals across lane 205 a frame pointer logic 206 which generates frame pointer signals across lines 207. Control logic 208 is responsive to the mode inputs to the device on line 209 to control the detect logic 204 across line 2 10 and the frame pointer during loading of the configuration memory 200.

The configuration memory 200 is organized into a plurality of frames F1–FN. As program data is loaded into the shift register, the frame pointer F1 is activated to load the first frame in the configuration memory. When the shift register is loaded with the second frame of data, the frame pointer for F2 is activated, loading the second frame F2, and so on until the entire configuration memory is loaded. Control logic 208 generates a program done signal on line 210.

The static memory cell used in the configuration memory is shown in FIG. 3. It has been specially designed for high reliability and noise immunity. A basic cell 300 consists of a data input line 301 coupled to pass transistor 302. The gate of the pass transistor 302 is coupled to a read or write control signal on line 303. The output of the pass transistor 302 is coupled no line 304. Line 304 is coupled to the input of inverter 305 and to the output of inverter 306. The output of inverter 305 is coupled to line 307 which is coupled back to the input of inverter 306. Lines 304 and 307 provide Q and $\overline{Q}$ outputs for configuration control. Thus, the basic cell 300 consists of two CMOS inverters and a pass transistor. The pass transistor is used for writing and reading cell data. The cell is only written during configuration and only read during read-back in the programming mode. During normal operation, the pass transistor is off and does not affect the stability of the cell. The memory cell outputs Q and $\overline{Q}$ use full ground and $V_{CC}$ levels and provide continuous direct control.

The configuration store can also be implemented with other types of volatile or non-volatile storage cells. For instance, non-volatile memory, like EPROM, E$^2$PROM, programmable resistive links, or Ferro RAM, could be used.

The device memory is configured as mentioned above by downloading a bit stream from a host system or an external memory, such as an EPROM. The configuration processes are the same as those used in prior art programmable gate array, with one exception which is discussed below with reference to the configurable logic blocks.

II. The Configurable Interconnect Structure

Horizontal and vertical buses of the interconnect structure and the interconnection of the horizontal and vertical buses are described with reference to FIGS. 4–24.

Figures 4, 5:
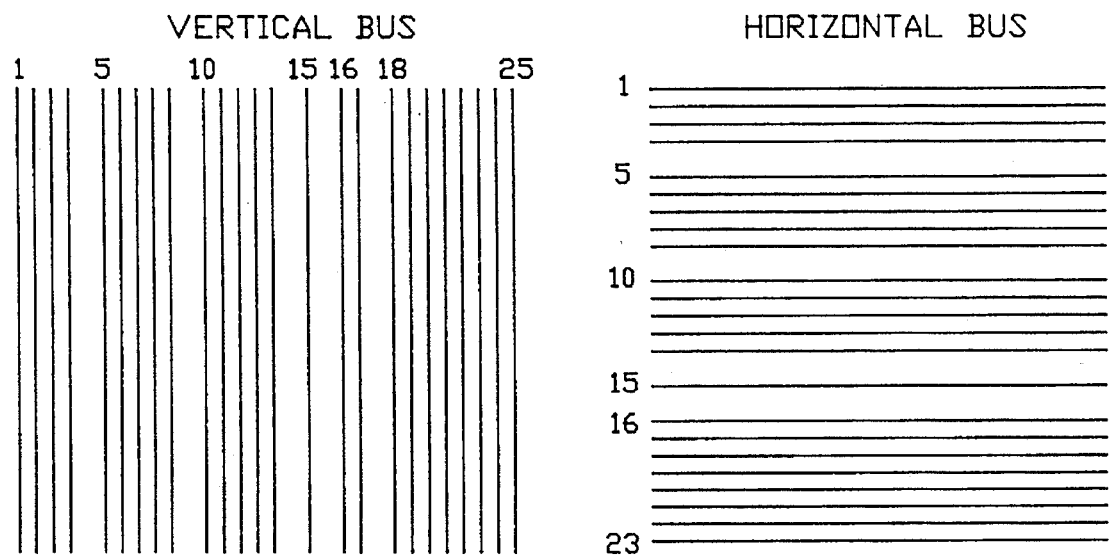
FIG. 4 illustrates a notation scheme for vertical buses in the programmable gate array.
FIG. 5 illustrates a notation scheme for the horizontal buses in the programmable gate array.

FIG. 4 illustrates the notation used for the vertical buses. Each vertical bus has 25 lines. Lines 1–4 and 15–17 are long lines which run across the entire array. Lines 5–14 consist of bidirectional general interconnect segments which are coupled through switching matrices and segment boxes as described below. Lines 18–25 are uncommitted long lines which run the entire length of the array.

FIG. 5 illustrates the notation used for the horizontal buses. Each horizontal bus is a 23 line bus in which lines 1–4 and 15 are long lines, lines 5–14 are bidirectional general interconnect segments, and lines 16–23 are uncommitted long lines. The distinctions between the long lines, the bidirectional general interconnect segments, and the uncommitted long lines are set out in detail below.

In order to construct networks through a device, the horizontal and vertical buses require means of interconnection. This occurs at the intersections of the horizontal buses and the vertical buses. The interconnections between the lines at the intersection are made through programmable interconnect points, switch matrices, and segment boxes.

Figure 6:
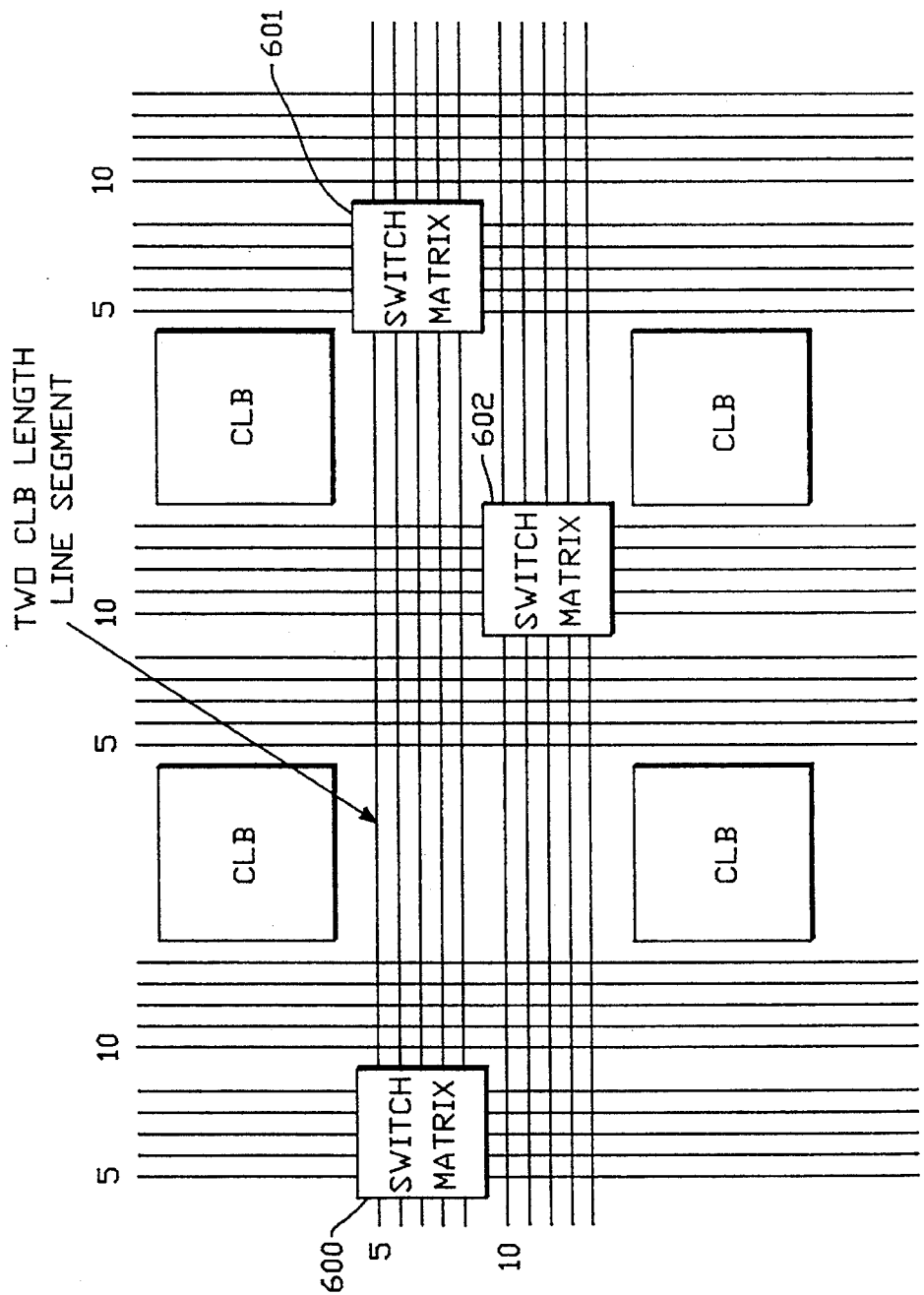
FIG. 6 illustrates the placement of the switch matrices in lines 5–14 of the horizontal and vertical buses in the programmable gate array.

FIG. 6 illustrates the placement of the switch matrices in the interconnect structure.

With reference to FIG. 1, it can be seen that the switch matrices are positioned at the intersections of vertical bus 2–8 with horizontal buses 2–8. FIG. 6 illustrates the placement of the switch matrices on horizontal bus 4 adjacent the configurable logic block R3C3, R3C4, R4C3, and R4C4. It can be seen that the switch matrices are positioned only on lines 5–14 of the bidirectional general interconnect structure. Thus, the bidirectional general interconnect structure consists of segments which are two configurable logic blocks in length, spanning, in this case, from switch matrix 600, located on vertical bus 3, to switch matrix 601, located on vertical bus 5 in lines 5–9 of a bidirectional general interconnect. Switch matrix 602 is coupled to segments of line 10–14 which extend from vertical bus 2 to vertical bus 4 and vertical bus 4 to vertical bus 6. Vertical buses 2 and 6 are not shown in FIG. 6.

Using the switch matrix placement as shown in FIG. 6 and in FIG. 1, it can be seen that a connection to a bidirectional general interconnect allows propagation of the signal across a width equal to two configurable logic blocks on the array without passing through a switch matrix. This allows networks with fewer delays due to switch matrices.

Figure 7:
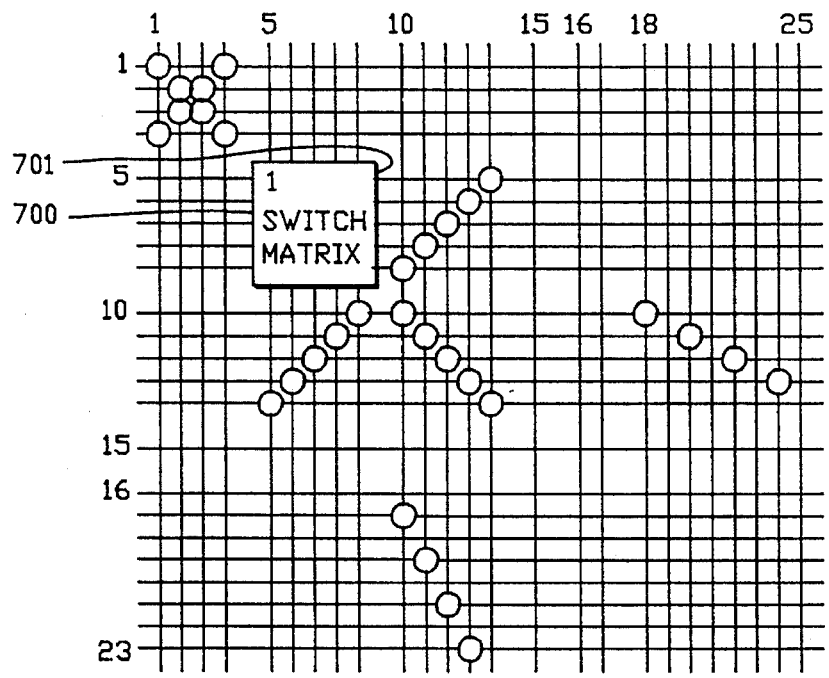
FIG. 7 illustrates the intersection of a vertical bus with a horizontal bus.
Figure 8:
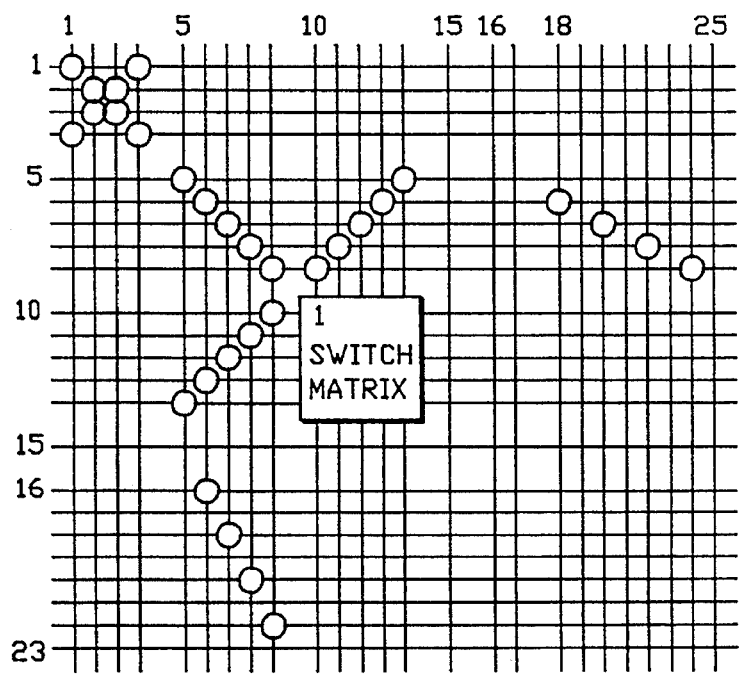
FIG. 8 illustrates an alternative intersection of a vertical bus with a horizontal.

FIGS. 7 and 8 illustrate the complete intersection between vertical buses 2–8 and horizontal buses 2–8, where a circle indicates a bidirectional programmable interconnect point controlled by a memory cell in the configuration memory.

FIG. 7 is the structure for the intersection of odd numbered vertical buses with odd numbered horizontal buses, and even numbered vertical buses with even numbered horizontal buses. FIG. 8 is the structure for the even-odd and odd-even intersections between vertical and horizontal buses.

It can be seen that in FIG. 7, horizontal line 1 is connectable to vertical lines 1 and 4. Horizontal line 2 is connectable to vertical lines 2 and 3. Horizontal line 3 is connectable to vertical lines 2 and 3. Horizontal line 4 is connectable to vertical lines 1 and 4.

Horizontal lines 5–9 are coupled to the left side 700 of a switch matrix. The right side 701 of the switch matrix provides line 5 which is connectable to vertical line 14. The horizontal line 6 output from the right side 701 of the switch matrix is connectable to vertical line 13. Horizontal line 7 from the switch matrix is coupled through a programmable interconnection point (PIP) to vertical line 12. Horizontal line 8 from the switch matrix side 701 is coupled through PIP to vertical line 11. Horizontal line 9 output from the right side 701 of the switch matrix is coupled through a PIP to vertical line 10.

The bidirectional general interconnect segments 10–14 of the horizontal bus are connectable through PIPs to the bidirectional general interconnect segments in the vertical bus lines 5–9 and 10–14 in the configuration shown. Lines 10–13 of the horizontal bus bidirectional segments are connectable to the odd numbered uncommitted long lines 19, 21, 23 and 25 through PIPs as shown.

The horizontal long line 15 passes through the intersection without being connectable to any other line.

The odd numbered uncommitted long lines 17, 19, 21, and 23 in the horizontal bus are connectable through PIPs to the vertical bidirectional interconnect segments 10–13 as shown.

The interconnection of the even or odd numbered vertical buses with odd or even numbered horizontal buses, respectively, is shown in FIG. 8. As with the intersection shown in FIG. 7, the horizontal lines in the intersection structure of FIG. 8 are connectable through PIPs and the switch matrix to the vertical lines.

Horizontal long line 1 is connectable to vertical lines 1 and 4. Horizontal long line 2 is connectable to vertical lines 2 and 3. Horizontal long line 3 is connectable to vertical long lines 2 and 3. Horizontal long line 4 is connectable to vertical long lines 1 and 4.

Horizontal bidirectional general interconnects 5–9 are connectable to the bidirectional general interconnects 5–14 as shown in the figure and to the even numbered uncommitted long lines 18, 20, 22, and 24. The bidirectional general interconnects 10–14 are connectable to the vertical bidirectional general interconnects 5–9 and through the switching matrix to the adjacent segments of lines 10–14 in both the vertical and the horizontal buses. The even numbered uncommitted long lines 16, 18, 20, and 22 on the horizontal bus are connectable to the vertical bidirectional segments 6–9 as shown.

Figure 9:
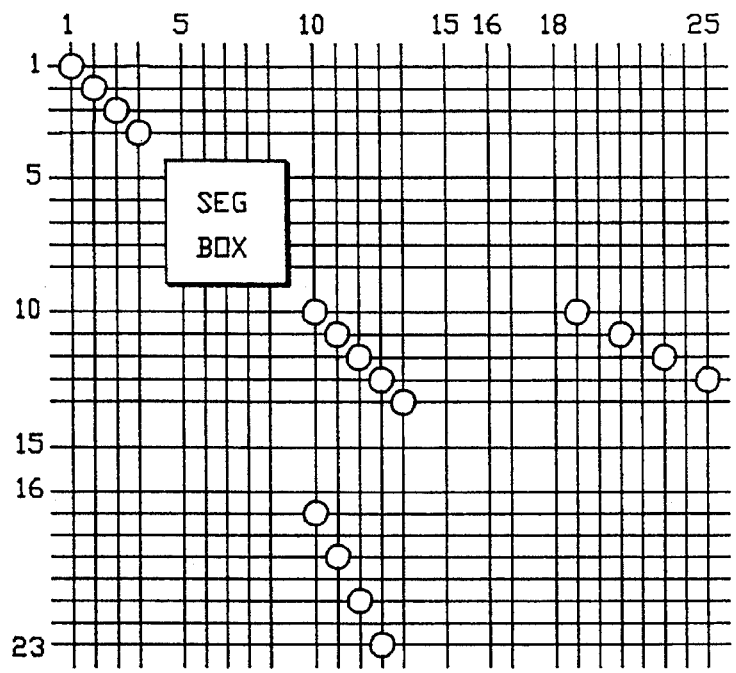
FIG. 9 illustrates the intersection of vertical buses 1 and 9 with even numbered horizontal buses and horizontal buses 1 and 9 with even numbered vertical buses.
Figure 10:
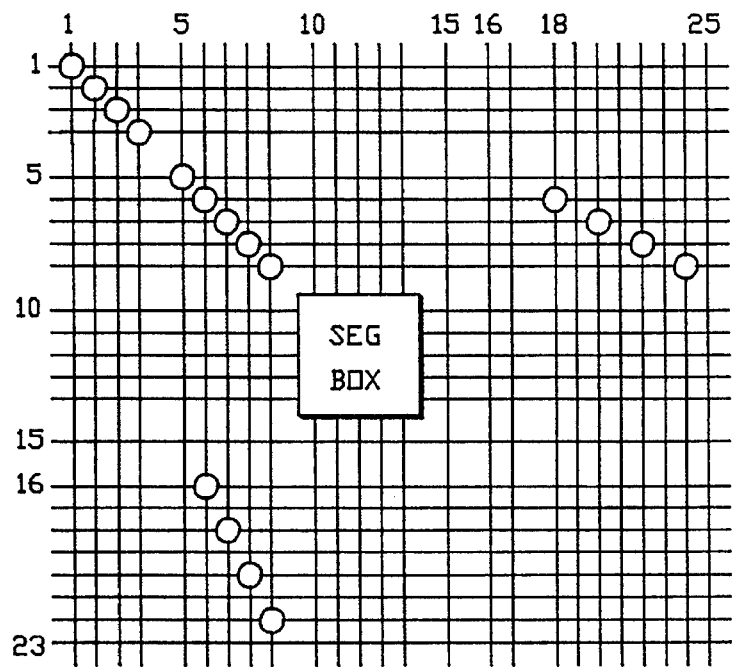
FIG. 10 illustrates the intersection of vertical buses 1 and 9 with the odd numbered horizontal buses and horizontal buses 1 and 9 with the odd numbered vertical buses.

FIG. 9 illustrates the intersection of horizontal buses 1 and 9 with the even numbered vertical buses 2–8 and vertical buses 1 and 9. FIG. 10 illustrates the intersection of the horizontal buses 1 and 9 with the odd numbered vertical buses 3–7.

Thus, the horizontal long lines 1–4 are connectable to vertical long lines 1–4 as shown. The bidirectional general interconnect lines 5–9 are connectable through the segment box to vertical interconnects 5–9. The bidirectional general interconnects 10–14 are connectable to vertical bidirectional general interconnects 10–14. Also, the bidirectional general interconnects 10–13 are connectable to the odd numbered uncommitted long lines 19, 21, 23, and 25.

The odd numbered uncommitted long lines 17, 19, 21, and 23 on the horizontal bus are connectable to the bidirectional general interconnect segments 10–13 as shown.

in the intersection shown in FIG. 10, long lines 1–4 on the horizontal bus are connectable respectively to vertical lines 1–4. The bidirectional general interconnect segments 5–9 are connectable to the vertical segments 5–9 and to the even numbered uncommitted long lines 18, 20, 22, and 24 as shown. The horizontal bidirectional general interconnect segments 10–14 are connected to the segment box in both the horizontal and vertical directions. The even numbered uncommitted long lines 16, 18, 20, and 22 on the horizontal bus are connectable to vertical bidirectional general interconnect segments 6–9 as shown.

Figure 11:
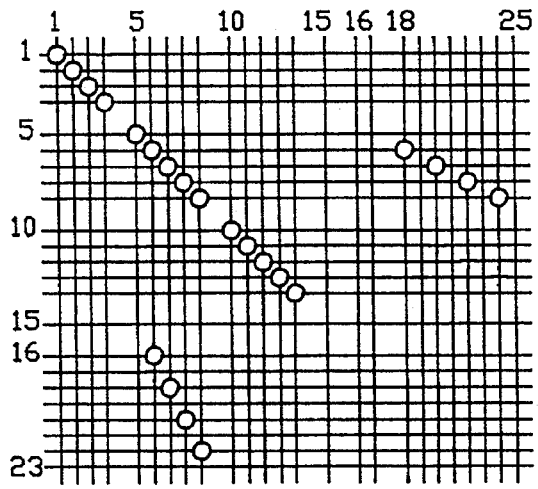
FIG. 11 illustrates the intersection of horizontal bus 1 with vertical bus 1 at the corner.

The corner intersections are shown in FIGS. 11–14. FIG. 11 illustrates the intersection of horizontal bus 1 with vertical bus 1. As shown, the lines 1–14 in the horizontal bus are connectable respectively to lines 1–14 in the vertical bus . The even numbered uncommitted long lines 18, 20, 22, and 24 on the vertical bus are connectable to horizontal bidirectional general interconnect segments 6–9. The even numbered uncommitted long lines 16, 18, 20, and 22 on the horizontal bus are connectable to the vertical lines 6–9.

Figure 12:
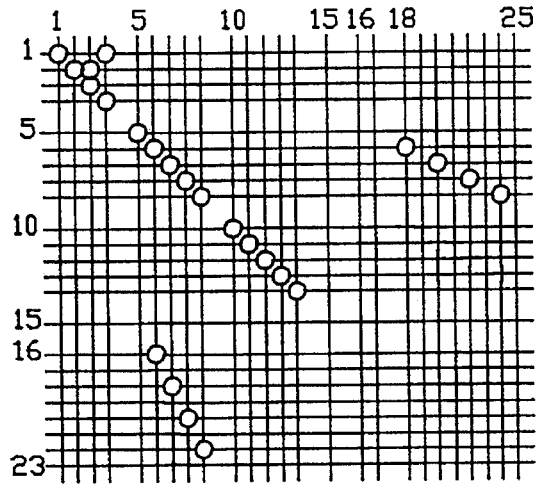
FIG. 12 illustrates the intersection of horizontal bus 1 with vertical bus 9 at the corner.

FIG. 12 illustrates the intersection of horizontal bus 1 with vertical bus 9. In this instance, the horizontal line 1 is connectable to vertical lines 1 and 4. Horizontal line 2 is connectable to vertical lines 2 and 3. Horizontal lines 3–14 are connectable respectively to vertical lines 3–14. The even numbered uncommitted long lines 18, 20, 22, and 24 on the vertical bus are connectable to horizontal lines 6–9. The even numbered uncommitted long lines 16, 18, 20, and 22 on the horizontal bus are connectable to the vertical lines 6–9.

Figure 13:
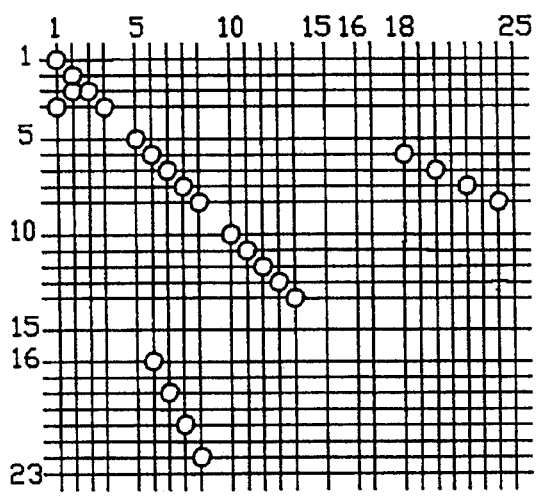
FIG. 13 illustrates the intersection of horizontal bus 9 with vertical bus 1 at the corner.

FIG. 13 illustrates the intersection of horizontal bus 9 with vertical bus 1. The horizontal lines 1–14 are connectable to the vertical lines 1–14, respectively. Also, horizontal line 3 is connectable to vertical line 2 and horizontal line 4 is connectable to vertical line 1. The horizontal lines 6–9 are also connectable to the even numbered uncommitted long lines 18, 20, 22 and 24 on the vertical bus. The even numbered uncommitted long lines 16, 18, 20 and 22 on the horizontal bus are connectable to vertical lines 6–9.

Figure 14:
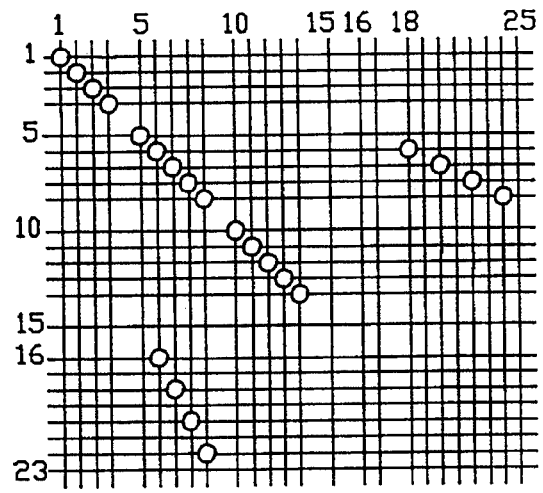
FIG. 14 illustrates the intersection of horizontal bus 9 with vertical bus 9 at the corner.

FIG. 14 illustrates the intersection of horizontal bus 9 with vertical bus 9. Horizontal lines 1–14 are connectable to vertical lines 1–14, respectively. Horizontal lines 6–9 are also connectable to the even numbered uncommitted long lines 18, 20, 22 and 24 on the vertical bus. The even numbered uncommitted long lines 16, 18, 20 and 22 on the horizontal bus are connectable to vertical lines 6–9.

FIG. 14A shows a corner connection that can be used at the intersections of horizontal bus 1 and vertical bus 1, horizontal bus 1 and vertical bus 9, horizontal bus 9 and vertical bus 9, and horizontal bus 9 and vertical bus 1. It has the advantage that it is a single layout that can be used at all four corners while accomplishing the ability to route signals from the long lines 1–4 completely around the perimeter of the chip. As can be seen, horizontal lines 1–14 are connectable to vertical lines 1–14, respectively. Horizontal line 1 is connectable to vertical line 4, horizontal line 2 is connectable to vertical line 3, horizontal line 3 is connectable to vertical line 2, and horizontal line 4 is connectable to vertical line 1. Also, horizontal line 14 is connectable to vertical line 5, horizontal line 13 is connectable to vertical line 6, horizontal line 12 is connectable to vertical line 7, horizontal line 11 is connectable to vertical line 8, horizontal line 10 is connectable to vertical line 9, horizontal line 9 is connectable to vertical line 10, horizontal line 8 is connectable to vertical line 11, horizontal line 7 is connectable to vertical line 12, horizontal line 6 is connectable to vertical 13, and horizontal line 5 is connectable to vertical line 14. Also, horizontal lines 6–9 are connectable to the even numbered, uncommitted long lines 18, 20, 22, and 24 on the vertical bus. The even numbered long lines 16, 18, 20, 22 on the horizontal bus are connectable to vertical lines 6–9.

Lines 15 on the horizontal and vertical buses and 16 and 17 on the vertical buses are not connectable at any of the intersections described above. Rather, they are designed to be used for local clock/clock enable, global clock, and global reset signals and have special connection structures shown in FIGS. 15 and 16. FIG. 15 illustrates the connection of the global clock and global reset signals on vertical lines 16 and 17. The global clock signal is supplied from an input buffer 1500 to line 1501. Line 1501 is directly connected to line 16 in all vertical buses. Similarly, the global reset signal is supplied at global reset buffer 1502. The output of the global reset buffer is supplied on line 1503 to line 17 on all the vertical buses. The lines 16 and 17 of the vertical buses are directly connected to the input/output blocks as schematically illustrated in FIG. 15 and to each of the configurable logic blocks. The direct connections to the configurable logic blocks are shown only to a few of the blocks in the upper left hand corner of the array for clarity of the figure.

FIG. 15A shows the connection of lines 16 and 17 of the vertical buses to the configurable logic blocks. The lines 16 and 17 of vertical bus-n are coupled to the global clock GK and global reset GR inputs of configurable logic block in column n, for n=1–8. In vertical bus 9, lines 16 and 17 are connected only to the input/output blocks as shown.

FIG. 15B shows the configurable path from an input/output pad to an IOB or to the global or alternate buffers. It can be seen that the pad 1510 is connected across line 1511 through buffer 1512 to line 1513. Line 1513 is passed through pass transistor 1514 to an IOB input path 1515 or through pass transistor 1516 to the buffer input circuitry on line 1517. A memory cell 1518 in the configuration store controls which pass transistor (1514 or 1516) is enabled.

FIG. 15C illustrates the input circuitry to the global clock buffer. Input I of IOB 2 and 9 are connected to provide a signal on lines 1518 and 1519 as inputs to 8 to 1 multiplexer 1521. A clock input pin at IOB 110 is connected to line 1520 as illustrated in FIG. 15B as input to multiplexer 1521. Lines 14 and 15 in vertical bus 1 and lines 14 and 15 in horizontal bus 1 are also coupled as inputs to configurable multiplexer 1521.

The direct connect output X4 on the configurable logic block in row 1, column 1 is directly connected as well as an input to the multiplexer 1521. The direct link from an adjacent CLB to the multiplexer 1521 across line 1524 provides added flexibility for the generation of the global clock on chip.

The configuration store controls the multiplexer 1521 to supply a clock signal on line 1522 to the global clock buffer 1523.

FIG. 16 illustrates the connection of line 15 in the vertical and horizontal buses. It is designed to perform the function of a local clock for an input/output block or a configurable logic block or as a clock enable signal. The line 15 in horizontal buses is connectable to a variety of sources including outputs from configurable logic blocks and the alternate buffers. The line 15 in the horizontal buses are connectable to the horizontal alternate buffer 1600 which generates the signal on line 1601. Associated with each horizontal bus is a bidirectional buffer, such as buffer 1602. Each bidirectional buffer includes a configurable tristate buffer connected from line 1601 to line 15 in the respective horizontal bus. Also, a configurable tristate buffer connected from line 15 on the respective horizontal bus supplies an output to line 1601. The configurable tristate buffers are each controlled by a memory cell in the configuration memory.

Likewise, the vertical alternate buffer 1603 generates a signal on line 1604. Line 15 on each vertical buffer is connected to a bidirectional buffer, e.g. buffer 1605. Each bidirectional buffer has a first tristate buffer connected from line 1604 to line 15 in the respective vertical bus and a tristate buffer connected from line 15 in the respective vertical bus to line 1605. Each of the tristate buffers is controllable from a storage cell in the configuration memory. The line 15's in vertical buses 1 and 9 are connected respectively to the input/output blocks on the left side and right side of the chip. Likewise, the line 15's in horizontal buses 1 and 9 are connected to the input/output blocks on the top and bottom of the chip as shown.

FIG. 16A shows the connection of the input/output blocks to line 15 and the connection of the configurable logic blocks to line 15. Each complex IOB 1606 has a K input directly connected to line 15 on its adjacent vertical or horizontal bus. Each simple IOB 1607 is capable of supplying an input signal to line 15 of a horizontal and vertical bus through a PIP.

Each configurable logic block as shown in FIG. 16A has inputs labeled K1, K2, K3 and K4. The input K1 is connected to line 15 in the horizontal bus above the block. Input K2 is directly connected to line 15 in the vertical bus to the right of the block. Input K3 is directly connected to line 15 in the horizontal bus below the block. Input K4 is directly connected to the vertical bus to the left of the block. Likewise, each configurable logic block has output Y1, Y2, Y3 and Y4. The output Y1 is connectable through a PIP to line 15 n the horizontal bus above the block. Output Y2 connectable through a PIP to line 15 in the vertical bus to the right of the block. Output Y3 is connectable through a PIP to line 15 in the horizontal bus below the block. Output Y4 is connectable through a PIP to line 15 in the vertical bus to the left of the block.

The line 1604 connected to the vertical alternate buffer and the line 1601 connected to the horizontal alternate buffer can receive inputs from a number of sources including device pins, and interconnects via PIPs. The signal on line 1601 can be supplied to all configurable logic blocks and input/output blocks adjacent the horizontal buses with the exception of input/output blocks on the left side and right side of the chip. Likewise, the signal on line 1604 can be globally supplied across the chip, with the exception that it cannot be directly connected to the input/output blocks on the top and bottom of the chip.

Therefore, a signal can be generated in configurable logic block R1C1, supplied to line 15 of vertical bus 2 through the bidirectional buffer 1608 to line 1604. From line 1604, it can be supplied anywhere in the chip. A similar net can be formed along horizontal buses.

This line 15 structure allows the registers in any configurable logic block to receive a clock from one of five sources. The sources include the global clock GK supplied on vertical bus line 16, and the local clocks K1, K2, K3, and K4 which are connected to line 15 on four adjacent interconnect buses.

Likewise, the registers in a complex input/output block can receive a clock from two sources. The first source is line 16 in the adjacent vertical bus at its GK input and from an input K on the configurable I/O block connectable through a PIP to line 15 on either a horizontal or vertical bus depending on the location of the input/output block.

Each line 15 in either a horizontal or a vertical bus can carry a signal obtained from one of four sources. The four sources include an alternate buffer, an adjacent configurable Logic block, an adjacent input/output block, and a configurable logic block which has supplied a signal to line 15 of a different bus which has in turn been connected through the bidirectional buffers to levels 1601 or 1604.

If an alternate buffer is used to supply a signal to the array, the long lines connecting to that buffer can either be independent where the bidirectional buffers are configured to supply a high impedance state to the long line, or they can use the alternate buffer as a source.

FIG. 16B illustrates the input structure to the vertical alternate buffer 1603. The input to the vertical alternate buffer 1603 is provided on line 1610 at the output of the configurable multiplexer 1611. Also, the signal on line 16 10 is connected for supply as output signals at IOB 1612 and at IOB 1613. Inputs to the multiplexer 16 11 include an oscillator signal OSC as generated by the circuitry illustrated in FIGS. 16D and 16E. Also, an input signal from IOB 1612 is an alternative input to multiplexer 1611 across line 1614. A vertical clock input signal is supplied on line 1615 as input to multiplexer 1611 from IOB 1616 configured as shown in FIG. 15B.

Long lines 5 and 15 of the vertical bus 9 and long lines 5 and 15 of the horizontal bus 9 are also connected as inputs to multiplexer 1611. The final input to multiplexer 1611 is a direct link from output X2 of the configurable logic block in row 8, column 8, across line 1617.

The vertical alternate buffer 1603 also includes a memory cell 1618 for tristate control.

FIG. 16C illustrates the input structure for the horizontal alternate buffer 1600. The horizontal alternate buffer is tristatable in response to the signal at memory cell 1620. The input to horizontal alternate buffer 1600 is supplied on line 1621 at the output of the configurable multiplexer 1622. Inputs to the configurable multiplexer 1622 include the horizontal clock input signal on line 1623, and input signals on lines 1624 and 1625 from input/output structures 1626 and 1627, respectively. The vertical bus lines 5 and 15 and horizontal bus lines 5 and 15 are connectable as inputs as well to the multiplexer 1622. Finally, a direct link from the configurable logic block in row 8, column 1, output X4 is coupled across line 1628 as an input to multiplexer 1622.

The on chip oscillator which supplies the OSC signal as one input to the multiplexer 1611 driving the vertical alternate buffer 1603 is shown in FIG. 16D. The OSC signal is provided at the output of multiplexer 1630 which is controlled by memory cell 1631. Inputs to multiplexer 1630 include the signal on line 1632 which is supplied at the output of inverting buffer 1633. The input to inverting buffer 1633 is the signal on line 1634 which is supplied at the output of the oscillator amplifier 1635. The input to the oscillator amplifier 1635 is supplied at IOB 1636. IOB 1637 is coupled directly to line 1634. Line 1634 is supplied through inverting buffer 1638 as a clock input on line 1639 to register 1640. Register 1640 is connected as a divide-by-two circuit by coupling line coupled from its Q output through inverting buffer 1642 as the D input to register 1640. The Q output of register 1640 is supplied on line 1643 as a second input to multiplexer 1630.

The external connections for the oscillator are shown in FIG. 16E. Pad 1637 is coupled to line 1650 and pad 1636 is coupled to line 1651. Resistor R1 is connected between line 1650 and 1651. Line 1651 is coupled through capacitor C1 to GROUND and through crystal 1652 to line 1653. Line 1653 is coupled through capacitor C2 to GROUND and through resistor R2 to line 1650.

The divide-by-two option in the oscillator circuit is provided to ensure symmetry of the signal. The output of the 2:1 multiplexer 1630 gives this choice, and is set during device configuration. When the oscillator/inverter is not used, the paths 1637 and 1636 are configurable as shown in FIG. 15B to behave as standard IOBs.

The oscillator circuit becomes active before configuration is complete to allow it to stabilize.

The structure of the programmable interconnect points (PIPs) is shown in FIG. 17 and an alternative structure is shown in FIG. 18. The structure in FIG. 17 illustrates that for an intersecting conductive segment, such as long lines 1700 and 1701, with long line 1702, a PIP is implemented using a pass transistor. Thus, pass transistor 1703 provides for interconnection between lines 1702 and 1701. Pass transistor 1704 provides for interconnection between lines 1700 and 1702. The memory cell 1705 from the configuration store controls the pass transistor 1703 to provide a bidirectional path between the lines. Likewise, memory cell 1706 controls pass transistor 1704 to provide the bidirectional path. These interconnection points are illustrated throughout this document using the circular symbol 1707 as shown in the figure. Thus, the symbolic representation of the circuit on the left side of FIG. 17 is shown on the right side of FIG. 17.

The PIP implementation of FIG. 17 is advantageous in that it provides for bidirectional connection on the lines which allows for great flexibility. However, this structure is memory intensive. Therefore, an alternative implementation, as shown in FIG. 18, can be used to save memory in a given implementation. The implementation of FIG. 18 illustrates that a PIP can be implemented as a multi-source multiplexer 1800. Multiplexer 1800 can have three sources, source 1, source 2, and source 3, and select a destination line 1801 in response to memory cells 1802 in the configuration store. Using the multiplexer implementation, two memory cells can provide for selection from among three or four sources. The equivalent symbol for the circuit using multiplexer 1800 is shown at 1803. It should be recognized that the multiplexer implementation is a unidirectional interconnect which allows for connection from any one of the source lines to the destination line and not vice versa. Furthermore, only one source line can be activated for a given operation.

Figure 19:
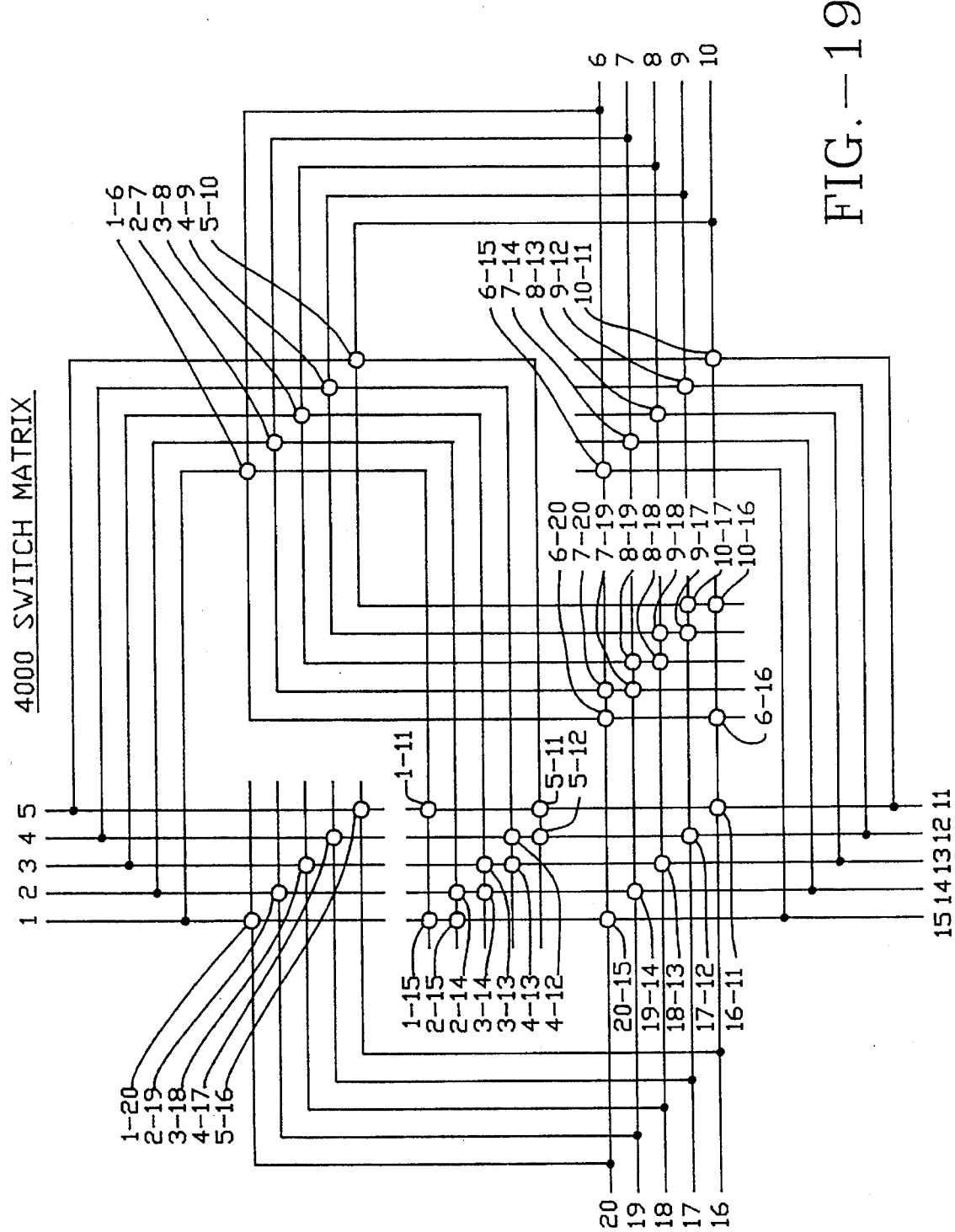
FIG. 19 illustrates the interconnect structure of the switch matrix.

FIG. 19 illustrates the implementation of the switch matrix according to the present invention. Each switch matrix has five connections on the top labeled 1–5, five connections on the right side labeled 6–10, five connections on the bottom labeled 11–15, and five connections on the left side labeled 16–20.

Line 1 is connectable through PIP 1–20 to line 20, through PIP 1–6 to line 6, through PIP 1–11 to line 11, and through PIP 1–15 to line 15.

Line 2 is connectable through PIP 2–19 to line 19, PIP 2–7 to line 7, PIP 2–14 to line 14, and PIP 2–15 to line 15.

Line 3 is connectable through PIP 3–18 to line 18, PIP 3–8 to line 8, PIP 3–13 to line 13, and PIP 1–14 to line 14.

Line 4 is connectable through PIP 4–17 to line 17, PIP 4–9 to line 9, PIP 4–12 to line 12, and PIP 4–13 to line 13.

Line 5 is connectable through 5–16 to line 16, PIP 5–10 to line 10, PIP 5–11 to line 11, and PIP 5–12 to line 12.

Other than the bidirectional connections to lines 1–5 which have already been set out, the connections of lines 6–10 include the following.

Line 6 is connectable through PIP 6–15 to line 15, PIP 6–16 to line 16, and through PIP 6–20 to line 20.

Line 7 is connectable through PIP 7–14 to line 14, and through PIP 7–19 to line 19, and PIP 7–20 to line Line 8 is connectable through PIP 8–13 to line 13, PIP 8–18 to line 18, and PIP 8–19 to line 19.

Line 9 is connectable through PIP 9–12 to line 12, PIP 9–17 to line 17, and PIP 9–18 to line 18.

Line 10 is connectable through PIP 10–11 to line 11, PIP 10–16 to line 16, and PIP 10–17 to line 17.

The other bidirectional connections not already cited include the connection of line 20 through PIP 20–15 to line 15, the connection of line 19 through PIP 19–14 to line 14, the connection of line 18 through PIP 18–13 to line 13, the connection of line 17 through PIP 17–12 to line 12, and the connection of line 16 through PIP 16–11 to line 11.

Figure 20:
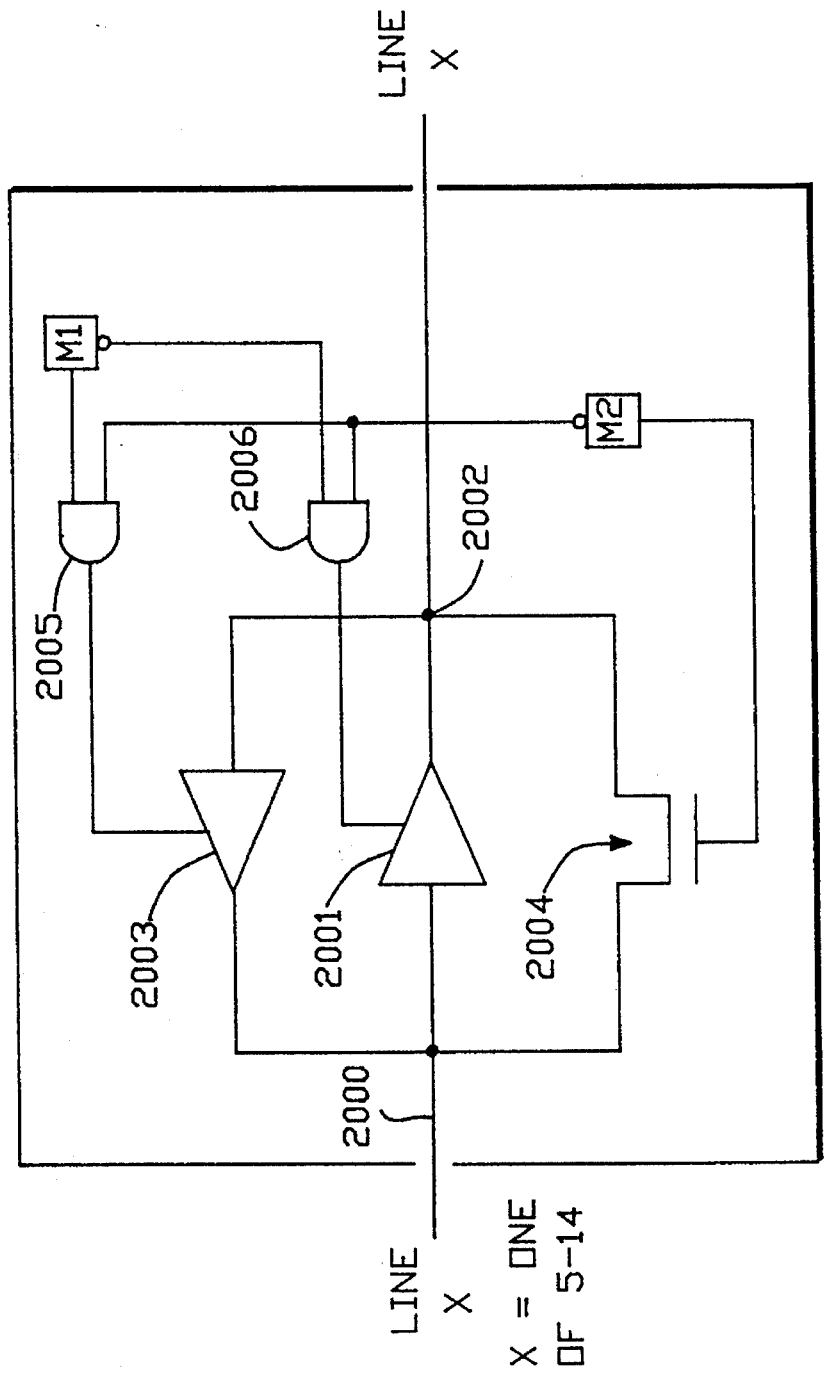
FIG. 20 illustrates the repowering buffer used in the programmable interconnect.

FIG. 20 illustrates the repowering buffer which is used with a horizontal segment and a vertical segment for each switching matrix. Repowering buffers are used for reshaping a signal after it has passed through a number of PIPs. Each repowering buffer adds delay to the net being routed. Thus, for short nets, the designer would want to avoid using the repowering buffers.

The repowering buffer as shown in FIG. 20 is connected on one of the bidirectional general interconnect segments designated line X in the figure, where X is one of lines 5–14 in a horizontal or vertical bus. Line X enters the left side of the repowering buffer at point 2000. Point 2000 is supplied as input to a first tristate buffer 2001. The output of the tristate buffer 2001 is connected to point 2002 which is supplied at the output of the repowering buffer back to line X. Point 2002 is also supplied at the input of a tristate buffer 2003. The output of the tristate buffer 2003 is connected at point 2000 for supply of the signal in the right to left direction. A third path, through pass transistor 2004, is supplied between points 2000 and 2002. The first memory cell M1 and a second memory cell M2 control the operation of the repowering buffer. The true output of memory cell M1 is supplied to AND-gate 2005. The complement output of memory cell M2 is supplied as a second input to AND-gate 2005. The output of AND-gate 2005 is the tristate enable input to buffer 2003. Likewise, the inverted output of memory cell M1 is supplied at a first input to AND-gate 2006. The second input to AND-gate 2006 is the inverted output of memory cell 2002. The output of AND-gate 2006 is the tristate control signal for buffer 2001. The true output of memory cell M2 is supplied to control the pass transistor 2004.

Thus, it can be seen that the repowering buffer shown in FIG. 20 supplies for repowering of a signal propagating in either direction along line X. Likewise, when line X is used for a multi-source net in which signals could be propagating in either direction, the pass transistor 2004 allows for bypassing of the repowering buffer.

The line location of the repowering buffer for a given switching matrix or segment box should be determined as meets the needs of a particular application.

The repowering buffer should be utilized for current CMOS technology for any network path passing through around four or more PIPs, and not going through a CLB or IOB.

Figure 21:
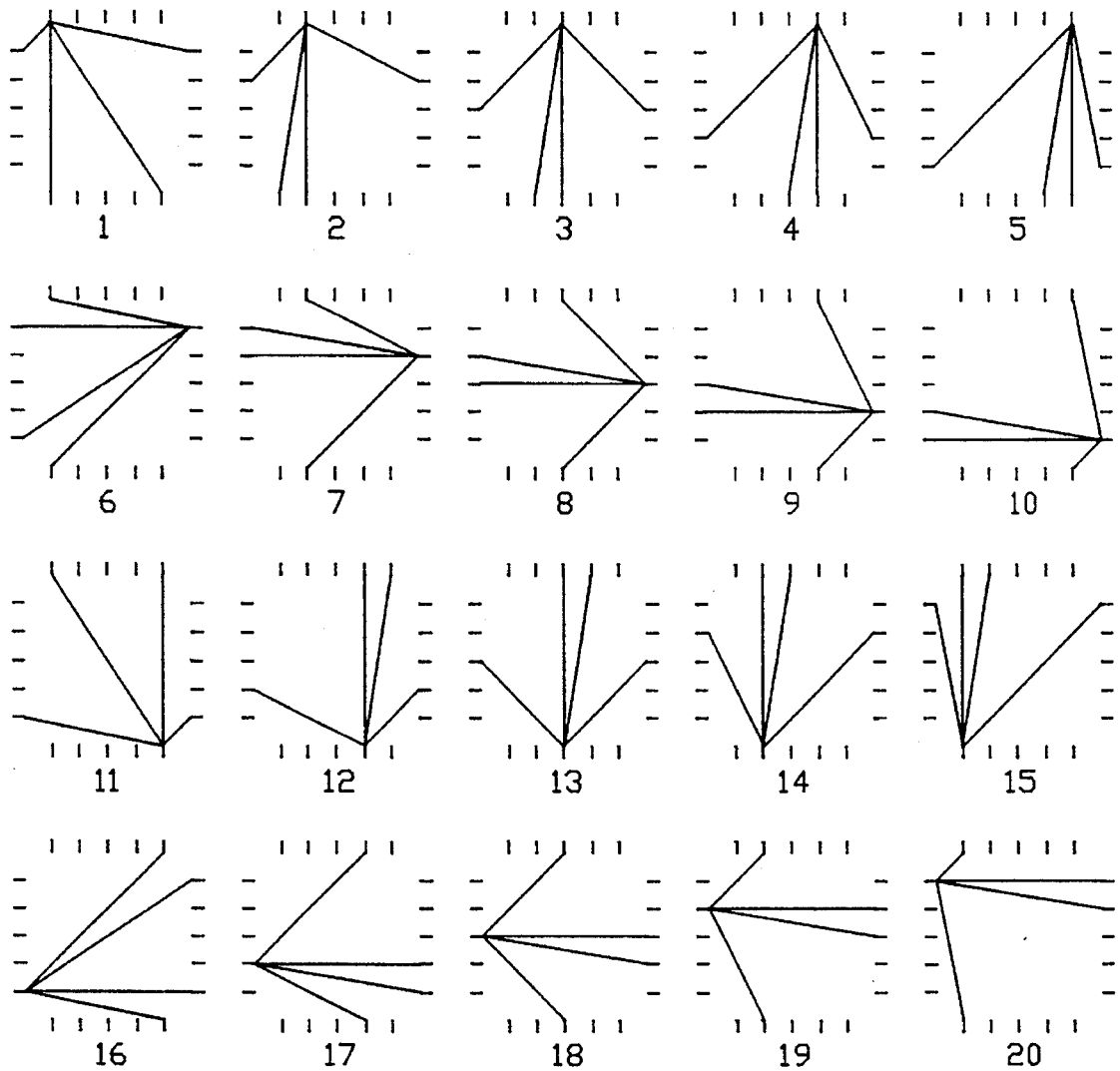
FIG. 21 shows the switch matrix interconnection options for each connection to the switch matrix.

FIG. 21 illustrates the interconnection options for a switch matrix using the PIP array as shown in FIG. 19. The figure is a graphical representation showing the possible interconnections of each of the connections 1–20 through the switching matrix. Thus, the possible interconnections of connection 1 is shown in the upper left hand corner. Likewise, the possible interconnections of connection 20 are shown in the lower right hand corner.

Figure 22:
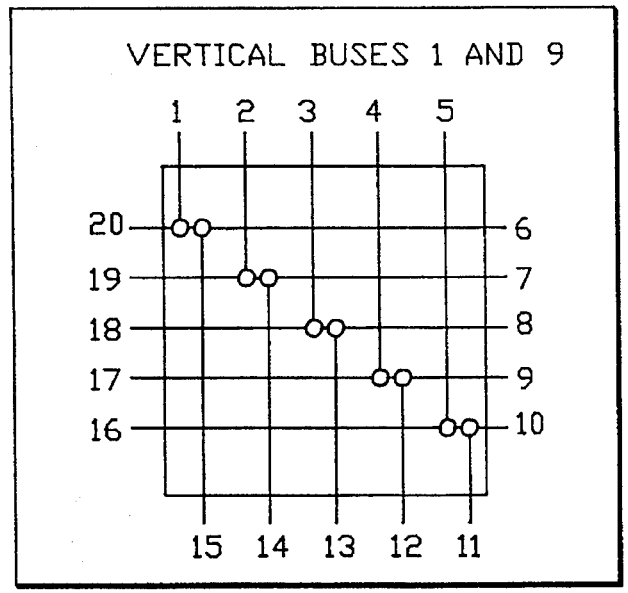
FIG. 22 illustrates the interconnection in the segment boxes on vertical buses 1 and 9.

FIG. 22 illustrates the interconnection array for the segment box on vertical buses 1 and 9. It can be seen that the segment box is an alternative switch matrix design, adapted for the peripheral buses. Each segment box has 20 input connections, five on each side, as illustrated in the figure. The input connections 20 and 6 are directly connected, input connections 19 and 7 are connected, inputs 18 and 8 are connected, inputs 17 and 9 are connected, and inputs 16 and 10 are connected. Inputs 1 and 15 are connectable through PIPs to the line connecting inputs 20 and 6. Inputs 2 and 14 are connectable through respective PIPs to the line connecting inputs 9 and 7. Inputs 3 and 13 are connectable through PIPs to the line connecting inputs 18 and 8. Inputs 4 and 12 are connectable through PIPs to the line connecting inputs 17 and 9. Finally, inputs 5 and 11 are connectable through PIPs to the line connecting inputs 16 and 10.

Figure 23:
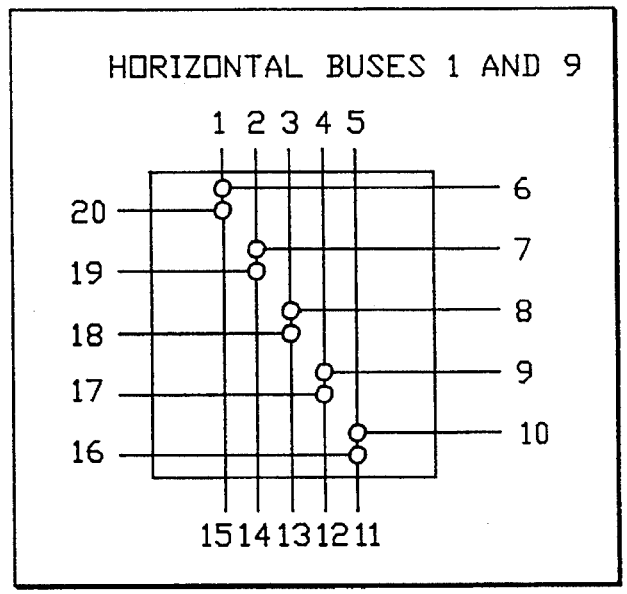
FIG. 23 illustrates the interconnection in the segment boxes on horizontal buses 1 and 9.

The segment box on the horizontal buses 1 and 9 is shown in FIG. 23. In this implementation, inputs 1 and 15 are connected directly, inputs 2 and 14 are connected directly, inputs 3 and 13 are connected directly, inputs 4 and 12 are connected directly, and inputs 5 and 11 are connected directly. Inputs 20 and 6 are connectable through PIPs to the line connecting inputs 1 and 15, inputs 19 and 7 are connectable through PIPs to the line connecting inputs 2 and 14. Inputs 18 and 8 are connectable through PIPs to the line connecting inputs 3 and 13. Inputs 17 and 9 are connectable through PIPs to the line connecting inputs 4 and 12. Finally, inputs 16 and 10 are connectable through PIPs to the line connecting inputs 5 and 11.

Figure 24:
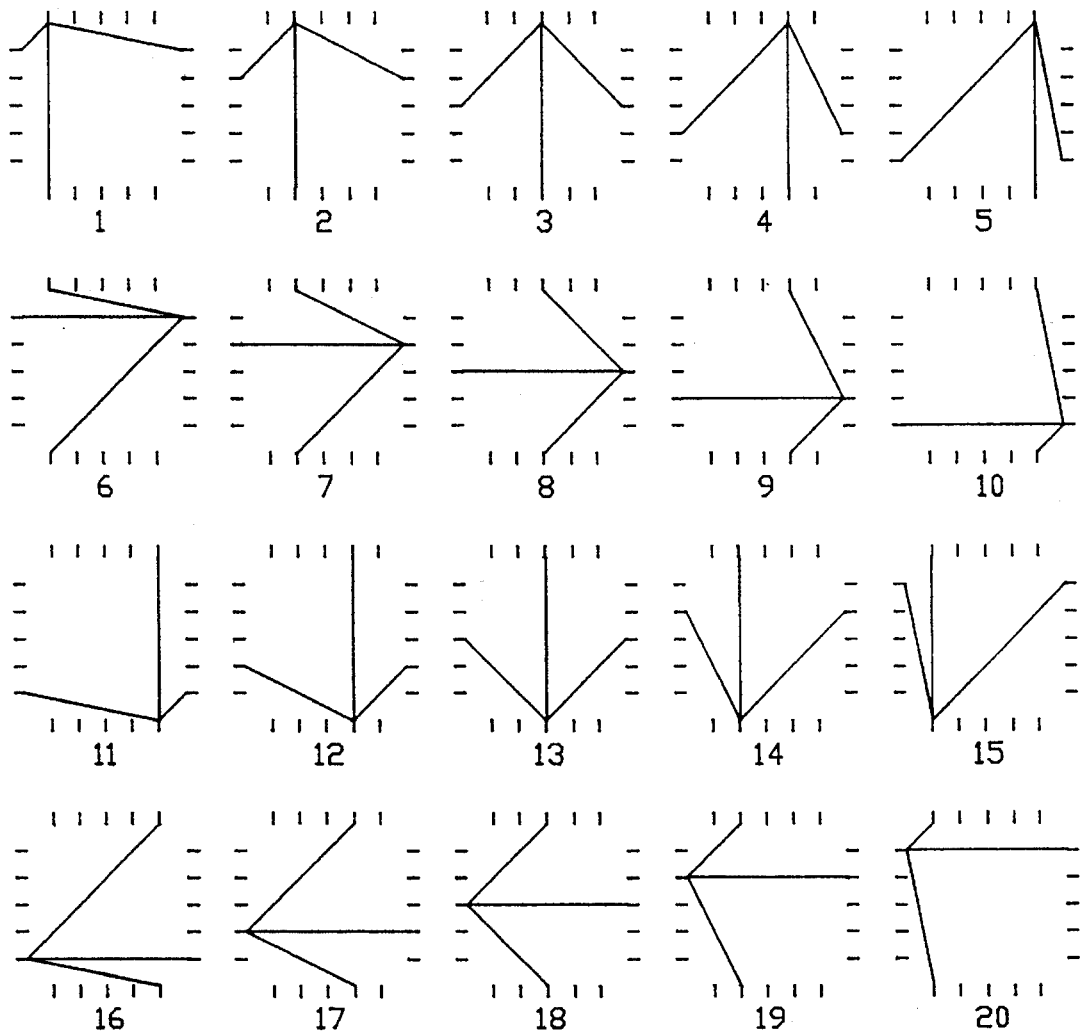
FIG. 24 illustrates the segment box interconnection options for each connection to the segment box.

FIG. 24 graphically illustrates in the style of FIG. 21, the possible interconnections for each input to a segment box. These possible interconnections apply equally to the segment boxes on the vertical buses and to the segment boxes on the horizontal buses.

So far, the basic interconnection structure of the programmable gate array has been described without emphasizing the connections to the configurable logic blocks and the input/output blocks. Accordingly, in order to describe those connections, a detailed description of the configurable logic blocks and the input/output blocks follows. Then, the connection of the input/output blocks and configurable logic blocks to the interconnect structure is set out.

III. Configurable Logic Block

A detailed implementation of the configurable logic block is set out with reference to FIGS. 25–44. An overview block diagram is set out in FIG. 25.

Figure 25:
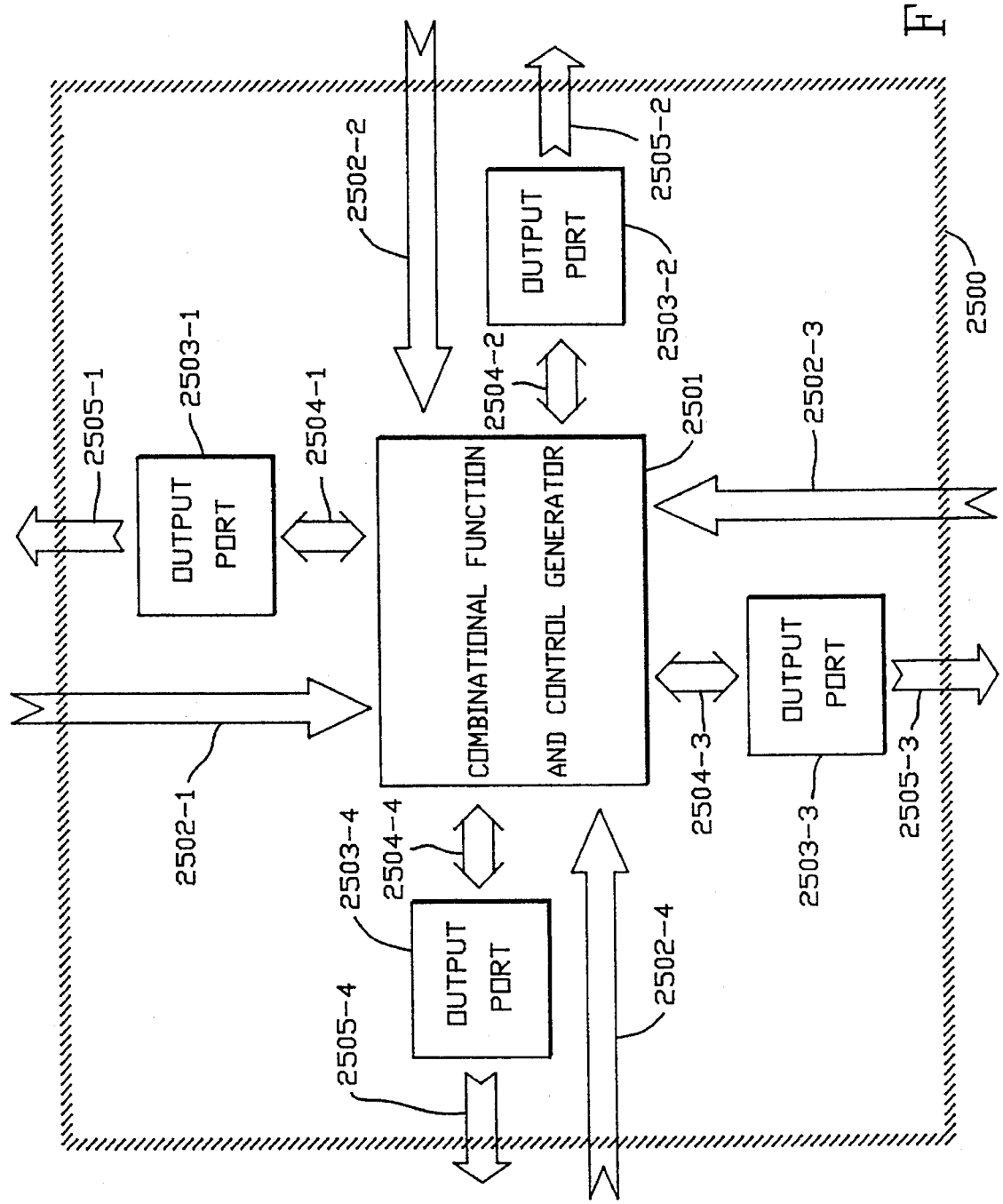
FIG. 25 is an overview block diagram of the configurable logic block.

The configurable logic block 2500 shown in FIG. 25 consists of a combinational function and control generator 2501 which receives inputs from four sides, schematically illustrated by buses 2502-1, 2502-2, 2502-3, and 2502-4. The combinational function and control generator 2501 communicates with four independently configurable output ports 2503-1, 2503-2, 2503-3, and 2503-4. The output ports receive signals and supply feedback signals to and from the combinational function and control generator 2501 across respective buses 2504-1, 2504-2, 2504-3, and 2504-4. Each output port supplies a plurality of output signals, schematically illustrated by the respective output buses 2505-1, 2505-2, 2505-3, and 2505-4.

The block diagram of FIG. 25 illustrates at a high level the symmetry of the configurable logic block 2500. Input signals can be received from all four sides of the block, likewise, output signals can be supplied to any of the four sides of the block. Furthermore, as seen below, input signals from the input bus 2502 can be used to generate output signals across bus 2505-1, 2505-2, 2505-3, or 2505-4. Similar flexibility is provided from all of the other input buses in the configurable logic block.

Figure 26:
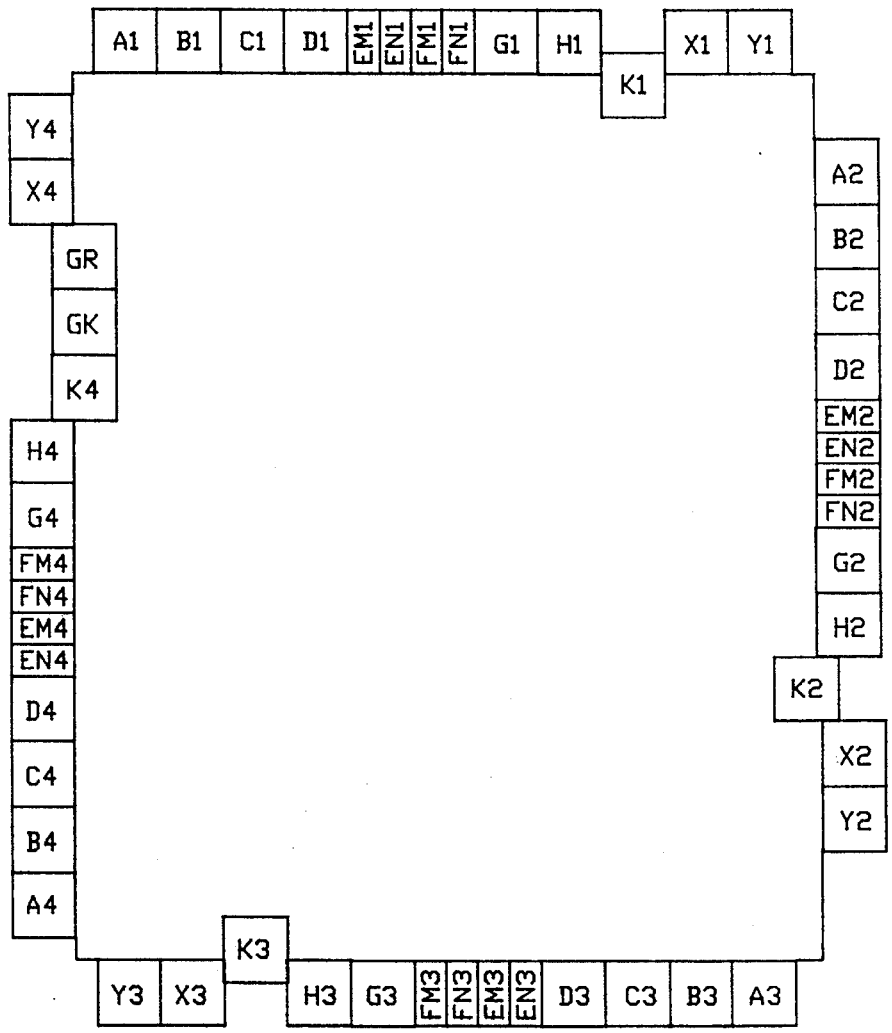
FIG. 26 schematically illustrates the inputs and outputs and provides a notation for the configurable logic block.

The inputs and outputs to the configurable logic block are set out in FIG. 26. Also, a notation for the inputs and outputs is provided. It can be seen that input signals along the top side of the block are labeled A1 through D1, EM1, EN1, FM1, FN1, G1, H1, and K1. The outputs are labelled X1 and Y1. Similarly, the suffix 2 is applied to the right side of the block, the suffix 3 is applied to the bottom of the block, and the suffix 4 is applied to the left side of the block: On the left side of the block, additional inputs GR and GK for global reset and global clock signals are provided.

As shown in the legend in FIG. 26, the inputs A1 through A4 and B1 through B4 are long line inputs. Inputs C1 through C4 and D1 through D4 are inputs coupled to the bidirectional general interconnect segments for logic signals.

The inputs EM1 through EM4, FM1 through FM4, EN1 through EN4, and FN1 through FN4 are direct connect inputs. The inputs G1 through G4 and H1 through H4 are inputs to the bidirectional general interconnect segments for control signals.

The inputs K1 through K4 are long line inputs from bus line 15 used for clock and clock enable functions.

Outputs are supplied at terminals X1 through X4 and Y1 through Y4. Direct connect structures are connected to X1 through X4. The general interconnect structures are coupled to outputs Y1 through Y4.

Figure 27:
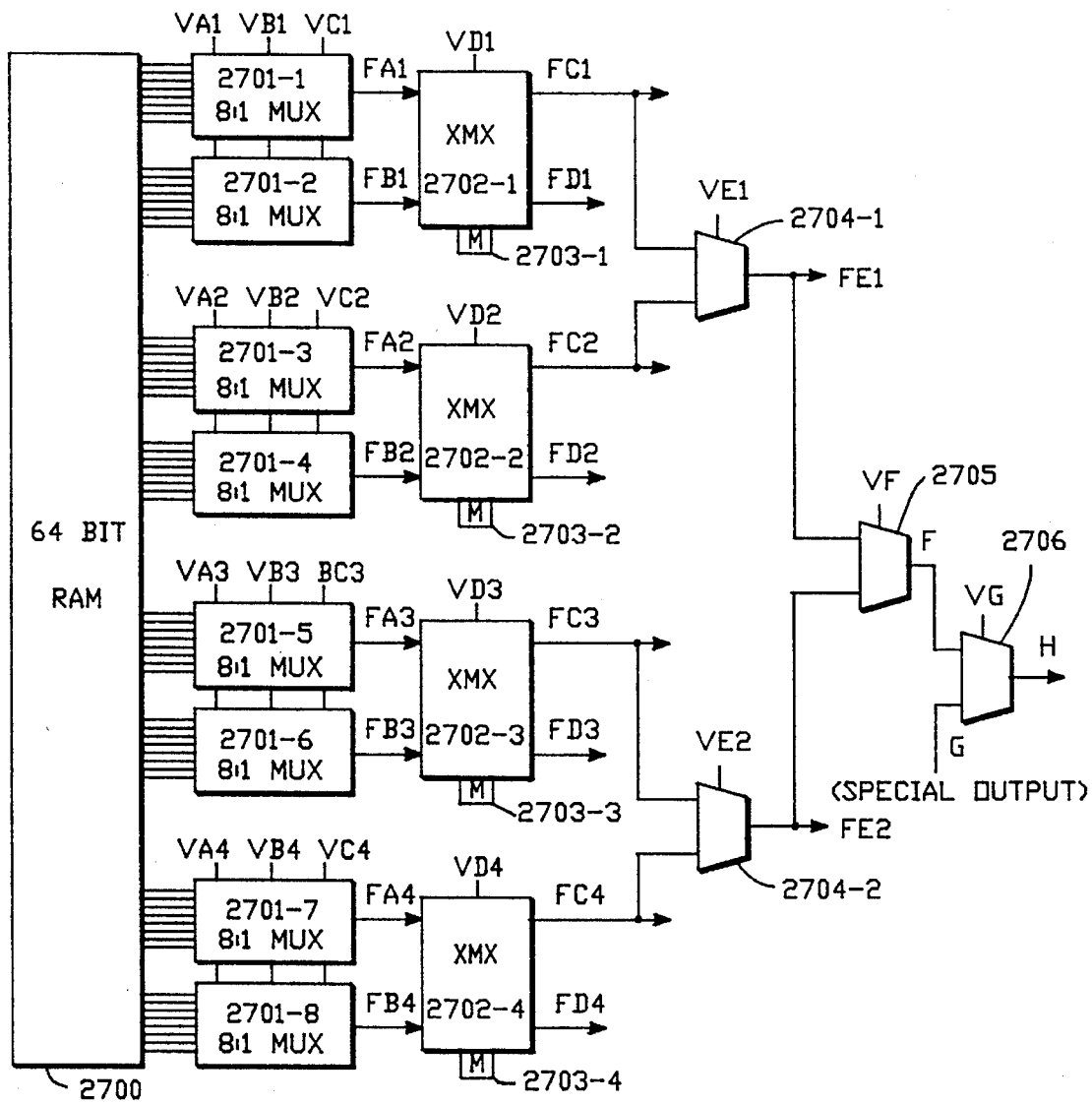
FIG. 27 is a schematic diagram of the combinational logic in the configurable logic block.
Figure 28:
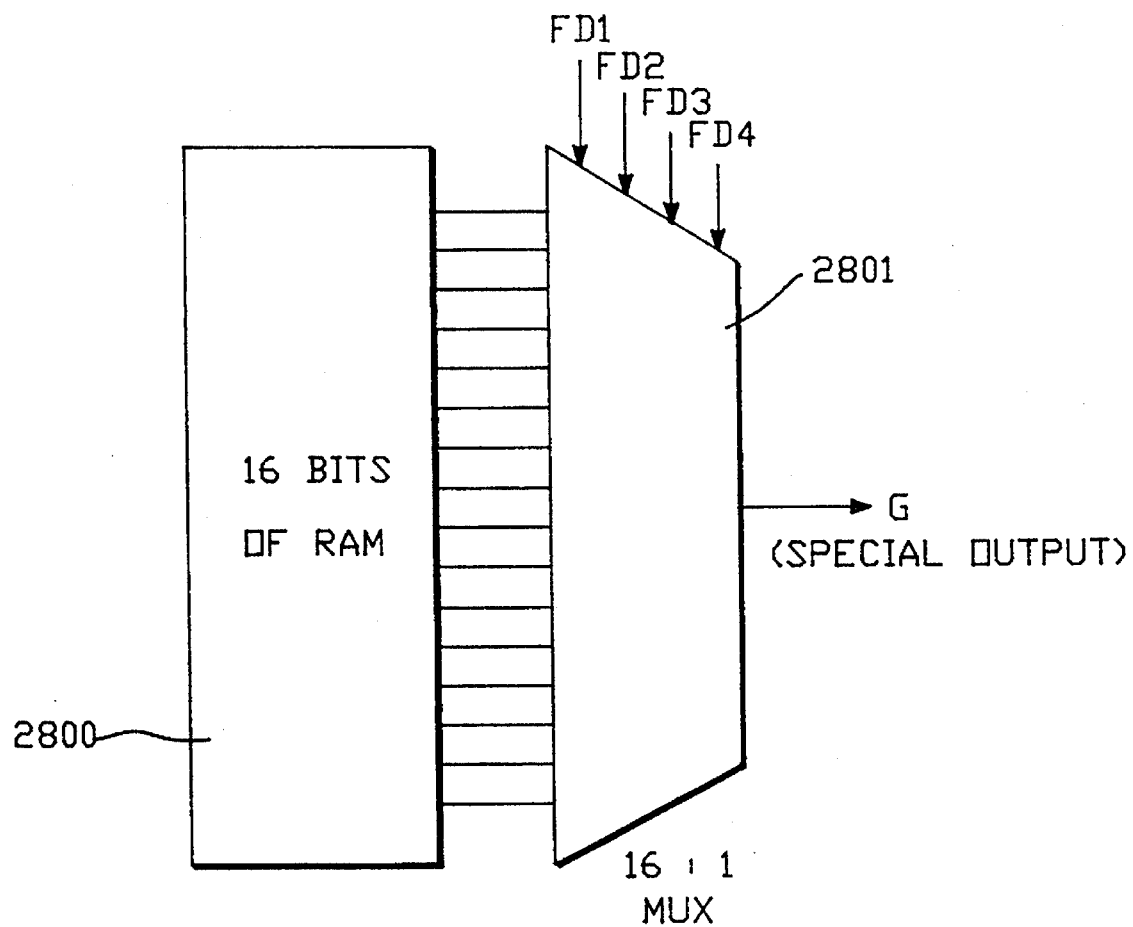
FIG. 28 is a schematic diagram of the special output stage which is coupled to the combinational logic of FIG. 27.

The combinational logic block consists of a 64 bit RAM addressed through a multiplexing tree as shown in FIG. 27, 16 additional bits of RAM addressed through a special output multiplexer as shown in FIG. 28, four independent output macro cells as shown in FIGS. 29–32, and multiplexing structures used for generation of the logic inputs to the multiplexing tree and for control signals shown in FIG. 35–44.

The basic combinational logic function is provided by the multiplexing tree shown in FIG. 27. As stated above, 64 bits of the configuration memory 2700 is stored with program data. A first level multiplexing structure divides the 64 bit RAM into eight 8 bit sections. Each 8 bit section is coupled to a 8:1 multiplexer, 2701-1 through 2701-8. The 8 bit multiplexers are coupled into pairs sharing three common address signals VA1, VB1, VC1 for multiplexers 2701-1 and 2701-2, signals VA1, VB2, VC2 for multiplexers 2701-3 and 2701-4, signals VA3, VB3, VC3 for multiplexers 2701-5 and 2701-6, and finally, signals VA4, VB4, and VC4 for multiplexers 2701-7 and 2701-8.

Eight independent outputs are generated by the eight 8:1 multiplexers. The outputs FA1 through FA4 are supplied respectively from multiplexers 2701-1, 2701-3, 2701-5 and 2701-7. Outputs FB1 through FB4 are supplied respectively from multiplexers 2701-2, 2701-4, 2701-6 and 2701-8.

The paired outputs FA1/FB1 are supplied to cross-multiplexer 2702-1. FA2/FB2 are supplied to cross-multiplexer 2702-2. FA3/FB3 are supplied to cross-multiplexer 2702-3. FA4/FB4 are supplied to cross-multiplexer 2702-4.

The cross-multiplexers 2702-1 through 2702-4 are each coupled to a respective memory cell 2703-1 through 2703-4 in the configuration memory to receive a respective control variable VD1 through VD4.

Cross-multiplexer 2702-1 generates outputs FC1 and FD1. Cross-multiplexer 2702-2 generates outputs FC2 and FD2. Cross-multiplexer 2702-3 generates outputs FC3 and FD3. Cross-multiplexer 2702-4 generates outputs FC4 and FD4.

If the memory cell 2703-1 associated with cross-multiplexer 2701-1 is equal to 0, then the input FA1 is connected to output FC1, and the input FB1 is connected to output FD1. The control variable VD1 coupled to cross-multiplexer 2702-1 will have no effect when memory cell 2703-1 is 0. Thus, a cross-multiplexer just provides a pass through path for the signals FA1 and FB1, such that the output FC1 and FD1 are two independent variables of the three control signals VA1 through VC1.

When the memory cell 2703-1 is set equal to 1, then the control input VD1 is enabled. If VD1 is 0, then the input FA1 is connected to both outputs VC1 and VD1. If the logic signal VD1 is equal to 1, then the input FB1 is connected to both outputs FC1 and FD1. Thus, when the memory cell 2703-1 is true, logic signal VD1 acts as a fourth variable so that the signal on outputs FC1/FD1 is equal to a unique combinational function of the four variables VA1 through VD1.

The function of the cross-multiplexers 2702-2 through 2702-4 is identical as to that of 2702-1 with the exception that the control signals VD2 through VD4 are independently supplied from the input multiplexing structure. Also, each memory cell 2703-2 through 2703-4 is individually configured during programming.

The output signals FC1 and FC2 are supplied as inputs to third level multiplexer 2704-1. Likewise, signals FC3 and FC4 are supplied to third level multiplexer 2704-2. Logic signals VE1 and VE2 control multiplexers 2704-1 and 2704-2, respectively. The output FE1 of multiplexer 2704-1 and FE2 of 2704-2 represent a logic function of five variables.

The signals FE1 and FE2 are supplied as input to a fourth level multiplexer 2705. Multiplexer 2705 is controlled by signal VF and generates the output F in response to six variables.

Finally, the signal F is supplied to a special output multiplexer 2706. A second input to the multiplexer 2706 is the special output signal G. Multiplexer 2706 is controlled in response to independent variable VG and generates the output signal H.

A special output signal G is generated by the special output stage shown in FIG. 28. The special output stage consists of 16 bits of RAM 2800 in the configuration memory. The 16 bits are coupled to a 16:1 multiplexer 2801. Control inputs to the 16:1 multiplexer include the signals FD1 through FD4 generated by the cross-multiplexers 2702-1 through 2702-4 in FIG. 27. Because the 16 control signals VA1 through VD1, VA2 through VD2, VA3 through VD3, and VA4 through VD4 can be independently supplied by the input multiplexing structure from outside the CLB, the special output G represents a wide gating function of 16 variables. Thus, a limited function of 16 variables is available at the G output.

The configurable logic block of the present invention uses 64 bits cascaded with 16 bits to give the ability to decode 64 states of 16 input variables.

Figure 29:
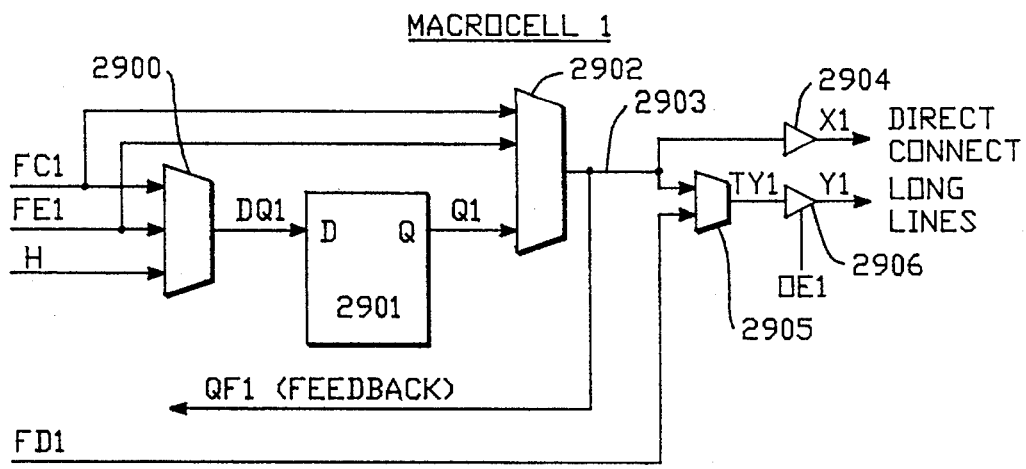
FIG. 29 is a schematic diagram of the macro cell for outputs X1 and Y1 on the configurable logic block.

The output macro cells for the configurable logic block are shown in FIGS. 29–32. The macro cell in FIG. 29 is coupled to outputs X1 and Y1 of the configurable logic block. Inputs to the macro cell include FC1, FE1, H and FD1. The inputs FC1, FE1 and H are coupled to multiplexer 2900. The output DQ1 of multiplexer 2900 is supplied as a D input to register 2901. The output Q1 of register 2901 is coupled as an input to multiplexer 2902. Two additional inputs to multiplexer 2902 include FC1 and FE1. The output of multiplexer 2902 is coupled to line 2903. Line 2903 supplies the signal QF1 as feedback to the combinational logic. Likewise, it is coupled directly to an output buffer 2904 for driving the output signal X1 for the direct connect.

Signal 2903 is also coupled to multiplexer 2905. The second input to multiplexer 2905 is a signal FD1. The output TY1 of multiplexer 2905 is coupled to a tristate output buffer 2906. The output of buffer 2906 is the Y1 signal for connection to the interconnect structure. The tristate buffer 2906 is controlled by the control signal OE1 generated within the configurable logic block as described below.

Figure 29A:
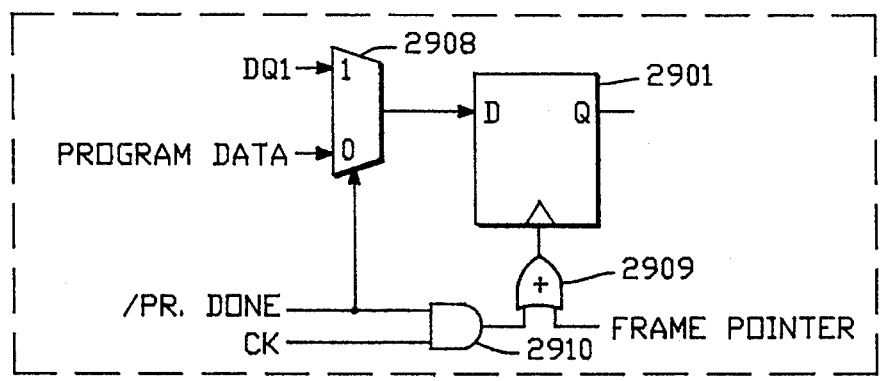
FIG. 29A illustrates the connection of the register in the macro cell which provides for preload during programming of the configurable logic array.

The register 2901 in the macro cell further has the ability to be preloaded during programming. This functionality is illustrated in FIG. 29A where the signal DQ1 is supplied to a multiplexer 2908. The second input to multiplexer 2908 is program data. The multiplexer 2908 is con,rolled by the control signal PROGRAM DONE. When PROGRAM DONE is false, the program data is selected through to the D input of the register 2901. Otherwise, the signal DQ1 is supplied. Likewise, the register 2901 is clocked at the output of gate 2909. The gate 2909 provides an OR function with the frame pointer and the output of AND-gate 2910. The inputs to AND-gate 2910 include the clock signal CK generated within the configurable logic block and the inverse of PROGRAM DONE. Thus, during programming stage, the clock signal is disabled and the frame pointer is used to clock register 2901 with program data. After programming is completed, the clock signal is supplied directly through to the register 2901. The same structure is utilized in each of the macro cells, although it is not explicitly shown to clarify the diagrams.

Figure 30:
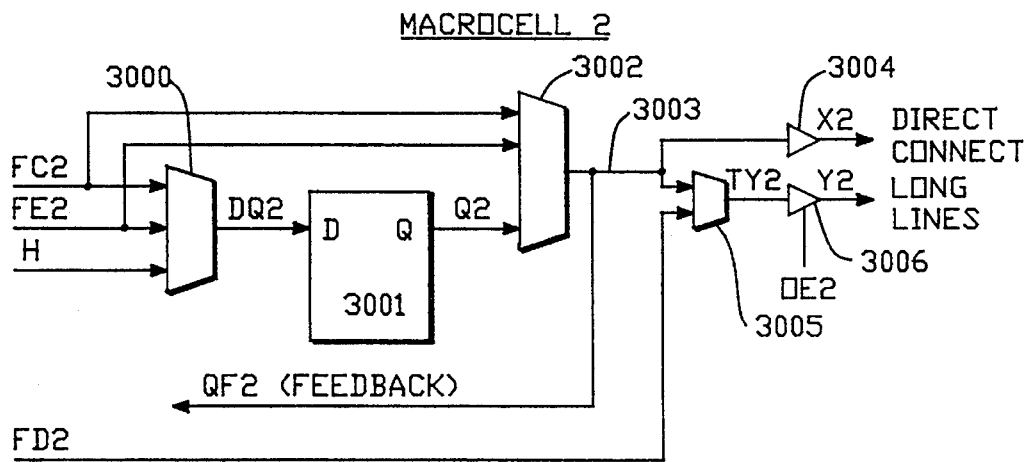
FIG. 30 is a schematic diagram of the macro cell for outputs X2 and Y2 on the configurable logic block.

FIG. 30 shows the macro cell supplying the outputs X2 and Y2. The inputs to macro cell 2 in FIG. 30 include FC2, FE2, H, and FD2. FC2, FE2, and H are supplied through multiplexer 3000 to generate the signal DQ2. DQ2 is supplied to register 3001. The output Q2 of register 3001 is supplied as an input to multiplexer 3002. Other inputs to multiplexer 3002 include FC2 and FE2. The output QF2 of multiplexer 3002 is supplied on line 3003 as feedback and directly to output buffer 3004 supplying the signal X2 to the direct connect.

The signal on line 3003 is also supplied to multiplexer 3005. The second input to multiplexer 3005 is the signal FD2. The output TY2 of multiplexer 3005 is supplied as an input to tristate output buffer 3006, which drives the signal Y2. Tristate buffer 3006 is controlled by control signal OE2.

Figure 31:
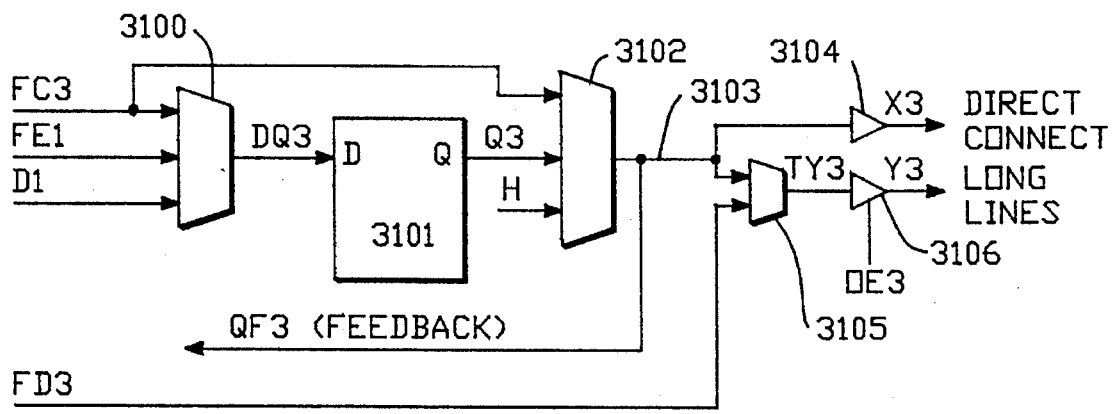
FIG. 31 is a schematic diagram of the macro cell for outputs X3 and Y3 on the configurable logic block.

The output macro cell of FIG. 31 drives the signals X3 and Y3. Its inputs include the signals FC3, FE1, D1, H and FD3. The inputs FC3, FE1, and D1 are coupled through multiplexer 3100 to supply the signal DQ3. Signal DQ3 is coupled to register 3101. The output Q3 of register 3101 is supplied as an input to multiplexer 3102. Two other inputs to multiplexer 3102 include FC3 and H. The output QF3 of multiplexer 3102 is supplied on line 3 103 as feedback and directly to the buffer 3104 which drives the signal X3. Also, the signal on line 3103 is supplied to multiplexer 3105. The second input to multiplexer 3105 is signal FD3. The output TY3 of multiplexer 3105 is supplied to the tristate buffer 3106 driving the signal Y3. The tristate buffer 3106 is controlled by the signal OE3.

Figure 32:
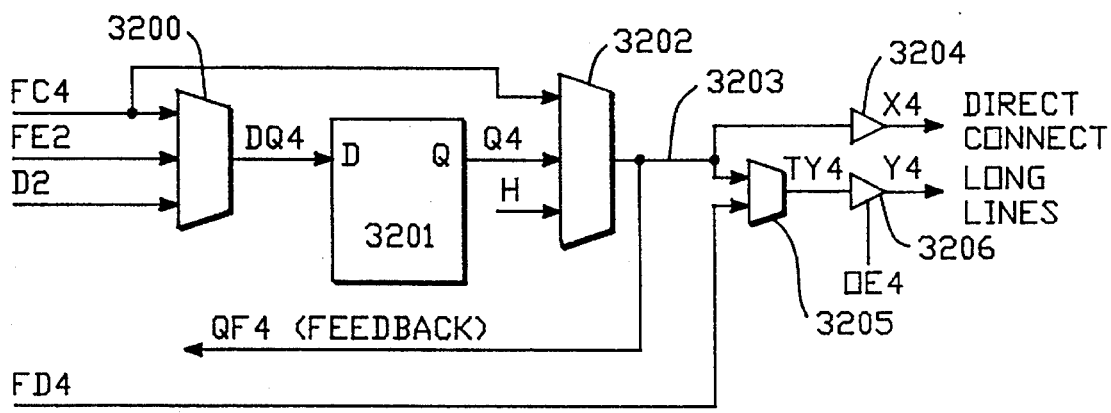
FIG. 32 is a schematic diagram of the macro cell for outputs X4 and Y4 on the configurable logic block.

The output macro cell for the driving signals X4 and Y4 is shown in FIG. 32. It is similar to the macro cell of FIG. 31. The input signals include FC4, FE2, D2, H, and FD4. The signals FC4, FE2 and D2 are supplied through multiplexer 3200 to supply the signal DQ4. Signal DQ4 is supplied through register 3101 to generate the output signal Q4. The output signal Q4 is supplied to multiplexer 3102. Other inputs to multiplexer 3102 include FC4 and H. The output of multiplexer 3102 is the signal QF4 on line 3203 which is supplied as feedback and is coupled to buffer 3204 to drive the signal X4. The signal on line 3203 is also supplied to multiplexer 3205. A second input to multiplexer 3205 is the signal FD4. Multiplexer 3205 generates a signal TY4 which is coupled to the tristate buffer 3206. Tristate buffer 3206 is controlled by the signal OE4 and drives the output Y4 of the configurable cell.

A design goal of the macro cells is to provide symmetrical function of each of the macro cells. Accordingly, to provide greater symmetry, the macro cell 1 and macro cell 2 could be changed to allow for the addition of input signals D3 and D4, respectively, at the input multiplexers 2900 and 3000. Further, the ability to provide the signal H in either a registered or combinatorial function could be allowed at each of the macro cells. The same is true for the signals FE1 and FE2. However, to optimize utilization of the die in the preferred embodiment, the macro cells shown in FIGS. 29–32 have been adopted. Complete symmetry would be attained by replacing the 3:1 muxes with 4:2 muxes in FIGS. 29–32.

Note that the macro cells of FIGS. 31 and 32 provide for utilization of the registers 3101 and 3201 even if they are not used for driving the output of the combinational logic. This is provided by allowing the inputs D1 and D2 to be directly coupled to the registers in the output macro cells.

Although not shown in FIGS. 29–32, each register includes a clock, clock enable and reset control. Furthermore, each of the multiplexers shown in the figures, unless a dynamic control signal is explicitly shown, is controlled by memory cells in the configuration program. Thus, the configuration of the macro cells is set during programming of the device. Note that each of the macro cells receives signals from the second level of multiplexing, the third level of multiplexing, and the output signal H.

Note also that the macro cell allows the output X1 and the output Y1 to be driven from different sources at the same time. This gives the configurable logic block the ability to produce up to eight outputs at a time.

The Y1 through Y4 signals are each applied to drive eight bus lines in the interconnect through PIPs, one of which is an uncommitted long line. The outputs X1 through X4 provide a high speed signal path to adjacent and next adjacent configurable logic cells or input/output cells in the array.

Figure 33:
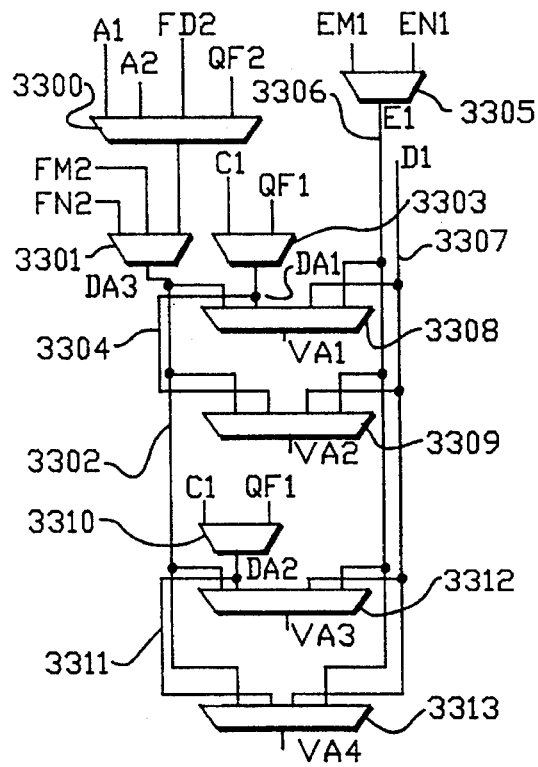
FIG. 33 is a diagram of the input multiplexing structure for signals VA1–VA4 which are used in the first level multiplexing in the combinational logic section of the configurable logic block.

The input multiplexing for the configurable logic block for generation of the signals VA1 through VA4 is shown in FIG. 33. The structure includes the first 4:1 multiplexer 3300 receiving the signals A1, A2, FD2, and QF2 as inputs. The output of multiplexer 3300 is supplied as an input to 3:1 multiplexer 3301. Two additional inputs to multiplexer 3301 include FM2 and FN2. The output of multiplexer 3301 is the signal DA3 on line 3302. Other inputs to the multiplexing tree include the signals C1 and QF1 supplied to the 2:1 multiplexer 3303. The output of the 2:1 multiplexer 3303 is the signal DA1 on line 3304. The inputs C1 and QF1 are also supplied to a second input multiplexer 3310 which supplies the output DA2 on line 3311.

Also, the input signals EM1 and EN1 are supplied to 2:1 multiplexer 3305. The output E1 is supplied on lane 3306. The input D1 is coupled to line 3307.

The signal VA1 is supplied at the output of 4:1 multiplexer 3308. The four inputs to multiplexer 3308 include the signals D1, E1, DA1, and DA3.

The signal VA2 is supplied at the output of multiplexer 3309. The inputs to multiplexer 3309 include the signals D1, E1, DA1 and DA3.

The signal VA3 is supplied at the output of multiplexer 3312. The inputs to multiplexer 3312 include D1, E1, DA2 and DA3.

Finally, the signal VA4 is supplied at the output of 4:1 multiplexer 3313. The inputs to multiplexer 3313 include D1, E1, DA2 and DA3. All of the multiplexers shown an FIG. 33 are controlled by memory cells in the configuration memory.

Figure 34:
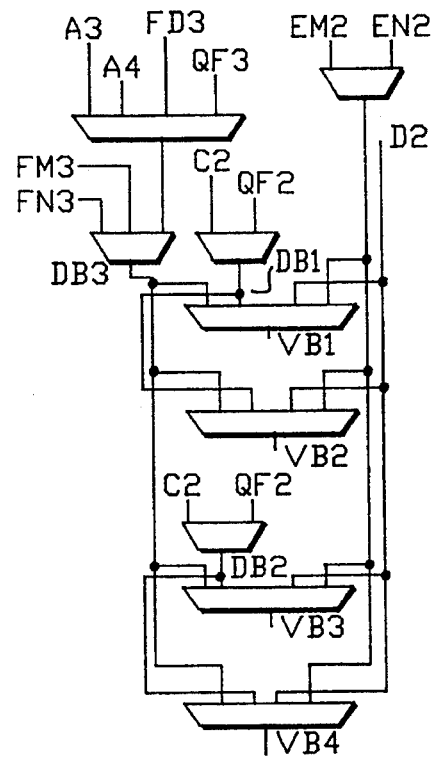
FIG. 34 is a schematic diagram of the input multiplexing structure for signals VB1–VB4 which are used in the first level multiplexing in the combinational logic section of the configurable logic block.

The control signals VB1 through VB4 are generated in the multiplexing tree which is identical to the MUX tree of FIG. 33, except that the inputs are different. Thus, the connection of the multiplexing tree is not repeated here. Rather, only the inputs are recited. The inputs to the multiplexing tree include FN3, FM3, A3, A4, FD3, QF3, C2, QF2, EM2, EN2, and D2. Accordingly, any one of the control signals generated by the multiplexing tree in FIG. 34 is selected from one of eleven inputs.

Figure 35:
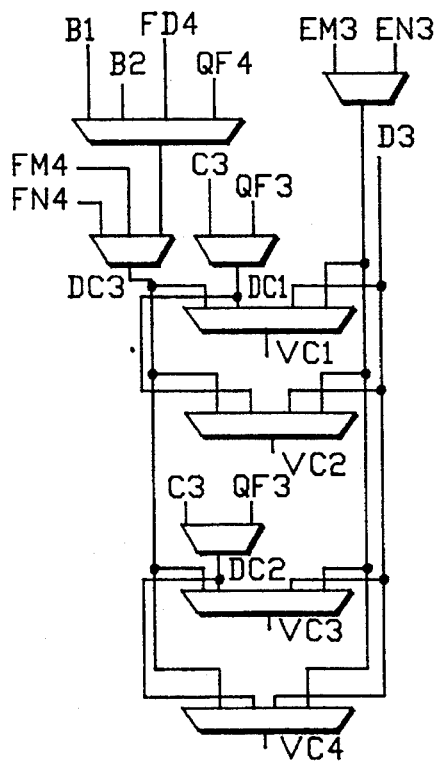
FIG. 35 is a schematic diagram of the input multiplexer structure for signals VC1–VC4 which are used in the first level multiplexing in the combinational logic section of the configurable logic block.
Figure 36:
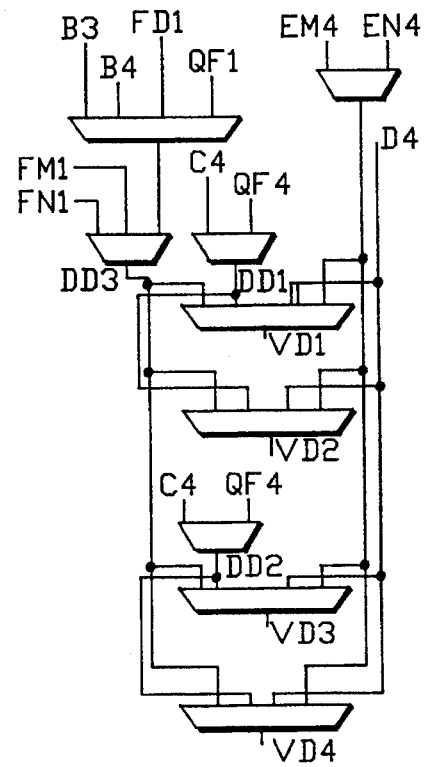
FIG. 36 is a schematic diagram of the input multiplexing structure for signals VD1–VD4 which are used in the second level multiplexing in the combinational logic section of the configurable logic block.

Similarly, FIGS. 35 and 36 show respectively the multiplexing trees generating the control signals VC1 through VC4, and VD1 through VD4. The inputs to the multiplexing tree in FIG. 35 include FN4, FM4, B1, B2, FD4, QF4, C3, QF3, EM3, EN3 and D3.

The inputs to the multiplexing tree of FIG. 36 include FN1, FM1, B3, B4, FD1, QF1, C4, QF4, EM4, EN4 an D4.

It can be seen from review of FIGS. 33–36 that the control signals VA1 through VA4, VB1 through VB4, VC1 through VC4, VC1 through VD4, are generated using an input multiplexing tree which does not require sharing of input variables. Furthermore, each of the outputs can be derived from an independent input variable allowing for a function of from 1 to 16 independent variables. Furthermore, the inputs are derived from all four sides of the configurable logic block allowing for symmetrical implementation of a network on the array.

Figure 37:
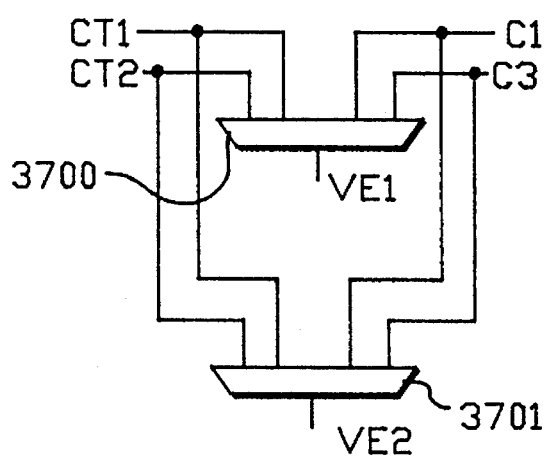
FIG. 37 is a diagram of the input multiplexing structure for VE1 and VE2 used in the third level multiplexing of the combinational logic.
Figure 38:
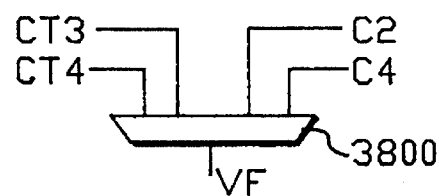
FIG. 38 is a diagram of the input multiplexing structure for the fourth level multiplexing signal VF in the combinational logic.
Figure 39:
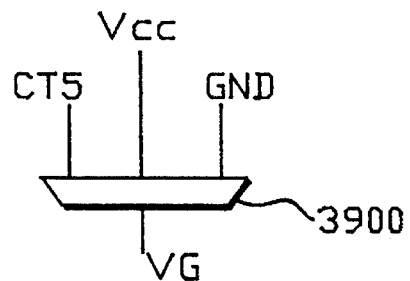

FIGS. 37, 38, and 39 illustrate generation of the control signals VE1, VE2, VF and VG. In FIG. 37, the MUX tree generates the signals VE1 and VE2 in response to the control signals CT1 and CT2 and to the input signals C1 and C3. VE1 is generated at the output of multiplexer 3700 which receives all four of the input variables CT1, CT2, C1, C3 as inputs. The signal VE2 is generated the output of 4:1 multiplexer 3701 which receives CT2, CT1, C1 and C3 as inputs.

The control signals CT1 and CT2 of FIG. 37 and CT3, CT4 and CT5 are generated in FIGS. 40A–40E described below.

The signal VF is generated at the output of multiplexer 3800 shown in FIG. 38. Multiplexer 3800 is a 4:1 multiplexer receiving the inputs CT3, CT4, C2 and C4.

The signal VG is generated at the output of the 3:1 multiplexer 3900 shown in FIG. 39, receiving the input signals CT5, $V_{CC}$ and GROUND.

FIGS. 40A–40H illustrate generation of the internal control signals CT1 through CT8, respectively. FIG. 40A illustrates generation of the signal CT1 in response to the inputs G1 and G2 through multiplexer 4001.

FIG. 40B illustrates generation of the signal CT2 through multiplexer 4002 in response to inputs G3 and G4.

FIG. 40C illustrates generation of the signal CT3 through multiplexer 4003 in response to inputs H1 and H2.

FIG. 40D illustrates generation of the signal CT4 through multiplexer 4004 in response to inputs H3 and H4.

FIG. 40E illustrates generation of the signal CT5 by multiplexer 4005 in response to inputs G1 and G2.

FIG. 40F illustrates generation of the signal CT6 by multiplexer 4006 in response to inputs G3 and G4.

FIG. 40G illustrates generation of the signal CT7 by multiplexer 4007 in response to inputs H1 and H2.

FIG. 40H illustrates generation of the signal CT8 by multiplexer 4008 in response to inputs H3 and H4.

FIG. 41 illustrates generation of the output enable signals OE1 through OE4 used in the output macro cells of FIGS. 29–32. Each of the signals OE1 through OE4 is independently supplied by respective multiplexers 4100, 4101, 4102 and 4103. The inputs to multiplexers 4100, 4101, 4102 and 4103 include $V_{CC}$ and the common OE control signal on line 4104. The signal on line 4104 is generated at the output of 4:1 multiplexer 4105. 4:1 multiplexer 4105 is coupled to four memory cells in the configuration memory 4106. Multiplexer 4105 is controlled by the signals CT5 and CT6. Thus, each output enable signal can be configured to be statically enabled by selecting this $V_{CC}$ as the output signal. Alternatively, it can be dynamically enabled or disabled in response to the common OE control signal on line 4104. Further independence of programming can be accomplished by providing independent dynamic signals for use as the output enables.

FIG. 42 illustrates generation of the clock signal CK which is used to clock the registers in the output macro cells. This signal is generated at the output of 2:1 multiplexer 4200. The inputs to the 2:1 multiplexer 4200 include a true and complement version of the signal supplied on line 4201 at the output of 6:1 multiplexer 4202.

Multiplexer 4202 receives as inputs the signals K1 through K4 from bus line 15 on four sides of the macro cell, the input GK from the global clock lines, and the control signal CT7. The multiplexers in FIG. 42 are configured by memory cells in the configuration memory.

FIG. 43 illustrates generation of the clock enable signal which is coupled to the registers in the output macro cells. The clock enable signal is generated at the output of multiplexer 4300. The input to multiplexer 4300 includes a signal on line 4301 which is supplied at the output of the 3:1 multiplexer 4302. The second input to multiplexer 4300 is the $V_{CC}$ signal. Thus, the clock enable signal can be permanently enabled by connection to $V_{CC}$. The inputs to multiplexer 4302 include the K1 signal, K2 signal and the control signal CT7.

FIG. 44 illustrates generation of the reset signal RST which is supplied to the registers in the output macro cells in the configurable logic block. The reset signal is generated at the output of OR-gate 4400. The inputs to OR-gate 4400 include the signal on line 4401 which is generated at the output of multiplexer 4402. The other input To OR-gate 4400 is the global reset signal GR. The two inputs to multiplexer 4402 include CT8 and GROUND. Thus, the reset signal CT8 can be permanently inhibited by connection to GROUND. Global reset is always allowed.

Thus, the configurable logic block described above provides for symmetrical interfaces on all four sides of the block to the interconnect structure. Furthermore, it allows for wide gating and narrow gating functions without suffering a speed penalty for the narrow gated functions. Furthermore, the wide gating functions do not require sharing of input signals which complicates logic design using the configurable logic block.

IV. The Input/Output Block

The configurable input/output blocks in the programmable gate array of the present invention consist of a simple block as shown in FIG. 45 and a complex block as shown in FIG. 46. Each input/output block (IOB) is coupled to memory cells in the configuration memory, the states of which control the configuration of the IOB. In general, an IOB allows data to pass in two directions: (i) from an input/output pad to the programmable general connect and specific CLBs; (ii) from the programmable general connect and specific CLBs to a pad.

The configuration of an IOB sets the type of conditioning the signal receives on passing through the IOB. The pad may or may not be bonded to a physical package pin.

There are two types of IOBs in the device. A simple IOB as shown in FIG. 45 with combinatorial input and output only. Also, a complex IOB as shown in FIG. 46 provides an input register/latch and an output register in addition to combinatorial features. The complex IOB also has internal links for giving the user input register read-back at the package pin, and direct links to adjacent complex IOBs that allow data to be transferred to the registers of an adjacent IOB.

Note that the silicon die can be put into packages having more than, less than, or the same number of package pins as there are IOB pads on the die. If there are fewer package pins than IOB pads, then some IOBs may not be linked to a device package pins and so become buried IOBs for internal device use.

As suits the needs of a particular user, the number of simple IOBs and complex IOBs on a given implementation may vary due to die size and speed constraints. Further, the PGA could include all simple IOBs or all complex IOBs, if desired.

FIG. 45 illustrates the preferred implementation of the simple IOB.

The IOB provides a configurable interconnection between the input/output pad 4500 and the interconnect structure. The interconnect structure supplies output signals as inputs to multiplexer 4501. The IOB supplies input signals I to an interconnect bus at the output on line 4503 of buffer 4502. Input signals DI are coupled to adjacent configurable logic blocks at the output on line 4505 of buffer 4504.

The specific inputs to multiplexer 4501 are set out below. Each IOB has at least one input supplied from a long line on a bus which is perpendicular to the side of the chip on which the IOB is placed. Also, it is connected to the bidirectional general interconnect lines on the bus that runs parallel to the side and to an uncommitted long line on the bus parallel to the side. The IOB also has two direct connect inputs.

The output of multiplexer 4501 is supplied to tristate buffer 4506. The tristate buffer 4506 has a slew rate control circuit 4507 as known in the art. The buffer 4506 is controlled by the tristate output signal TO on line 4508.

The tristate output signal TO is supplied at the output of multiplexer 4509. The inputs to multiplexer 4509 are the power supply $V_{CC}$, the true and complement versions of the signal OEN which is supplied as a control input to the IOB from the interconnect structure, and GROUND.

When enabled, the pin output signal PO is supplied across line 4510 to the output pad 4500. Coupled to line 4510 also is a passive pull up circuit 4511 which is configured in response to program data through transistor 4512. A pull up resistor 4513 is coupled from the output of transistor 4512 to $V_{CC}$.

Inputs from the IO pad 4500 are supplied through buffer 4514. The output PI of buffer 4514 is supplied on line 4515 as input to output buffer 4504 and to output buffer 4502. The output buffer 4502 is a tristate buffer controlled by the tristate input signal TI on line 4516. The tristate input signal TI on line 4516 is generated at the output of multiplexer 4517. The inputs to multiplexer 4517 are $V_{CC}$, the true and complement of the control signal IEN which is supplied as input to the IO block, and GROUND.

The multiplexers 4501, 4509, and 4517 are each controlled by memory cells in the configuration memory.

The signal supplied as input to buffer 4514 can be derived from three sources: the package pin coupled to the IO pad, the output PO of the output buffer on line 4510, or the high level created by the passive pull up circuit.

The multiplexer 4517 generates the TI signal from four sources. When $V_{CC}$ is selected, the buffer 4502 is permanently enabled. When GROUND is selected, the buffer 4502 is permanently disabled and does not switch during operation of the programmable gate array, which could cause wasted current drain. When the multiplexer 4517 is configured to select the IEN signal in either its true or complement form, the buffer 4502 is dynamically controlled.

The multiplexer 4501 has six inputs in the preferred system. Two of the inputs come from nearby configurable logic blocks as direct connects, the remaining come from the programmable general interconnect structure.

The output enable TO on line 4508 comes from $V_{CC}$, OEN or GROUND. When $V_{CC}$ is selected, buffer 4506 is permanently enabled. When GROUND is selected, buffer 4506 is permanently disabled. When OEN is selected, in either its true or complement forms, buffer 4506 is dynamically controlled.

The passive pull up 4511 for the output link 4510 is controlled by memory cell 4511. When enabled, it ensures that the pad or package pin does not float when it is not used in an application.

FIG. 46 illustrates the complex IOB. The complex IOB provides configurable data paths from the IO pad 4600 to the interconnect across lines 4601 and 4602, and from the interconnect which is coupled to the input multiplexer 4603 to the IO pad 4600. In addition, the IOB is coupled to the previous counterclockwise adjacent complex IOB to receive input signals QP1 and QP2 at lines 4604 and 4605. Also, the IOB supplies as output the signals Q1 and Q2 to the next clockwise adjacent complex IOB on lines 4606 and 4607.

The input path includes line 4608 which is connected from the IO pad 4600 as input to the input buffer 4609. The input buffer drives a signal PI on line 4610. The signal PI is coupled as an input to multiplexer 4611. The second input to multiplexer 4611 is the output 4612 of multiplexer 4613. The inputs to multiplexer 4613 include the signals QP1 and QP2.

Multiplexer 4611 is controlled in response to the signal SL1 to supply the signal D1 on line 4614. Signal D1 is supplied at the data input of the input register/latch 4615. The register/latch 4615 is clocked by the output 4616 of multiplexer 4617. Inputs to multiplexer 4617 include the control signals GK, K, and CEN which are supplied as inputs to the IOB. The register/latch further includes a global reset input 4618 which receives the GR signal, which is an input to the IOB. Also, a clock enable input signal LH1 is supplied on line 4619 to the register/latch 4615. This signal LH1 is supplied at the output of multiplexer 4620. The inputs to multiplexer 4620 include the CEN signal and $V_{CC}$.

The output Q1 of the register/latch 4615 is supplied on line 4621 as an input to multiplexer 4622, as an input to multiplexer 4623, and as the Q1 output signal on line 4606, and input to the multiplexer 4640.

A second input to multiplexer 4622 is the PI signal on line 4610. A third input to multiplexer 4622 is the output of the output register on line 4624 as described below. The output of multiplexer 4622 is supplied to line 4625. Line 4625 is coupled as input to buffer 4626 which drives line 4602 to the direct connect, and as an input to buffer 4627 which is a tristate buffer driving connections to the long lines on line 4601. Buffer 4627 is controlled by the tristate input signal on line 4628. The signal on line 4628 is supplied at the output of the 4 1 multiplexer 4629. Inputs to the 4:1 multiplexer 4629 include the $V_{CC}$ signal, IEN in its true and complement form, and GROUND.

The output path through the complex IOB is connected to receive the signal O on line 4630 at the output of multiplexer 4603. The signal O on line 4630 is supplied as the second input to multiplexer 4623. The output of multiplexer 4623 is supplied as input to multiplexer 4631. The second input to multiplexer 4631 is supplied at the output of multiplexer 4632. The inputs to multiplexer 4632 are the QP1 and QP2 signals. The output of multiplexer 4631 is the D2 signal on line 4633. The D2 signal is coupled as data input to the output register 4634.

The output register 4634 is coupled to the global reset signal GR on line 4635. It is clocked by the signal K2 on line 4636 which is generated at the output of multiplexer 4637. Inputs to multiplexer 4637 include the global clock GK, the K signal, and the CEN signal. A clock enable signal LH2 is supplied on line 4638 to the register 4634. The source of the signal LH2 on line 4638 is the multiplexer 4639 which receives as input the CEN signal and $V_{CC}$.

The output of the register 4634 is supplied to line 4607, which drives the output Q2, and to line 4624, which is coupled as a first input to multiplexer 4640 and as an input to multiplexer 4622. The second input to muitiplexer 4640 is the output Q1 of register/latch 4615 on line 4621. The third input to multiplexer 4640 is the signal O on line 4630.

The output of multiplexer 4640 is the pin output signal PO on line 4641. It is supplied through the tristate output buffer 4642 to the IO pad 4600. The tristate buffer includes a slew rate control circuit 4643 as known in the art. Further, a pass transistor 4644 and resistor 4645 provide a pull up path to $V_{CC}$ at the output of buffer 4642. This pull up path is enabled in response to the passive pull up circuit 4646 which is implemented by a configuration memory cell.

The tristate buffer 4642 is controlled by the tristate output signal TO on line 4647. The signal is generated at the output of multiplexer 4648 which receives four inputs. The inputs include $V_{CC}$, GROUND, and a true and complement version of the signal OEN.

Control signals K, GK, and GR are supplied directly from the interconnect structure. The control signals IEN, CEN and OEN are supplied at the output of respective multiplexers 4650, 4651, and 4652, each of which receives two inputs from the general interconnect.

The signal on IEN gives the ability for dynamic control of the input path through the buffer 4627.

The signal on OEN gives the ability for dynamic control of the output path through the output buffer 4642.

The signal CEN can be used as a clock or as a clock enable signal.

The signals SL1 and SL2 are derived at the output of 3:1 multiplexers 4653 and 4654. Two of the inputs to the multiplexers 4653 and 4654 are derived from the interconnect structure as described below and the third is coupled to ground. The signal SL1 allows the input register of the IOB to be loaded with data either from the pad or from an adjacent counterclockwise complex IOB through QP1 or QP2. The signal SL2 allows the output register of the IOB to be loaded with data from either the output of MUX 4623 or from the next adjacent counterclockwise IOB through QP1 or QP2.

The input register/latch 4615 can be configured to operate either as a latch or a register, in response to a memory cell in the configuration memory. When the element operates as a register, data at the input D is transferred to the output Q on the rising edge of the clock signal K1 on line 4616. When the element operates as a latch, any data change at D is seen at Q while the signal K1 is high. When K1 returns to the low state, the output Q is frozen in its present state and any change on D will not affect the condition of Q.

The slew rate control circuit 4643 allows the output to either have a fast or a slow rise time subject to the state of the memory cell controlling that function.

Each of the multiplexers shown in FIG. 46 is controlled by a memory cell or cells in the configuration memory with the exception of multiplexers 4631 and 4611. These two multiplexers are controlled by the signals SL1 and SL2.

In operation, the input path receives a signal from the pad 4600 on line 4608 and passes it through buffer 4609 to generate the signal PI on line 4610. The signal PI is supplied as an input to the register load multiplexer 4611 which is controlled by the control signal SL1 . The second input to the multiplexer 4611 is derived from the output of multiplexer 4613 which allows the supplying of a signal from either the input register or the output register of a previous counterclockwise adjacent complex IOB. When the signal SL1 is not connected to any lines in the circuit, it defaults to the low state allowing the signal PI to pass through.

The output D1 of the multiplexer 4611 is the data input to the input storage element 4615. Thus, the source of data at the input storage element is either the IO pad, the output buffer 4642, the high state generated by the passive pull up circuit 4646, or the input or output register of the adjacent complex IOB. The contents of the input register/latch can be frozen by asserting the signal LH1. The input path also includes the multiplexer 4622 which drives the output buffers 4627 and 4626. The inputs to the multiplexer 4622 include the signal PI from the line 4610, the signal Q1 at the output of the storage element 4615, and the signal Q2 at the output of the output register 4634. Thus, the input signals to the interconnect structure can be derived from the input register, the combinatorial signal on line PI or from the output register. This allows the options for a registered or combinatorial signal derived from the IO pad. It also allows a synchronized output signal which can be derived by driving the signal from the input register output Q1 through the output register 4634 and across line 4624 back to the input driving multiplexer 4622. The Q1 output of the Input register 4615 is also available as an input to the 3:1 multiplexer 4640 driving the signal PO. This facilitates read back of an input signal as part of the user application. Further, the signal Q1 at the output of the input register is coupled as an input to the 2:1 multiplexer 4623 to create the synchronization path and to the output pin Q1 for coupling to the next adjacent clockwise complex IOB.

The operation of the output path is similar to that of the input path. The signal O on line 4630 derived from the multiplexer 4603 comes from either adjacent CLBs or from the programmable general interconnect structure for routing to the pad 4600. Through the multiplexing tree comprised of 4623 and 4631, the inputs to the output register can be derived from the signal QP1 and QP2 from the adjacent counterclockwise complex IOB, the output of the input register Q1 on line 4621 or from the signal 0. The signal PO which supplies the output signal to the output buffer 4642 can be derived either from the output Q2 of the output register 4634, the output Q1 of the input register 4615, or from line 4630 supplying the combinatorial signal O from the output of multiplexer 4603.

The contents of the output register can be frozen by asserting the signal LH2 on line 4638.

The output buffer 4642 drives both the pad 4600 and the input circuit across line 4608. Thus, the IOB can be used as a buried structure when the pad is not bonded to a physical package pin.

FIGS. 47 and 48 illustrate the inputs and outputs of the complex and simple IOBs, respectively. These figures can be referred to when reviewing the interconnect structures described in the following sections.

In FIG. 47, the signal DI corresponds to the signal on line 4602 in FIG. 46. The signal I corresponds to the signal on line 4601 in FIG. 46. The signal O corresponds to the output of the multiplexer 4603. The other labeled signals can be clearly correlated with signals supplied in FIG. 46.

Likewise, in FIG. 48, the signal DI is the signal supplied on line 4505. The signal I is the signal supplied on line 4503. The signal O corresponds to the output of multiplexer 4501. The IEN and OEN signals are input control signals clearly shown in FIG. 45.

FIG. 49 illustrates conceptually the operation of the links QP1, QP2, Q1 and Q2 between the complex IOBs. In the programmable gate array, the IOBs are arranged around the perimeter of the device. They are coupled to allow a clockwise data flow direction such that the inputs QP1 and QP2 are coupled to the outputs Q1 and Q2 of a next adjacent counterclockwise complex IOB. The outputs Q1 and Q2 are coupled as input QP1 and QP2 to the next adjacent clockwise complex IOB. In this manner, the complex IOBs can be connected together in a string allowing for implementation of shift registers or similar structures. This increases utilization of the logic provided in the complex IOBs, which might otherwise be unused in a given application.

V. The Connections of Interconnect Structure to CLBs and IOBs

The configurable interconnect structure provides a means of connecting the CLBs and IOBs together. It is divided into two major categories, called the direct connect and the programmable general connect. The programmable general connect includes long lines, the bidirectional general interconnects and the uncommitted long lines.

The programmed connections required between the blocks for a user application are referred to as nets. A net can have single or multiple sources, and single or multiple destinations. The type of interconnect resource used to construct a net is determined from availability to the software routing algorithm and the propagation delay allowed for the net. The allowed propagation delay is defined by user application.

The direct connect structure is illustrated chiefly in FIGS. 50–55. FIGS. 50 and 51 in combination show all the direct connections supplied as inputs EM1 through EM4, EN1 through EN4, FM1 through FM4, and FN1 through FN4 supplied from the outputs X1 through X4 of eight neighbor CLBs. In FIG. 50, the connection of next adjacent CLBs to the inputs FM1 through FM4 and FN1 through FN4 are shown. Thus, the connection X4 from CLB of row i–2 column j is coupled to the input FN1 of the CLB of row i in column j. Output X2 of CLB of row i–2 in column j is coupled to the input FM3. Output X1 of CLB of row i and column j+2 is coupled to the input FN2. Output X3 of CLB of row i column j+2 is coupled to the input FM4. The output X4 of CLB of row i+2 in column j is coupled to the input FM1 of the center CLB. The output X2 of row i+2 and column j is coupled to the input FN3 of the center CLB. The output X3 of the CLB of row i and column j–2 is coupled to the input FN4. Output X1 of the CLB of row i in column j–2 is coupled to the input FM2.

As shown in FIG. 51, the output X4 of the CLB in row i–1 and column j is coupled to the input EN1 of the center CLB in row i and column j. Output X2 of the CLB In row i–1 and column j is coupled to the input EM3 in the center CLB. Output X1 of the CLB in row i and column j+1 is coupled to the input EN2 of the center CLB. The output X3 of the CLB in row i column j+1 is coupled to the input EM4.

The output X2 of the CLB in row i+1 and column j is coupled to the input EN3. The output X4 of the CLB in row i+1 in column j is coupled to the input EM1. The output X3 of the CLB in row i and column j–1 is coupled to the input EN4. The output X1 in the CLB in row i, column j–1 is coupled to the input EM2.

Note that the structure shown in FIGS. 50 and 51 illustrate that the CLBs in the center of the array are directly coupled to eight neighbor CLBs. Further, the interconnections allow for direction of data flow in any direction through the direct connect structure among CLBs.

In an alternative system having eight neighbor CLBs, the CLB at row i–1, column j+1; row i+1, column j+1; row i–1, column j–1; and row i+1 column j–1 could be connected in place the four outer CLBs shown in FIGS. 50 and 51. This would provide eight neighbors with diagonal interconnection paths through the device. However, it is found that the ability to traverse a row or column with a direct connect structure provides for enhanced speed in transferring signals across the device.

FIG. 52 illustrates the connection of the outputs X1 through X4 on the center CLB in row i column j to the eight neighbor CLBs.

The output X4 of the CLB in the center is connected to the input FM1 of the CLB in row i–2, column j; the input EM1 of the CLB in row i–1, column j; the input EN1 of the CLB in row i+1, column j; and the input FN1 in the CLB of row i+2, column j.

The output X1 is coupled to the input FN2 of the CLB in row i, column j–2; the input EN2 in the CLB in row i, column j–1; the input EM2 in the CLB in row i, column j+1; and the input FM2 in the CLB in row i, column j+2. The output X2 is coupled to the inputs FN3 and EN3 in the CLBs in rows i–2 and i–1, column j, respectively, and to the inputs EM3 and FM3 in the CLBs of rows i+1 and i+2, of column j, respectively. Finally, the output X3 is coupled to the inputs FM4 and EM4 of the CLBs in row i columns j–2 and j–1, respectively, and to the inputs EN4 and FN4 in the CLBs of row i columns j+1 and j+2, respectively.

The direct connections on the peripheral CLBs which include direct connections to the IOBs are shown in FIGS. 53–55. The figures are shown with the IOBs along the left side of the figure so that the columns of peripheral CLBs shown are columns 1 and 2. However, the connections apply as well for structures in which the peripheral CLBs are on rows 1 and 2 rather than columns 1 and 2, columns 7 and 8 rather than columns 1 and 2, and rows 7 and 8 rather than columns 1 and 2. The connections are just rotated where appropriate.

Furthermore, the connections of the CLBs in the corners are not shown. These CLBs can be connected up in a wide variety of configurations due to the converging nets at those corners. The specific direct connections of the corner CLBs and of all the other peripheral CLBs to IOBs on the array are shown in Table 1.

TABLE 1

| FROM PAD # | TO CLB LOCATION | IOB DIRECT (DI) TO CLB | CLB TO IOB (O) |
|---|---|---|---|
| 2 | R1C1 | EM3 | X4 |
|  | R2C1 | FM3 | X4 |
| 3 | R1C1 | FN1 FM3 | X1 |
|  | R2C1 | — | X1 |
| 4 | R1C1 | EN1 | X2 |
|  | R2C1 | FN1 | X2 |
| 5 | R1C2 | EM3 | X4 |
|  | R2C2 | FM3 | X4 |
| 6 | R1C2 | FN1 FM3 | X1 |
|  | R2C2 | — | X1 |
| 7 | R1C2 | EN1 | X2 |
|  | R2C2 | FN1 | X2 |
| 8 | R1C3 | EM3 | X4 |
|  | R2C3 | FM3 | X4 |
| 9 | R1C3 | FN1 FM3 | X1 |
|  | R2C3 | — | X1 |
| 10 | R1C3 | EN1 | X2 |
|  | R2C3 | FN1 | X2 |
| 11 | R1C4 | EM3 | X4 |
|  | R2C4 | FM3 | X4 |
| 12 | R1C4 | FN1 FM3 | X1 |
|  | R2C4 | — | X1 |
| 13 | R1C4 | EN1 | X2 |
|  | R2C4 | FN1 | X2 |
| 16 | R1C5 | EM3 | X4 |
|  | R2C5 | FM3 | X4 |
| 17 | R1C5 | FN1 FM3 | X1 |
|  | R2C5 | — | X1 |
| 18 | R1C5 | EN1 | X2 |
|  | R2C5 | FN1 | X2 |
| 19 | R1C6 | EM3 | X4 |
|  | R2C6 | FM3 | X4 |
| 20 | R1C6 | FN1 FM3 | X1 |
|  | R2C6 | — | X1 |
| 21 | R1C6 | EN1 | X2 |
|  | R2C6 | FN1 | X2 |
| 22 | R1C7 | EM3 | X4 |
|  | R2C7 | FM3 | X4 |
| 23 | R1C7 | FN1 FM3 | X1 |
|  | R2C7 | — | X1 |
| 24 | R1C7 | EN1 | X2 |
|  | R2C7 | FN1 | X2 |
| 25 | R1C8 | EM3 | X4 |
|  | R2C8 | FM3 | X4 |
| 26 | R1C8 | FN1 FM3 | X1 |
|  | R2C8 | — | X1 |
| 27 | R1C8 | EN1 | X2 |
|  | R2C8 | FN1 | X2 |
| 29 | R1C8 | EM4 | X1 |
|  | R1C7 | FM3 | X1 |
| 30 | R1C8 | FN2 FM4 | X2 |
|  | R1C7 | — | X2 |
| 31 | R1C8 | EN2 | X3 |
|  | R1C7 | FN2 | X3 |
| 32 | R2C8 | EM4 | X1 |
|  | R2C7 | FM4 | X1 |
| 33 | R2C8 | FN2 FM4 | X2 |
|  | R2C7 | — | X2 |
| 34 | R2C8 | EN2 | X3 |
|  | R2C7 | FN2 | X3 |
| 35 | R3C8 | EM4 | X1 |
|  | R3C7 | FM4 | X1 |
| 36 | R3C8 | FN2 FM4 | X2 |
|  | R3C7 | — | X2 |
| 37 | R3C8 | EN2 | X3 |
|  | R3C7 | FN2 | X3 |
| 38 | R4C8 | EM4 | X1 |
|  | R4C7 | FM4 | X1 |
| 39 | R4C8 | FN2 FM3 | X2 |
|  | R4C7 | — | X2 |
| 40 | R4C8 | EN2 | X3 |
|  | R4C7 | FN2 | X3 |
| 43 | R5C8 | EM4 | X1 |
|  | R5C7 | FM4 | X1 |
| 44 | R5C8 | FN2 FM4 | X2 |
|  | R5C7 | — | X2 |
| 45 | R5C8 | EN2 | X3 |
|  | R5C7 | FN2 | X3 |
| 46 | R6C8 | EM4 | X1 |
|  | R6C7 | FM4 | X1 |
| 47 | R6C8 | FN2 FM4 | X2 |
|  | R6C7 | — | X2 |
| 48 | R6C8 | EN2 | X3 |
|  | R6C7 | FN2 | X3 |
| 49 | R7C8 | EM4 | X1 |
|  | R7C7 | FM4 | X1 |
| 50 | R7C8 | FN2 FM4 | X2 |
|  | R7C7 | — | X2 |
| 51 | R7C8 | EN2 | X3 |
|  | R7C7 | FN2 | X3 |
| 52 | R8C8 | EM4 | X1 |
|  | R8C7 | FM4 | X1 |
| 53 | R8C8 | FN2 FM4 | X2 |
|  | R8C7 | — | X2 |
| 54 | R8C8 | EN2 | X3 |
|  | R8C7 | FN2 | X3 |
| 57 | R8C8 | EM1 | X2 |
|  | R7C8 | FM1 | X2 |
| 58 | R8C8 | FM1 FN3 | X3 |
|  | R7C8 | — | X3 |
| 59 | R8C8 | EN3 | X4 |
|  | R7C8 | FN3 | X4 |
| 60 | R8C7 | EM1 | X2 |
|  | R7C7 | FM1 | X2 |
| 61 | R8C7 | FM1 FN3 | X3 |
|  | R7C7 | — | X3 |
| 62 | R8C7 | EN3 | X4 |
|  | R7C7 | FN3 | X4 |
| 63 | R8C6 | EM1 | X2 |
|  | R7C6 | FM1 | X2 |
| 64 | R8C6 | FM1 FN3 | X3 |
|  | R7C6 | — | X3 |
| 65 | R8C6 | EN3 | X4 |
|  | R7C6 | FN3 | X4 |
| 66 | R8C5 | EM1 | X2 |
|  | R7C5 | FM1 | X2 |
| 67 | R8C5 | FM1 FN3 | X3 |
|  | R7C5 | — | X3 |
| 68 | R8C5 | EN3 | X4 |
|  | R7C5 | FN3 | X4 |
| 71 | R8C4 | EM1 | X2 |
|  | R7C4 | FM1 | X2 |
| 72 | R8C4 | FM1 FN3 | X3 |
|  | R7C4 | — | X3 |
| 73 | R8C4 | EN3 | X4 |
|  | R7C4 | FN3 | X4 |
| 74 | R8C3 | EM1 | X2 |
|  | R7C3 | FM1 | X2 |
| 75 | R8C3 | FM1 FN3 | X3 |
|  | R7C3 | — | X3 |
| 76 | R8C3 | EN3 | X4 |
|  | R7C3 | FN3 | X4 |
| 77 | R8C2 | EM1 | X2 |
|  | R7C2 | FM1 | X2 |
| 78 | R8C2 | FM1 FN3 | X3 |
|  | R7C2 | — | X3 |
| 79 | R8C2 | EN3 | X4 |
|  | R7C2 | FN3 | X4 |
| 80 | R8C1 | EM1 | X2 |
|  | R7C1 | FM1 | X2 |
| 81 | R8C1 | FM1 FN3 | X3 |
|  | R7C1 | — | X3 |
| 82 | R8C1 | EN3 | X4 |
|  | R7C1 | FN3 | X4 |
| 85 | R8C1 | EM2 | X3 |
|  | R8C2 | FM2 | X3 |
| 86 | R8C1 | FM2 FN4 | X4 |
|  | R8C2 | — | X4 |
| 87 | R8C1 | EN4 | X1 |
|  | R8C2 | FN4 | X1 |

TABLE 1-continued

| FROM PAD # | TO CLB LOCATION | IOB DIRECT (DI) TO CLB | CLB TO IOB (O) |
|---|---|---|---|
| 88 | R7C1 | EM2 | X3 |
|  | R7C2 | FM2 | X3 |
| 89 | R7C1 | FM2 FN4 | X4 |
|  | R7C2 | — | X4 |
| 90 | R7C1 | EN4 | X1 |
|  | R7C2 | FN4 | X1 |
| 91 | R6C1 | EM2 | X3 |
|  | R6C2 | FM2 | X3 |
| 92 | R6C1 | FM2 FN4 | X4 |
|  | R6C2 | — | X4 |
| 93 | R6C1 | EN4 | X1 |
|  | R6C2 | FN4 | X1 |
| 94 | R5C1 | EM2 | X3 |
|  | R5C2 | FM2 | X3 |
| 95 | R5C1 | FM2 FN4 | X4 |
|  | R5C2 | — | X4 |
| 96 | R5C1 | EN4 | X1 |
|  | R5C2 | FN4 | X1 |
| 99 | R4C1 | EM2 | X3 |
|  | R4C2 | FM2 | X3 |
| 100 | R4C1 | FM2 FN4 | X4 |
|  | R4C2 | — | X4 |
| 101 | R4C1 | EN4 | X1 |
|  | R4C2 | FN4 | X1 |
| 102 | R3C1 | EM2 | X3 |
|  | R3C2 | FM2 | X3 |
| 103 | R3C1 | FM2 FN4 | X4 |
|  | R3C2 | — | X4 |
| 104 | R3C1 | EN4 | X1 |
|  | R3C2 | FN4 | X1 |
| 105 | R2C1 | EM2 | X3 |
|  | R2C2 | FM2 | X3 |
| 106 | R2C1 | FM2 FN4 | X4 |
|  | R2C2 | — | X4 |
| 107 | R2C1 | EN4 | X1 |
|  | R2C2 | FN4 | X1 |
| 108 | R1C1 | EM2 | X3 |
|  | R1C2 | FM2 | X3 |
| 109 | R1C1 | FM2 FN4 | X4 |
|  | R1C2 | — | X4 |
| 110 | R1C1 | EN4 | X1 |
|  | R1C2 | FN4 | X1 |

FIG. 53 shows the connection of the CLB in column 1 row i, for i between 3 and 6. Also, the connections of the CLB in column 2 row i are shown.

Thus, the output X1 of the CLB in column 1 row i is coupled directly to an adjacent complex IOB labelled Ri1.

Note that the IOBs in the configurable gate array of the present invention are grouped into three blocks per row or column of the array. Thus, as shown in FIG. 53 for row i there are three IOBs Ri1, Ri2, and Ri3. Ri1 and Ri3 are complex IOBs while Ri2 as a simple IOB. Each has a multiplexer receiving a plurality of signals for supply as the output signal to the associated pin. These inputs are shown by the reference O.

The output X1 in the CLB C1Ri is coupled directly to the output in the IOB Ri1, to the input EM2 in the CLB C2Ri and to the input FM2 in the CLB C3Ri.

The output X2 of the CLB C1Ri is coupled directly to the inputs FN3 and EN3 of the CLBs in column 1 rows Ri–2 and i–1, respectively. Also, the output X2 is coupled directly to the inputs EM3 and FM3 in the CLBs in column 1 rows Ri+1 and Ri+2, respectively.

The output X3 of the CLB C1Ri is coupled directly to the terminal O in the complex IOB Ri3 and to the EN4 and FN4 inputs of the CLBs C2Ri and C1Ri, respectively.

The output X4 of the CLB C1Ri is coupled directly to the O terminal of the simple IOB Ri2 and directly to the FM1 and EM1 terminals of CLBs C1Ri–2 and C1Ri–1, respectively. Also, the output X4 of the CLB C1Ri is coupled directly to the EN1 and FN1 inputs of CLB in column 1 rows i+1 and i+2, respectively.

The output X1 in the CLB C2Ri is coupled directly to the O terminal of the complex IOB Ri1, and to the EN2 terminal of the CLB C1Ri. Output X1 is also coupled to the EM2 and FM2 inputs of CLBs C3Ri and C4Ri, respectively.

The output X2 of the CLB C2Ri is coupled directly to the inputs FN3 and EN3 of the CLBs C2Ri–2 and C2Ri–1. The output X2 of C2Ri is also coupled to the EM3 and FM3 inputs of CLBs C2Ri+1 and C2Ri+2.

The output X3 of the CLB C2Ri is coupled directly to the O terminal of the complex IOB Ri3, to the EM4 input of the CLB C1Ri to the EN4 input of CLB C3Ri and to the input FN4 of CLB C4Ri.

The output terminal X4 of the CLB C2Ri is connected directly to the inputs FM1 and EM1 of CLBs C2Ri–2 and C2Ri–1. Output X4 is also coupled to the inputs EN1 and FN1 of CLBs C2Ri+1 and C2Ri+2, respectively. In addition, the output X4 of CLB C2Ri is connected directly to the O terminal of the simple IOB Ri2.

The inputs EM1 through EM4 and EN1 through EN4 of the CLB C1Ri are shown in FIG. 54. The terminal EM1 is coupled to receive the output X4 of CLB C1Ri+1. The input EN1 is coupled to receive the output X4 of the CLB C1Ri–1. The input EM2 is coupled to receive an input from the complex IOB Ri3. The input EN2 is coupled to receive the output X1 of the CLB C2Ri. The input EM3 is coupled to receive the output X2 of the CLB C1Ri–1. The input EN3 is coupled to receive the output X2 of the CLB C1Ri+1. The input EM4 is coupled to receive the output X3 of the CLB C2Ri. The input EN4 is coupled to receive an input from the complex IOB In FIG. 55, the FM1 through FM4 and FN1 through FN4 inputs of CLBs C1Ri and C2Ri are shown.

The outputs X4 of CLBs C1Ri–2 and C2Ri–2 are connected respectively to the FN1 inputs of CLBs C1Ri and C2Ri. The outputs X2 of the CLBs C1Ri–2 and C2Ri–2 are connected directly to the inputs FM3 of CLBs C1Ri and C2Ri.

The outputs X1 of the CLBs C3Ri and C4Ri are connected directly to the FN2 inputs of CLBs C1Ri and C2Ri, respectively. The outputs X3 of the CLBs C3Ri and C4Ri are connected directly to the FM4 inputs of C1Ri and C2Ri.

The outputs X2 of the CLBs C1Ri+2 and C2Ri+2 are connected directly to the FN3 inputs of CLBs C1Ri and C2Ri, respectively. The outputs X4 of the CLBs C1Ri+2 and C2Ri+2 are connected directly to the FM1 inputs of CLBs C1Ri and C2Ri, respectively.

The terminal DI of the complex IOB Ri1 is coupled directly to the FN4 input of CLB C2Ri. The input DI received from the simple IOB Ri2 is coupled directly to the FN4 input and FM2 input of the CLB C1Ri. Finally, the input signal DI derived from the complex IOB Ri3 is coupled directly to the FM2 input of CLB C2Ri.

The programmable general connect is illustrated in FIGS. 56–70. It provides a means for routing nets around the device. The CLBs and IOBs are linked through this network by means of programmable interconnection points PIPs. The programmable general connect is subdivided into the long lines and the bidirectional general interconnects BGI, which are lines incorporating metal segments spanning one or two CLBs, usually terminating in a switching matrix or segment box as described above with reference to FIGS. 4–24.

The selection of the location of PIPs and their connection to the inputs and outputs of the configurable logic blocks and input/output blocks is a matter of design choice. The preferred implementation is shown as follows.

FIG. 56 shows the programmable connections of the outputs Y1 through Y4 to the long lines and BGI. The outputs Y1 through Y4 are also connected to the uncommitted long lines as shown in FIG. 58. Also, the outputs are coupled differently to the vertical bus 1 and horizontal bus 1, vertical bus 9 and horizontal bus 9 as shown in FIG. 59 as it relates to the long lines 1–4 in the respective buses.

FIG. 56 shows that the output Y1 is coupled to PIPs associated with long lines 3, 4, and 15, and BGIs 5, 9, 13, and 14 in HBUS i. The output Y2 of CLB CiRi is coupled to VBUS i+1 long lines 1 and 2 and 15, and BGIs 5, 7, 11, and 14 . Output Y3 of CiRi is coupled to HBUS i+1 long lines 1, 2, and 15, and to BGI lines 5, 8, 12, and 14 . The output Y4 of CiRi is coupled to VBUS i long lines 3, 4, and 15, and to BGI 5, 6, 10, and 14.

Also shown in FIG. 56 are the inputs to C1 through C4 and D1 through D4. These inputs are coupled as the unidirectional PIPs using four to one multiplexers in the preferred system to save on memory. One could use bidirectional PIPs, if desired.

The input C1 is coupled to BGI 7, 9, 11, and 13 on HBUS i. Input D1 is coupled to BGI 6, 8, 10, and 12 on HBUS i.

Input C2 is coupled to BGI of VBUS i+1 lines 6, 8, 10, and 12, while input D2 is coupled to VBUS i+1 BGI 7, 9, 11, and 13.

The input C3 is coupled to HBUS i+1 BGI 6, 8, 10, and 12. Input D3 is coupled to HBUS i+1 BGI 7, 9, 11, and 13.

The input C4 is coupled to VBUS i BGI 7, 9, 11, and 13. The input D4 is coupled to VBUS i BGI 6, 8, 10, and 12.

FIG. 57 shows the fixed inputs from the long lines and BGI to CLB CiRi from the adjacent buses.

For HBUS i, long line 4 is coupled to input A1, long line 3 is coupled to input B1, BGI 5 is coupled to input G1, BGI 14 is coupled to input Hi, and long line 15 is coupled to input K1.

For VBUS i+1, long line 1 is coupled to input A2, long line 2 is coupled to input B2, BGI 5 is coupled to input G2, BGI 14 is coupled to input H2, and long line 15 is coupled to input K2.

For HBUS i+1, long line 1 is coupled to input A3, long line 2 is coupled to input B3, BGI 5 is coupled to input G3, BGI 14 is coupled to input H3, and long line 15 is coupled to input K3.

For VBUS i, long line 4 is coupled to input A4, long line 3 is coupled to input B4, BGI 5 is coupled to input G4, BGI 14 is coupled to input H4, long line 15 is coupled to input K4, long line 16 is coupled to input GK, and long line 17 is coupled to input GR.

The connection of the configurable logic blocks to the uncommitted long lines is shown in FIG. 58. Each CLB, such as CLB R3C4, has outputs Y1 through Y4 coupled to one uncommitted long line each. The connections will not be recited because they are shown in FIG. 58. In FIG. 58, only lines 18–25 of the vertical buses, and lines 16–23 of the horizontal buses are shown, because these are the only uncommitted long lines. In order to provide an example for reading FIG. 58, the CLB R3C4 output Y1 is coupled to uncommitted long line 21 of HBUS 3. The output Y2 of R3C4 is coupled to uncommitted long line 23 of VBUS 5. The output Y3 is coupled to uncommitted long line 21 of HBUS 4. The output Y4 is coupled to uncommitted long line 23 of VBUS 4. Note that the uncommitted long lines do not have programmable connections to inputs of CLBs. The selection of the connections of the outputs of the uncommitted long lines has been carried out to achieve a distributed uniform pattern that facilitates programming of nets through the array.

FIG. 59 shows the connection of the long lines 1–4 in HBUS 1, VBUS 1, VBUS 9, and HBUS 9. The figure shows utilization of the corner intersections of VBUS 9 with HBUS 1 and HBUS 9, and VBUS 1 with HBUS 1 and HBUS 9 to allow propagation of a signal supplied to any one of the four outer long lines all the way around the chip. This facilitates utilization of a single signal as a control input to all IOBs as desired.

The outputs Y1 of CLBs in row 1 are all connected to HBUS 1 long lines 1, 3, and 4 with the exception of The Y1 output of R1C8 which is coupled to HBUS 1 long lines 2, 3, and 4. The outputs Y2 of CLBs in row 1 are all connected to HBUS 1 long line 2, with the exception of R1C8. The Y4 output of R1C8 is coupled to HBUS 1 long line 1.

The Y2 output of all CLBs in column 8, except for R8C8, is coupled to VBUS9 long lines 1, 2, and 4. The Y3 output of all CLBs in column 8, with the exception of C8R8, is coupled to VBUS 9 long line 3. The Y1 output of C8R8 is coupled to VBUS 9 long line 4. The Y2 output of CLB C8R8 is coupled to VBUS 9 long lines 1, 2, and 3.

The Y3 outputs of all CLBs in row 8, with the exception of C1R8, are coupled to HBUS 9 long lines 1, 2, and 4. The Y4 output of CLBs in row 8, with the exception of C1R8, is coupled to HBUS 9 long line 3.

The Y2 output of C1R8 is coupled to long line 4 of HBUS 9. The Y3 output of C1R8 is coupled to long lines 1, 2, and 3 of HBUS 9. The CLBs in column 1, with the exception of C1R1, are connected so that Y4 is connected to VBUS 1 long lines 1, 3, and 4, and Y1 is connected to VBUS 1 long line 2. The CLB C1R1 output Y4 is connected to VBUS 1 long lines 2–4 and the output Y3 is connected to VBUS 1 long line 1.

Passage of a signal on any long line about the periphery of the chip is enabled by the interconnect structure 5900 at the intersection of VBUS 9 and HBUS 1, and the interconnect structure 5901 at the intersection of VBUS 1 and HBUS 9. These structures 5900 and 5901 allow connection of a signal on any one of the four long lines around the periphery to one of the two outer long lines on the respective buses, and vice versa.

FIG. 60 illustrates the long line reach between IOBs and CLBs. In effect, a signal input from an IOB can be supplied directly as an input to a CLB with only one PIP delay. Also, a signal output from a CLB can be supplied as an output signal to an IOB with only one PIP delay. For instance, the signal Y1 generated at CLB R6C5 can be supplied along long line 4 of HBUS 6 through PIP 6000 as an input across line 6001 to the simple IOB R6-2. In this manner, a signal generated at CLB in the interior of the array can be quickly propagated to the outside of the chip. Note that the square symbol 6003 on long line 4 corresponds to an input to the multiplexer 4501 of FIG. 45.

Likewise, an input signal from the IOB R6-2 and IOB R6-1 can be coupled through PIPs to long line 3 which is supplied as a direct input B1 to R6C5 and to R6C4. Thus, through single PIP delay, e.g. at point 6002, an input signal from R6-1 can be supplied directly to a CLB in the interior of the device. Similar paths can be seen from the IOBs C4-1, C4-2, C4-3, C5-1, C5-2, and C5-3 at the top or bottom of the chip. These connections are similarly made for IOBs at the end of each column or row in the chip.

The four long lines 1–4 of each bus have a programmable pull up resistor at their ends (not shown). These four long lines are envisioned to be used for connectivity between the IOBs and CLBs in the center of the device, or long reach between CLBs. The pull up resistor can be enabled by the program data in the configuration memory such that if no signal arrives at the line, the line can be taken to a logical one state. This stops lines from carrying spurious signals across the whole device.

A second feature of the pull up is the ability to construct a wired-AND by driving the line from a number of CLBs or IOBs output buffers that are tristatable.

Each output buffer may be configured such that when passing a logic zero, the buffer asserts a low to the long line. When passing a logic 1, the buffer asserts a tristate (high impedance) to the line. If no other buffer is driving the line (i.e., all buffers connected are in tristate—the logic 1 case for each) then the pull-up resistor forces a logic high onto the line, giving the result of the AND function required.

FIGS. 61–70 show connections to the IOB structure with the interconnect. In FIG. 61, the connections of the input terminals I and the output terminals O of the eight groups of input/output blocks along the top side of the array to horizontal bus 1 are shown. In the figure, the circular symbols at the intersection of lines refer to bidirectional PIP connections. The squares at the intersection indicate a connection to the multiplexer in the IOB which generates the O signal which is described above with reference to FIGS. 45 and 46. It can be seen upon review of FIG. 61 that each IOB input terminal I is coupled to one BGI and one uncommitted long line through a PIP. Each output terminal O in the IOBs is coupled to one uncommitted long line and one BGI at the input multiplexer. In addition, the input terminal I of the simple IOBs in respective centers of the triplets, are all coupled to long line 15 through a PIP. The distribution of the connections has been chosen to provide for a predictable scheme that facilitates programming of networks on the device. A wide variety of interconnection schemes could be implemented as meets the needs of a specific application.

FIG. 62 illustrates the connections to the IOBs along the bottom side to horizontal bus 9. The pattern of connections on FIG. 62 is similar to that of FIG. 61. The same explanation applies.

FIG. 63 shows the IOB connections along the left side of the array to vertical bus 1. Again, this connection scheme is similar to that as described with reference to FIG. 61 and the explanation is not restated.

FIG. 64 shows the IOB connections along the right side or the array to vertical bus 9. Again, this interconnection scheme is similar to that described with reference to FIG. 61 and is not explained again.

FIGS. 65–68 show the connections of the IOBs along the top side of the array to the vertical buses VBUS i and VBUS i+1, and show the inputs for the control signals GK, GR and K. Note that the input I of IOB Ci1 is coupled through a PIP to long line 3 of VBUS i in addition to the connections shown in FIG. 61. The terminal O of IOB Ci1 is coupled through the multiplexer inside the IOB to long line 4 of VBUS i. The GK and GR input signals are coupled to the long lines 16 and 17 of VBUS i. The input K is directly coupled to long line 15 of HBUS 1.

The simple IOB Ci2 has its terminal I connected through PIPs to long lines 3 and 15 of VBUS i, and long line 1 of VBUS i+1. The terminal O on the simple IOB Ci2 receives as inputs to its multiplexer, connections to long line 2 of VBUS i+1 and long line 4 of VBUS i.

The complex IOB Ci3 has its input terminal I coupled to long line 1 of VBUS i+1 and a multiplexer generating the signal O coupled to receive the signal on long line 2 of VBUS i+1. The control signals GK and GR in IOB Ci3 are coupled to long line 16 and 17 of VBUS i. Control input K is coupled to long line 15 of HBUS 1.

FIG. 66 shows connections to the IOBs along the bottom side with the vertical buses VBUS i and VBUS i+1, as well as the control inputs K, GR, and GK. Note that the connections to these IOBs is similar to that described with reference to FIG. 65, except that the terminal I in the simple IOB Ci2 is connected to long line 4 of VBUS i and long lines 2 and 15 of VBUS i+1. In this manner, the long line 15 of VBUS i+1 is connected to receive signals from the simple IOB Ci2 along the bottom side of the array while the VBUS i line 15 is coupled to receive a signal from the IOB at the top side of the array for IOBs over one column of CLBs.

FIG. 67 shows connections to the IOBs along the left side of the array with the horizontal buses HBUS i and HBUS i+1 and with the control signals supplied along VBUS 1.

The complex IOB Ri1 receives an input from long line 3 of HBUS i at its terminal O. The I terminal of Ri1 is coupled through a PIP to long line 4 of HBUS i. Control signals K, GR and GK are coupled to lines 15, 17, and 16 respectively of VBUS 1. The output O of simple IOB Ri2 is coupled to receive inputs from long line 3 of HBUS i and long line 1 of HBUS i+1. The terminal I of simple IOB Ri2 is coupled through PIPs to long line 4 of HBUS i, long line 2 of HBUS i+1, and long line 15 of HBUS i+1.

The terminal O of complex IOB Ri3 is coupled to receive an input from long line 1 of HBUS i+1. The control signals K, GR, and GK are coupled to lines 15, 17, and 16 respectively of VBUS 1. The terminal I in complex IOB Ri3 is coupled through a PIP to long line 2 of HBUS i+1.

FIG. 68 shows the connection of the IOBs along the right side of the array to the horizontal buses HBUS i and HBUS i+1, and for receiving the control signals from vertical bus VBUS 9. These connections are similar to those described with reference to FIG. 67 and are not restated. The only exception is that long line 15 of HBUS i is coupled to the terminal I of Ri2 along the right side (FIG. 68), while long line 15 of HBUS i+1 is coupled to terminal I of the simple IOB along the left side (FIG. 67).

FIG. 69 shows the connections of the other control inputs IEN, OEN, SL1, SL2, and CEN to the complex IOBs along the top and left side of the array. Each of these signals is generated at the output of a multiplexer as is described with reference to FIG. 46. Thus, the convention of using a square at the intersection of two lines indicates an input into the multiplexer rather than a bidirectional PIP.

Thus, as shown in FIG. 69, the inputs to the multiplexer generating the signals IEN are supplied from long line 1 and BGI 9 of the adjacent horizontal bus HBUS 1 for IOBs along the top, and of the adjacent vertical bus VBUS 1 for IOBs along the left side. Likewise, the signal OEN is supplied either from long line 1 or BGI 8. The signal SL1 is supplied either from long line 2 or BGI 7. The signal SL2 is supplied either from long line 3 of BGI 6. The signal CEN is supplied either from long line 4 or BGI 5.

FIG. 70 shows the inputs to the multiplexers for the control signals of complex IOBs along the right and bottom sides of the array. Thus, the signal IEN supplied either from long line 4 or BGI 10 of VBUS 9 or HBUS 9. The signal OEN is supplied either from long line 4 or BGI 11. The signal SL1 is supplied either from long line 3 or BGI 12. The signal SL2 is supplied either from long line 2 or BGI 13. The signal CEN is supplied either from long line 1 or BGI 14.

VI. Conclusion

The present invention can be characterized as a new architecture for a programmable gate array device which comprises improved input/output blocks, configurable logic blocks, and interconnect structures.

Overall, The architecture overcomes many of the problems of the prior art. The signal propagation is no longer constrained from left to right by the interconnect structure or the input and output orientation of the CLBs. The interconnect structure of the present invention facilitates propagation of signals across the device with few PIP delays. This is accomplished using the BGIs that are two CLBs in length, use of uncommitted long lines, and providing direct connection between eight neighbors.

Furthermore, the architecture eliminates the need for tristate buffers distributed through the device that must be incorporated into a net. This is accomplished by moving the tristate buffers inside the IOBs and CLBs. Thus, for applications requiring multi-source nets, interconnect resources are not used up.

The architecture further provides a plurality of sources for clocks that are unavailable in prior art systems. In particular, the clock can be driven from any CLB in the array.

The present invention further provides greater utilization of the resources in the configurable input/output blocks. IOBs require a great deal of functionality in order to meet the flexible needs of a device like the programmable gate array. However, in the prior art, these resources have only been used for input/output functions, wasting space and logic when not used. The present invention provides a variety of paths for utilizing resources of the input/output blocks for purposes other than input and output.

Furthermore, the IO blocks of the prior art are relatively slow because of the complex nature of the structures. Thus, the present invention provides the mixture of simple and complex input/output blocks. Because of the availability of the simple input/output blocks, the speed penalty associated with complex blocks can be avoided for certain applications. Furthermore, the input/output blocks of the present invention are directly connected to a greater number of adjacent configurable logic blocks than an the prior art. This prevents many applications from becoming input/output bound and limiting the utilization of the logic available on the chip.

The configurable logic blocks according to the present invention eliminate the sharing of input variables in wide gating functions, provide the ability to perform wide gating functions without speed penalty for the narrow gating functions, and allow much greater utilization of the combinational logic available in the CLB because of the input multiplexing structure. Furthermore, the CLBs are symmetrical in that they allow inputs and outputs from all four sides of the lock, and are capable of receiving control signals and clock signals from all four sides.

Furthermore, because of the flexibility in the input and output structure of the CLB, under-utilized CLBs do not suffer a speed penalty.

Overall, the present invention allows for implementation of a programmable gate array in which the symmetry of the interconnections, the ability to provide multi-source nets, the ability to propagate signals long distances across the array without suffering speed penalty, and greater combinational logic capability are combined.

The present invention thus allows implementation of programmable gate arrays that are adaptable to a wider variety of applications than the prior art. Further, these implementations allow manufacture of a programmable gate array with greater functional density that can be efficiently utilized at a greater percentage capacity than available in prior are architectures for PGAs.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A programmable integrated circuit comprising:
   (a) a plurality of programmably configurable logic blocks for carrying out program-defined logic functions;
   (b) a programmably configurable interconnect network for providing program-defined routing of signals between the plurality of programmably configurable logic blocks,
   wherein said configurable logic blocks each includes:
      (a.1) a programmable first memory area for storing a function-defining first set of lookup bits;
      (a.2) a programmable second memory area for storing a function-defining second set of lookup bits;
      (a.3) first select means coupled to the first memory area and responsive to a supplied first plurality of input signals for selecting and outputting a subset of the first set of lookup bits in accordance with the first plurality of input signals, wherein the combination of the first memory area and the first select means defines a first lookup table (first LUT);
      (a.4) second select means coupled to the second memory area and responsive to a supplied second plurality of input signals for selecting and outputting a subset of the second set of lookup bits in accordance with the second plurality of input signals, wherein the combination of the second memory area and the second select means defines a second lookup table (second LUT);
      (a.5) function substituting means, coupled to receive the output of the second LUT and responsive to a supplied substitution control signal, for selectively outputting in accordance with the substitution control signal one or another member of a group comprising the output of the second LUT and an alternate output;
      (a.6) first internal connect means for coupling the output of the first LUT such that said coupled output of the first LUT defines the substitution control signal and thereby the output of the first LUT determines whether one or another member of said group comprising the output of the second LUT and the alternate output is output by the function substituting means.

2. A programmable integrated circuit according to claim 1 wherein each of said configurable logic blocks further includes:
   (a.7) a programmable third memory area for storing a function-defining third set of lookup bits; and
   (a.8) third select means coupled to the third memory area and responsive to a supplied third plurality of input signals for selecting and outputting a subset of the third set of lookup bits in accordance with the third plurality of input signals, wherein the combination of the third memory area and the third select means defines a third lookup table (third LUT); and
   wherein the output of the third LUT defines said alternate output.

3. A programmable integrated circuit according to claim 2 wherein said third set of lookup bits is programmable with any pattern of bits including all logic zeroes and all logic ones.

4. A programmable integrated circuit comprising:

(a) a plurality of programmably configurable logic blocks for carrying out program-defined logic functions;

(b) a programmably configurable interconnect network for providing program-defined routing of signals between the plurality of programmably configurable logic blocks, said interconnect network including direct-interconnect means for providing direct-connections between prespecified subsets of the logic blocks;

wherein each given configurable logic block of said plurality of programmably configurable logic blocks includes:

(a.1) a programmable first memory area for storing a function-defining first set of lookup bits;

(a.2) a programmable second memory area for storing a function-defining second set of lookup bits;

(a.3) first select means coupled to the first memory area and responsive to a supplied first plurality of input signals for selecting and outputting a subset of the first set of lookup bits in accordance with the first plurality of input signals, wherein the combination of the first memory area and the first select means defines a first lookup table (first LUT);

(a.4) second select means coupled to the second memory area and responsive to a supplied second plurality of input signals for selecting and outputting a subset of the second set of lookup bits in accordance with the second plurality of input signals, wherein the combination of the second memory area and the second select means defines a second lookup table (second LUT);

(a.5) function substituting means, coupled to receive the output of the second LUT and responsive to a supplied substitution control signal, for selectively outputting in accordance with the substitution control signal one or another member of a group comprising the output of the second LUT and an alternate output;

(a.6) direct connect output means for coupling an output of the first LUT to a direct-connect output of the given configurable logic block; and (a.6) direct connect input means for receiving a direct-connect LUT output of another configurable logic block in said plurality of programmably configurable logic blocks via said direct-interconnect means and for coupling the received direct-connect output to the function substituting means as said substitution control signal of said given configurable logic block thereby providing direct-connect cascading from the received direct-connect LUT output of said another configurable logic block to the function substituting means of the given configurable logic block.

* * * * *

UNITED STATES PATENT AND TRADEMARK OFFICE
CERTIFICATE OF CORRECTION

PATENT NO. : 5,469,368
DATED : November 21, 1995
INVENTOR(S) : Om P. Agrawal et al.

It is certified that error appears in the above-indentified patent and that said Letters Patent is hereby corrected as shown below:

```
Column  1, line 12, "07/379,221" should be --07/394,221--.
Column  2, line 28, after "input/output" "o" should be --.--.
Column  6, line 32, "burled" should be --buried--.
Column 12, line  5, "no" should be --to--.
Column 16, line 51, after "Y2" insert --is--.
Column 19, line 15, after "PIP 7-20 to line" insert --20.--.
Column 24, line 66, "lane" should be --line--.
Column 25, line 12, after "shown", "an" should be --in--.
Column 33, line 46 should be --R1C7     FM4     X1--.
           line 61 should be --39     R4C8     FN2 FM4     X2--.
Column 36, line 32, after "IOB" insert --Ri1.--.
Column 37, line 34, "Hi" should be --H1--.
Column 41, line 44, "lock" should be --block--.
```

Signed and Sealed this

Twenty-eighth Day of May, 1996

Attest:

BRUCE LEHMAN

*Attesting Officer*     Commissioner of Patents and Trademarks